United States Patent [19]

Tsukude et al.

[11] Patent Number: 5,696,727

[45] Date of Patent: Dec. 9, 1997

[54] SEMICONDUCTOR MEMORY DEVICE PROVIDED WITH SENSE AMPLIFIER CAPABLE OF HIGH SPEED OPERATION WITH LOW POWER CONSUMPTION

[75] Inventors: Masaki Tsukude; Kazutami Arimoto; Shigeki Tomishima, all of Hyogo, Japan

[73] Assignee: Mitsubishi Denki Kabushiki Kaisha, Tokyo, Japan

[21] Appl. No.: 742,119

[22] Filed: Oct. 31, 1996

Related U.S. Application Data

[63] Continuation of Ser. No. 524,948, Sep. 8, 1995, abandoned.

[30] Foreign Application Priority Data

Sep. 14, 1994 [JP] Japan .................................. 6-220494
Mar. 28, 1995 [JP] Japan .................................. 7-069569

[51] Int. Cl.$^6$ ........................................................ G11C 7/00
[52] U.S. Cl. ........................ 365/208; 365/203; 365/205; 327/51; 327/55
[58] Field of Search ............................. 365/208, 203, 365/205, 230.03, 149; 327/51, 52, 55

[56] References Cited

U.S. PATENT DOCUMENTS 4,893,277  1/1990  Kajigaya et al. ...................... 365/205
5,138,578  8/1992  Fujii ...................................... 365/203
5,337,271  8/1994  Kawahara et al. ................ 365/208 X
5,412,605  5/1995  Ooishi .................................. 365/203

FOREIGN PATENT DOCUMENTS 2-231760  9/1990  Japan.

*Primary Examiner*—Son T. Dinh
*Attorney, Agent, or Firm*—Lowe, Price, LeBlanc & Becker

[57] ABSTRACT

A semiconductor memory device includes a memory cell, a word line, a bit line pair having a first bit line and a second bit line complementary to the first bit line, a p type well, first and second source lines, a source line precharge circuit for precharging the first and second source lines, a sense amplifier connected between the first and second bit lines, driven by the first and second source lines and including first and second n channel MOS transistors formed in the p type well and third and fourth p channel MOS transistors, a first sense amplifier enable transistor connected between a power supply potential node and the first source line, a second sense amplifier enable transistor connected between a ground potential node and the second source line, and a switching circuit connected between the first source line and the p type well, and turning on in response to a control signal when the sense amplifier is active.

38 Claims, 37 Drawing Sheets

SEMICONDUCTOR MEMORY DEVICE PROVIDED WITH SENSE AMPLIFIER CAPABLE OF HIGH SPEED OPERATION WITH LOW POWER CONSUMPTION

This application is a continuation of application Ser. No. 08/524,948 filed Sep. 8, 1995, now abandoned.

BACKGROUND OF THE INVENTION

1. Field of the Invention

The present invention relates to a semiconductor memory device and, more specifically, to a sense amplifier for detecting and amplifying a small difference in potential read from a memory cell.

2. Description of the Background Art

A personal computer or a work station has a memory device for storing data. One of the memory devices is a DRAM (Dynamic Random Access Memory) which has large storage capacity and allows reading/writing of data. The DRAM is used as a main memory in a personal computer or in a work station.

FIG. 38 is a schematic diagram showing a sense amplifier and peripheral circuitry used in a DRAM disclosed in Japanese Patent Laying-Open No. 2-231760. Referring to FIG. 38, the DRAM includes memory cells 4a, 4b, word line 3a, 3b connected to these memory cells 4a, 4b, bit lines 2a, 2b crossing the word lines 3a, 3b, and a sense amplifier 5 connected between a power supply potential node 1a and a ground potential node 1d. Memory cell 4a is provided corresponding to a crossing between bit line 2a and word line 3a. Memory cell 4a includes a capacitor 4aa having one electrode receiving a cell plate potential Vp which is at an intermediate potential (½) Vcc, and an n channel MOS transistor 4ab connected between the other electrode of capacitor 4aa and bit line 2a, and having its gate connected to word line 3a. A negative back gate potential $V_{BB}$ is applied to the back gate of n channel MOS transistor 4ab. Memory cell 4b is provided corresponding to a crossing between bit line 2b and word line 3b. Memory cell 4b includes a capacitor 4ba having one electrode to which the cell plate potential Vp is applied, and an n channel MOS transistor 4bb connected between the other electrode of capacitor 4ba and bit line 2b, and having a gate connected to word line 3b. The back gate potential $V_{BB}$ is also applied to the back gate of n channel MOS transistor 4bb. A power supply potential Vcc is applied to power supply potential node 1a, and the ground potential Vss is applied to ground potential node 1b.

Sense amplifier 5 is connected to bit lines 2a and 2b, and in response to sense amplifier enable signals SEP and SEN, detects and amplifies potential difference between bit lines 2a and 2b. Sense amplifier 5 includes a p channel MOS transistor 5a, a p channel MOS sense amplifier 5c, an nMOS sense amplifier 5d and an n channel MOS transistor 5f. Transistor 5a receives at its gate the sense amplifier enable signal SEP. The pMOS sense amplifier 5c includes p channel MOS transistors 5ca and 5cb. Transistor 5ca is connected between node 5b and bit line 2a, and has its gate connected to bit line 2b. Transistor 5cb is connected between node 5b and bit line 2b, and has its gate connected to bit line 2a. Transistor 5cb is connected between node 5b and bit line 2b, and has its gate connected to bit line 2a. The nMOS sense amplifier 5d includes n channel MOS transistors 5da and 5db. Transistor 5da is connected between bit line 2a and node 5e, and has a gate connected to bit line 2b. Transistor 5db is connected between bit line 2b and node 5e, and has its gate connected to bit line 2a. The nMOS sense amplifier 5d is formed in a p type well which is separated from other circuit regions and to which a well potential $V_{SB}$ is applied. Transistor 5f is connected between node 5e and ground potential node 1b, and receives at its gate sense amplifier enable signal SEN.

The DRAM further includes a well potential control circuit 6 for supplying well potential $V_{SB}$ to that well in which the nMOS sense amplifier 5d is formed. Well potential control circuit 6 includes a current mirror type differential amplifying circuit 6a formed of p channel MOS transistors 6aa, 6ac and 6af as well as n channel MOS transistors 6ae and 6ah. Transistor 6aa receives at its gate a control signal /φ$_{STR}$. This control signal /φ$_{STR}$ attains to the L level when a row address strobe signal /RAS is at the H level (high) and sense amplifier enable signal SEN is at the L level (low), and otherwise this signal is at the H level. Transistor 6ac is connected between nodes 6ab and 6ad, with its gate connected to the node 6ad. Transistor 6af is connected between nodes 6ab and 6ag, and having its gate connected to node 6ad. Transistor 6ae is connected between node 6ad and ground potential node 1b, with its gate supplied with reference potential Vref. Transistor 6ah is connected between node 6ag and ground potential node 1b, with its gate supplied with potential Va of node 5e in sense amplifier 5.

Well potential control circuit 6 further includes a control circuit 6b formed of n channel MOS transistors 6ba and 6bd as well as a capacitor 6be. Transistor 6b is connected between node 6bb to which the intermediate potential (½)Vcc is applied and an output node 6bc for supplying well potential $V_{SB}$ with its gate receiving a control signal /φ$_{STR}$ which is an inversion of the control signal /φ$_{STR}$. Transistor 6bd is connected between output node 6bc and ground potential node 1b, and has its gate connected to node 6ag in differential amplifying circuit 6a. Capacitor 6be is connected between output node 6c and ground potential node 1b.

The operation of the conventional sense amplifier 5 and its peripheral circuitry thus structured will be described with reference to FIG. 39. For convenience, an operation in which data of L level is stored in memory cell 4a and the data is read out will be described. First, before time t0 when row address strobe signal RAS rises to the H level as shown in FIG. 39(a), sense amplifier enable signals SEP and SEN are at the H level and the L level respectively, as shown in (b) and (c) of FIG. 39. Therefore, p channel MOS transistor 5a and n channel MOS transistor 5f are off. Since power supply potential Vcc and ground potential Vss are not supplied to pMOS sense amplifier 5c and nMOS sense amplifier 5d, sense amplifier 5 is inactive.

Since the potentials WL0 and WL1 of word lines 3a and 3b are at the L level as shown in (e) and (f) of FIG. 39, transistor 4ab in memory cell 4a and transistor 4bd in memory cell 4b are both off. Therefore, memory cells 4a and 4b are both at a state storing data. Potentials BL and /BL of bit lines 2a and 2b have been precharged to the precharge potential (½)Vcc by means of a precharge circuit (not shown). A potential Va at node 5e is at a potential lower than the precharge potential by the threshold voltage of transistors 5da and 5db.

Control signal /φ$_{STR}$ and inverted control signal φ$_{STR}$ are at the H level and the L level as shown in (d) of FIG. 39, in response to the row address strobe signal RAS which is at the L level and to sense amplifier enable signal SEN which is also at the L level. Therefore, transistor 6aa is off. Since power supply potential Vcc is not supplied to differential amplifying circuit 6a, differential amplifying circuit 6a is inactive. As transistor 6ba is rendered non-conductive in response to the control signal $\phi_{STR}$ which is at the L level, control circuit 6b is also inactive. The well potential $V_{SB}$ supplied from output node 6bc is at the ground potential Vss as shown in FIG. 39(h). When row address strobe signal RAS rises to the H level at time t0 as shown in FIG. 39(a), control signal /$\phi_{STR}$ and inverted control signal $\phi_{STR}$ attain to the L level and H level, respectively, as shown in FIG. 39(d).

Consequently, differential amplifying circuit 6a and control circuit 6b in well potential control circuit 6 are activated. At this time, the potential Va of node 5e in sense amplifier 5 is maintained as it is, and it is higher than the reference potential Vref. Therefore, the output signal from node 6ag of differential amplifying circuit 6a attains to the L level. Consequently, in response to this L level output signal, transistor 6bd in control circuit 6b turns off. Since transistor 6ba is on responsive to the control signal $\phi_{STR}$ which is at the H level, well potential $V_{SB}$ rises with a prescribed time constant as shown in FIG. 39(h) to the intermediate potential (½)Vcc.

In response to a rising edge of row address strobe signal RAS, a row address signal is taken in, and in response to the row address signal, the potential WL0 of word line 3a rises at time t1, as shown in FIG. 39(e). Consequently, transistor 4b in memory cell 4a turns on, and bit line 2a which is at the intermediate potential (½)Vcc is connected to the other electrode of capacitor 4aa of the ground potential Vss. Accordingly, charges flow from bit line 2a to the other electrode of capacitor 4aa, and the potential BL of bit line 2a slightly decreases from the precharge potential (½)Vcc as shown in FIG. 39(g). Meanwhile, the potential WL1 of word line 3b is maintained at the L level, and therefore data is not read out from memory cell 4b to bit line 2b. Therefore, the potential /BL of bit line 2b is maintained at the precharge potential (½)Vcc as shown in FIG. 39(g).

When sense amplifier enable signal SEN rises to the H level at time t2 as shown in FIG. 39(c), transistor 5f in sense amplifier 5 turns on. Consequently, nMOS sense amplifier 5d is activated, and the potential BL of bit line 2a is pulled down to ground potential Vss as shown in FIG. 39(g). The potential Va of node 5e is also pulled down to the ground potential Vss to be lower than the reference potential Vref as shown in FIG. 39(i), the output signal from 6ag in differential amplifying circuit 6a attains to the H level. In response to this H level output signal, transistor 6bd turns on. Further, when sense amplifier enable signal SEN attains to the H level, control signals /$\phi_{STR}$ and $\phi_{STR}$ attain to the H level and L level, respectively, as shown in FIG. 39(d). Consequently, transistor 6ba in control circuit 6b turns off, and the well potential $V_{SB}$ supplied from output node 6bc lowers to the ground potential Vss from intermediate potential (½)Vcc, as shown in FIG. 39(h).

When sense amplifier enable signal SEP falls to the L level at time t3 as shown in FIG. 39(b), transistor 5a in sense amplifier 5 turns on. Consequently, pMOS sense amplifier 5c is activated, and the potential /BL of bit line 2b is pulled up to the power supply potential Vcc as shown in FIG. 39(g). In this manner, when the potential difference generated between bit lines 2a and 2b is amplified to the potential difference between power supply potential Vcc and the ground potential Vss, the detecting and amplifying operation of sense amplifier 5 is completed.

In this manner, the negative potential $V_{BB}$ or the ground potential Vss is not continuously applied to the well in which nMOS sense amplifier 5d is formed, but the well potential $V_{SB}$ at (½)Vcc is supplied before the sense amplifier enable signal SEN rises to the H level and then, as the potential Va of node 5e (source potentials of transistors 5da and 5db) lowers, the well potential Vsb lowers to the ground potential Vss, so that the absolute value of the voltage between the back gate and the source of transistors 5da and 5db becomes smaller. As a result, the threshold voltage of transistors 5da and 5db is kept small, enabling high speed sensing operation under low voltage.

However, in the above described conventional sense amplifier 5, the well is charged and discharged to change the well potential $V_{SB}$ between the intermediate potential (½)Vcc and the ground potential Vss. More specifically, when well potential $V_{SB}$ is to be raised, charges are supplied to the well from node 6pp receiving intermediate potential (½)Vcc through transistor 6b. On the other hand, when well potential $V_{SB}$ is to be lowered, the charges supplied from the well are all discharged to the ground potential node 1b. This results in large power consumption.

SUMMARY OF THE INVENTION

An object of the present invention is to provide a semiconductor memory device in which potential of a well in which a sense amplifier is formed can be changed with low power consumption.

According to the present invention, the semiconductor memory device includes a memory cell, a word line, a bit line pair, a first semiconductor region of a first conductivity type, first and second source lines, a source line precharging circuit, a sense amplifier, first and second sense amplifier enable transistors, and a first switching circuit. The word line is connected to the memory cell. The bit line pair is connected to the memory cell and crossing the word line. The bit line pair includes a first bit line and a second bit line which is complementary to the first bit line. The source line precharge circuit precharges, in response to a prescribed precharge signal, the first and the second source lines to an intermediate potential between first and second potentials. The sense amplifier includes a first MOS transistor of a second conductivity type, a second MOS transistor of the second conductivity type, a third MOS transistor of the first conductivity type and a fourth MOS transistor of the first conductivity type. The first MOS transistor of the second conductivity type is formed in the first semiconductor region, connected between the first bit line and the first source line, and has its gate connected to the second bit line. The second MOS transistor of the second conductivity type is formed in the first semiconductor region, connected between the second bit line and the first source line, and has its gate connected to the first bit line. The third MOS transistor of the first conductivity type is connected between the first bit line and the second source line, and has its gate connected to the second bit line. The fourth MOS transistor of the first conductivity type is connected between the second bit line and the second source line, and has its gate connected to the first bit line. The first sense amplifier enable transistor is connected between the first potential node to which the first potential is applied and the first source line, and it turns on in response to the first sense amplifier enable signal. The second sense amplifier enable transistor is connected between a second potential node to which a second potential is applied and the second source line, and it turns on in response to the second sense amplifier enable signal. The first switching circuit is connected between the first source line and the first semiconductor region, and it turns on in response to the first control signal when the sense amplifier is active.

As described above, since the first switch circuit is connected between the first semiconductor region and the first source line, the first semiconductor region is connected to the first source line through the first switching circuit, when the sense amplifier starts sensing operation. Since the first source line potential is at the intermediate potential, the potential of the first semiconductor region changes toward the intermediate potential. Therefore, the absolute value of the threshold voltage of the first and second MOS transistors of the second conductivity type becomes smaller. Accordingly, charges are transferred effectively between the first source line and the first semiconductor region, so that the sense amplifier is allowed to perform high speed sensing operation with low current consumption.

Preferably, the first potential is lower than the second potential, the first conductivity type is p type and the second conductivity type is n type. The semiconductor memory device further includes a bit line precharge circuit and a second switching circuit. The bit line precharge circuit precharges the first and the second bit lines to the intermediate potential. The second switching circuit is connected between the first semiconductor region and a third potential node to which a third potential, which is lower than the second potential, is applied, and it turns on in response to the second control signal.

Since the second switch circuit is connected between the first semiconductor region and the third potential node as described above, when the potential difference in reading is generated between the first bit line and the second bit line, the second switching circuit turns on, and the third potential is applied to the first semiconductor region. Therefore, even when the potential difference in reading is large, forward bias is not applied between the drain of the second MOS transistor of the second conductivity type and the first semiconductor region. Therefore, flow of current between the first semiconductor region and the drain, reducing potential difference in reading, can be prevented.

More preferably, the second switching circuit turns off in response to turn on of the first switching circuit, and again turns on while the first switching circuit is on. Therefore, the potential of the first semiconductor region surely changes toward the first potential. Therefore, delay of the potential change of the first semiconductor region from the potential change of the source line hindering high speed amplification can be suppressed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[Embodiment 1]

A DRAM in accordance with Embodiment 1 of the present invention will be described with reference to FIGS.

Figure 1:
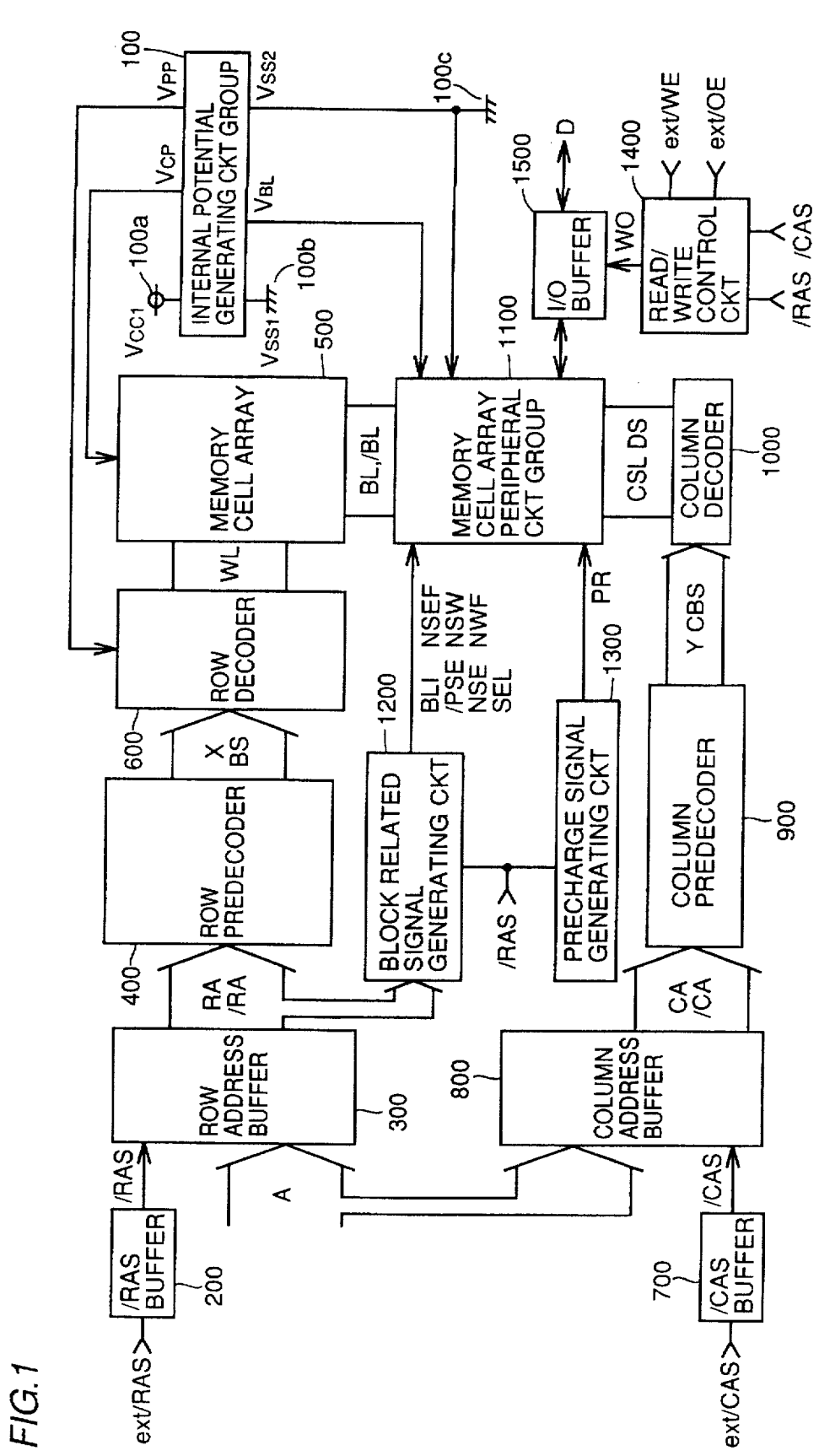
FIG. 1 is a block diagram showing a DRAM in accordance with Embodiment 1 of the present invention.

1 to 8. Referring to FIG. 1, the DRAM includes an internal potential generating circuit group 100, a /RAS buffer 200, a row address buffer 300, a row predicator 400, a memory cell array 500, a row decoder 600, a /CAS buffer 700, a column address buffer 800, a column predicator 900, a column decoder 1000, a memory cell array peripheral circuit group 1100, a block related signal generating circuit 1200, a precharge signal generating circuit 1300, a write/read control circuit 1400 and an input/output buffer 1500.

The internal potential generating circuit group 100 is driven in response to a power supply potential Vcc1 (3.3 V) applied to power supply potential node 100a, and ground potential Vss1 (0 V) which is another power supply potential applied to ground potential node 100b. Internal potential generating circuit group 100 includes a booster (not shown) for supplying a ground potential Vss2 (0.5 V) which is obtained by boosting ground potential Vss1, to ground potential node 100c. Internal potential generating circuit group 100 further includes a bit line precharge potential generating circuit (not shown) for supplying a bit line precharge potential $V_{BL}$ (=(½) (Vcc1+Vss2)) between power supply potential Vcc1 and ground potential Vss2. Internal potential generating circuit group 100 further includes a cell plate potential generating circuit (not shown) for supplying a cell plate potential $V_{CP}$ of (½) (Vcc1+Vss2). Internal potential generating circuit group 100 further includes a boosted potential generating circuit (not shown) for supplying the boosted potential Vpp (7 V) by boosting the power supply potential Vcc1.

/RAS buffer 200 applies, in response to an externally applied external row address strobe signal EXT/RAS, a row address strobe signal /RAS for internal circuitry. In response to an address signal Ai (i=0, 1, . . . , 11) and the row address strobe signal /RAS from /RAS buffer 200, row address buffer 300 latches the address signal Ai as the row address signal when row address strobe signal /RAS changes from the H level to the L level, and supplies a row address signal RAi (the same logic as address signal Ai) and /RAi (opposite logic to address signal Ai) for the internal circuitry. In response to row address signals RAi and /RAi from row address buffer 300, row predicator 400 supplies a row predecode signal X and a block selection signal BS. One of row predecode signals X0 to X3 attains to the H level in response to row address signals RA0, /RA0, RA1 and /RA1. One of row predecode signals X4 to X7 attains to the H level in response to row address signals RA2, /RA2, RA3 and /RA3. One of row predecode signals X8 to X11 attains to the H level in response to row address signals RA4, /RA4, RA5 and /RA5. One of row predecode signals X12 to X15 attains to the H level in response to row address signals RA6, /RA6, RA7 and /RA7. Of the block selection signals VSj (j=0., 1, . . . , 127), selected 8 signals attain to the H level in response to row address signals RA8, /RA8 to RA11 and /RA11.

Memory cell array 500 (see FIGS. 2 and 3) includes four memory mats. Each memory mat includes 16×$2^{20}$ memory cells arranged in rows and columns. Each memory mat is divided into 32 memory cell blocks. Each memory cell block includes 512×$2^{10}$ memory cells. Each memory cell block includes 256 word lines and 2×$2^{10}$ bit line pairs. The word lines are arranged in rows. Each word line is connected to 2×$2^{10}$ memory cells arranged on the corresponding row. The bit line pairs are arranged in columns. Each bit line pairs is connected to 256 memory cells arranged on the corresponding column. Each memory cell block is divided into 16 column blocks. Each column block includes 128 bit line pairs.

Row decoder 600 is divided into 128 row decoder blocks (see FIG. 4) corresponding to the memory cell blocks. Each row decoder block is selected in response to corresponding one of row predecode signals X0 to X15 and to block selection signal BSj from row predicator 400. One of 256 word lines corresponding to the selected row decoder block is boosted to boosted potential Vpp in response to row predecode signals X0 to X15. In response to an externally applied external column address strobe signal ext/RAS, /CAS buffer 700 supplies a column address strobe signal /CAS for the internal circuitry. In response to an address signal Ai (i=0, 1, . . . , 11) and to column address strobe signal /CAS from /CAS buffer 700, column address buffer 800 latches the address signal Ai as a column address signal when the column address strobe signal /CAS changes from the H level to the L level, and supplies column address signals CAi (same logic as address signal Ai) and /CAi (opposite logic to address signal Ai) for the internal circuitry.

Column predicator 900 supplies column predecode signal Y and column block selection signal CBS in response to column address signals CAi and /CA from column address buffer 800. One of column predecode signals Y0 to Y3 attains to the H level in response to column address signals CA0, /CA0, CA1 and /CA1. One of column predecode signals Y4 to Y7 attains to the H level in response to column address signals CA2, /CA2, CA3 and /CA3. One of column predecode signals Y8 to Y11 attains to the H level in response to column address signals CA4, /CA4, CA5 and /CA5. Selected one of the column block selection signal CBSk (k=0, 1, . . . , 63) attains to the H level in response to column address signals CA6, /CA6 to CA11 and /CA11.

Column decoder 1000 is provided commonly to 32 memory cell blocks included in one memory mat. Column decoder 1000 is divided into 64 column decoder blocks. Each column decoder block corresponds to one column block including 128 bit line pairs. Column decoder 1000 supplies column selection signal CSLm (m=0, 1, . . . , 63) in response to the column block selection signal CBSk and to column predecode signals Y0 to Y11 from column predicator 900. One of column selection signals CSLm attains to the H level in response to column predecode signals Y0 to Y11. In response to this one column selection signal CSLm, two bit line pairs are selected in each memory cell block. In response to column block selection signal CBSk, column decoder 1000 supplies data selection signal DSn (n=0, 1, . . . , 255). In response to block selection signal BSj, eight memory cell blocks are selected. Two bit line pairs of each column block of the selected eight memory cell blocks are selected in response to the column selection signal CSLm. Therefore, 256 bits of data are read from a total of 256 bit line pairs. Data selection signal DSn selects four bits out of the read out 256 bits of data.

Memory cell array peripheral circuit group 1100 (see FIG. 3) includes a sense amplifier group, an I/O circuit and so on. The sense amplifier group is divided into 132 sense amplifier blocks. Each sense amplifier block includes $2^{10}$ sense amplifiers. Of 132 sense amplifier blocks, 124 blocks are provided between memory cell blocks. Each sense amplifier block is shared by adjacent two memory cell blocks. The I/O circuit includes a local I/O line and a global I/O line for supplying data read out from the memory cell to the outside or for supplying data to be written to the memory cell.

Block related signal generating circuit 1200 supplies, in response to the row address strobe signal /RAS from /RAS buffer 200 and row address signals RA8, /RA8 to RA11, /RA11 from row address buffer 300, a bit line separation signal BLIp (p=0, 1, . . . , 255), sense amplifier enable signals /PSEq, NSEq (q=0, 1, . . . , 131), a first sense signal NSEFq, a source/well short control signal NSWq, a well potential fixing control signal NWFq, and a selection signal SEL. When row address strobe signal /RAS falls to the L level, eight memory blocks are selected in response to row address signals RA8, /RA8 to RA11, /RA11. Bit line pairs in memory blocks other than the selected memory blocks are separated from corresponding sense amplifiers in response to bit line separation signal BLIp. The sense amplifiers corresponding to the selected memory cell blocks are activated in response to sense amplifier enable signal /PSEq, NSEq. The sense amplifier corresponding to the selected memory cell block performs initial sensing in response to the first sense signal NSEFq. In response to source/well short control signal NSWq and well potential fixing control signal NWFq, the potential of the well, in which the sense amplifier is formed, is controlled. The local I/O line corresponding to the selected memory cell block is connected to the global I/O line in response to selection signal SELq.

Precharge signal generating circuit 1300 generates, in response to row address strobe signal /RAS, a precharge signal PR for precharging the bit line pair. The precharge signal PR attains to the L level when the row address strobe signal RAS attains to the L level, and it attains to the H level when the row address strobe signal /RAS attains to the H level. Write/read control circuit 1400 supplies a write/read control signal WO in response to the row address strobe signal /RAS, column address strobe signal /CAS, an externally applied write enable signal ext/WE and an externally applied output enable signal ext/OE. Input/output buffer 1500 inputs/outputs data D in response to write/read control signal WO from write/read control circuit 1400. When write/read control signal indicates writing, data is supplied to the I/O circuit in memory cell array peripheral circuit group 1100 in response to externally applied four bits of data Dr (r=0, 1, 2, 3). meanwhile, when write/read control signal WO indicates reading, data Dr is externally supplied in response to the data applied from the I/O circuit.

Figure 2:
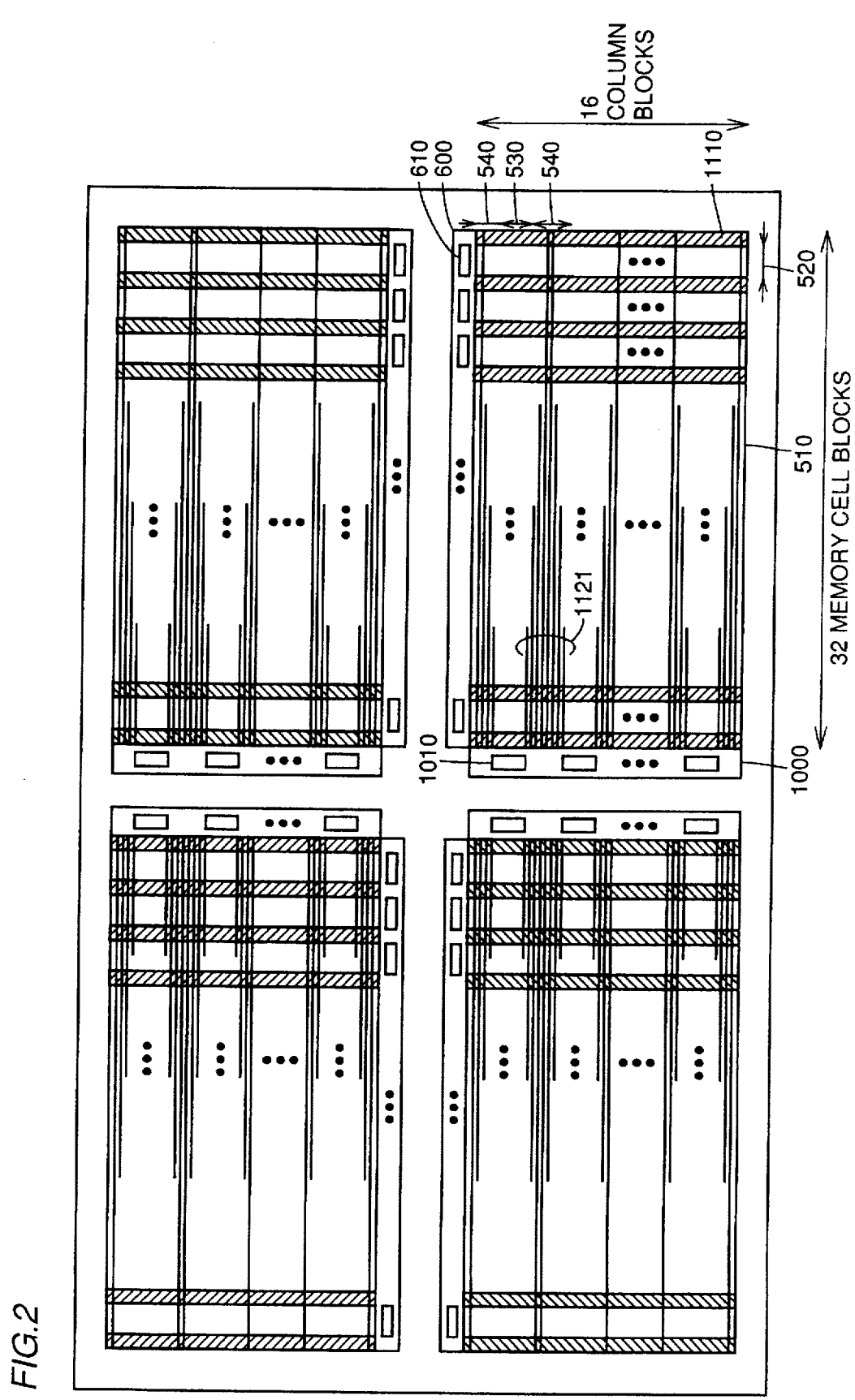
FIG. 2 is a schematic plan view showing a chip layout of the DRAM shown in FIG. 1.

FIG. 2 shows a layout of the memory cell array 500, row decoder 600, column decoder 1000 and memory cell array peripheral circuit group 1100. In the DRAM, four memory mats 510 are arranged. In each memory mat 510, a plurality of memory cell blocks 520, column blocks 530, and column block dividing regions 540 are arranged. A plurality of row decoder blocks are arranged in row decoder 600, and a plurality of column decoder blocks 1010 are arranged in column decoder 1000. In each memory mat 510, a plurality of sense amplifier blocks 1110 and a plurality of global I/O line pairs are further arranged. The global I/O line pair is arranged in the column block dividing region 540. Each global I/O line corresponds to eight memory cell blocks 520. On both sides of one column block 530 in the corresponding eight memory cell blocks 520, two global I/O line pairs are arranged. In FIG. 2, one global I/O line pair is represented by one line.

Figure 3:
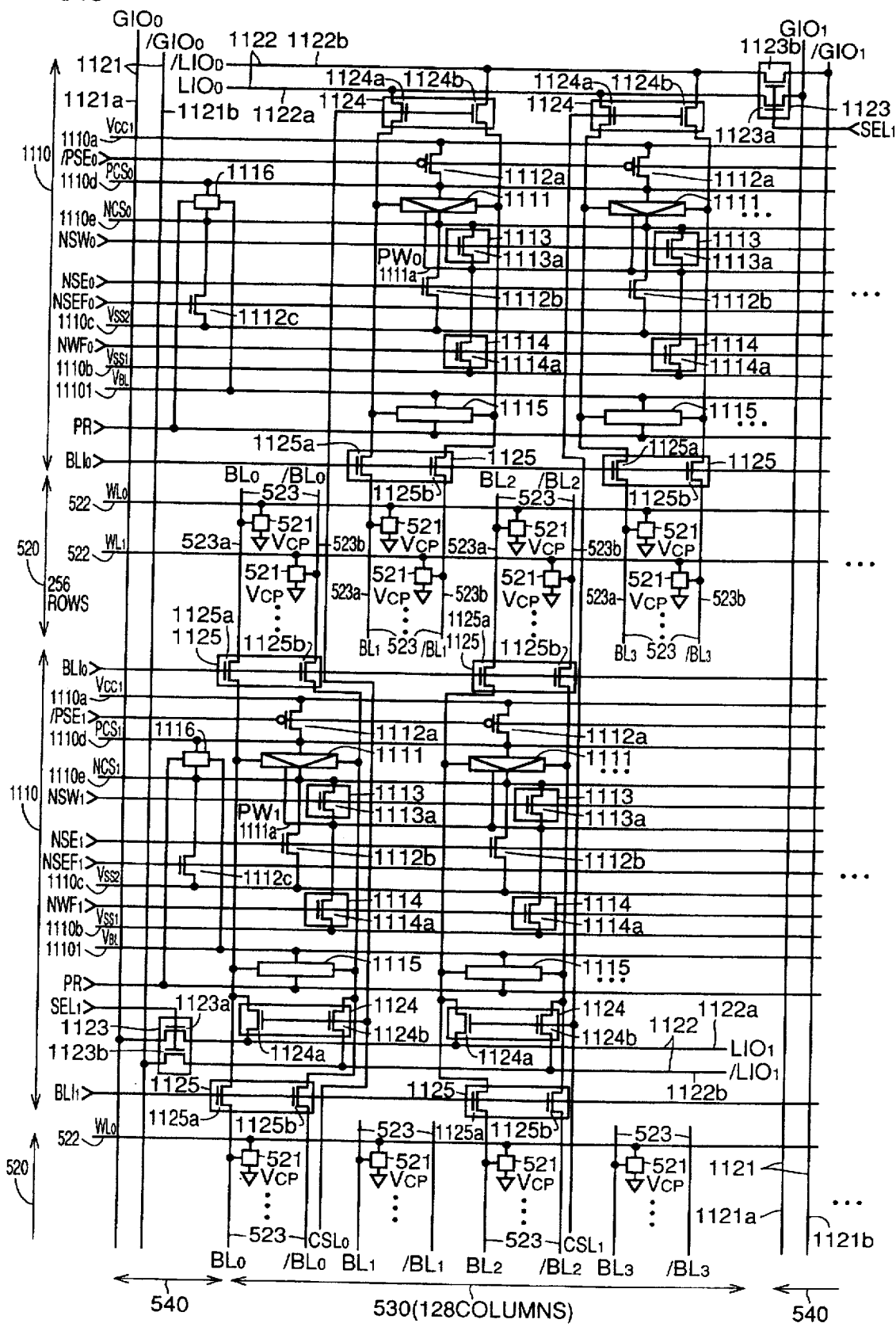
FIG. 3 is a block diagram showing a memory cell array and peripheral circuitry in the DRAM of FIG. 1.

FIG. 3 is a schematic diagram showing one column block 530 and peripheral circuitry thereof in a memory cell block 520. Referring to FIG. 3, column block 530 includes a plurality of memory cells 521 (see FIG. 4), a plurality of word lines 522 and a plurality of bit line pairs 523. Memory cells 521 are arranged in rows and columns. Word lines 522 are arranged in plural rows over 16 column blocks 530. For each memory cell block 520, 256 word lines are provided. Each word line is connected to $2 \times 2^{10}$ memory cells 521 arranged on the corresponding row. The bit line pairs 523 are arranged in plural columns. Each bit line pair is connected to 256 memory cells 521 arranged on the corresponding column. Each bit line pair includes bit lines 523a and 523b.

Power supply potential line 1110a is connected to a power supply potential node 100a to which power supply potential Vcc1 is applied. Ground potential line 1110b is connected to a ground potential node 100b to which the ground potential Vss1 is applied. To the ground potential node 1110c, ground potential Vss2 which is obtained by boosting ground potential Vss1 is applied. Each of p channel common source lines 1110d is provided corresponding to each sense amplifier block 1110. Each of n channel common source lines 1110e is provided corresponding to each sense amplifier block 1110. A bit line precharge potential $V_{BL}$ is supplied to precharge potential line 1110f. A sense amplifier 1111 (see FIG. 4) is connected to a bit line pair 523. Sense amplifier 1111 is driven in response to the potential of common source lines 1110d and 1110e, and pulls up one of these to power supply potential Vcc1 and pulls down the other to the ground potential Vss by amplifying small potential difference generated at the bit line pair 523.

A p channel sense amplifier enable transistor 1112a is connected between power supply potential line 1110a and p channel common source line 1110d, and receives at its gate a p channel sense amplifier enable signal /PSEq. An n channel sense amplifier enable transistor 1112b is connected between the ground potential line 1110c and n channel common source line 1110e, and receives at its gate n channel sense amplifier enable signal NSEq. An n channel sense amplifier enable transistor 1112c is connected between ground potential line 1110c and n channel common source line 1110e. Transistor 1112c performs initial sensing in response to first sense signal NSEFq. The ratio W/L of the channel width W with respect to channel length L of transistor 1112c is smaller than that of n channel sense amplifier enable transistor 1112b. Switching circuit 1113 includes an n channel MOS transistor 1113a. Transistor 1113a is connected between n channel common source line 1110e and p type well 1111a in which n channel MOS transistors 1111b and 1111c of sense amplifier 1111 are formed, and receives at its gate the source/well short control signal NSWq. Therefore, switching circuit 1113 turns on in response to source/well short control signal NSWq. A switching circuit 1114 includes an n channel MOS transistor 1114a. Transistor 1114a is connected between p channel well 1111a and ground potential line 1110b and receives at its gate well potential fixing control signal NWFq. Therefore, switching circuit 1114 turns on in response to well potential fixing control signal NWFq. A bit line precharge circuit 1115 (see FIG. 4) is connected to bit line pair 523, and precharges, in response to a precharge signal PR of the H level, bit lines 523a and 523b to the bit line precharge potential $V_{BL}$. A common source line precharge circuit 1116 (see FIG. 4) is connected to common source lines 1110d and 1110e, and precharges, in response to the precharge signal PR of the H level, common source lines 1110d and 1110e to the bit line precharge potential $V_{BL}$.

Each of the global I/O line pairs 1121 includes global I/O lines 1121a and 1121b. Each of local I/O line pairs 1122 includes local I/O lines 1122a and 1122b, and provided corresponding to the column block 530 of each sense amplifier block 1110. Global I/O gate circuit 1123 is connected between the corresponding global I/O line pair 1121 and the local I/O line pair 1122, and in response to selection signal SELq of the H level, connects the global I/O line pair 1121 to the local I/O line pair 1122. Global I/O gate circuit 1123 includes n channel MOS transistors 1123a and 1123b. A local I/O gate circuit 1124 is connected between the corresponding local I/O line pair 1122 and bit line pair 523, and in response to column selection signal CSLm of the H level, connects the local I/O line pair 1122 to bit line pair 523. The local I/O gate circuit includes n channel MOS transistors 1124a and 1124b. Bit line separating circuit 1125 is connected between the corresponding bit line pair 523 and sense amplifier 1111, and separates, in response to bit line separating signal BLIp of the H level, the bit line pair 523 from the sense amplifier 1111. Bit line separating circuit 1125 includes n channel MOS transistors 1125a and 1125b.

Figure 4:
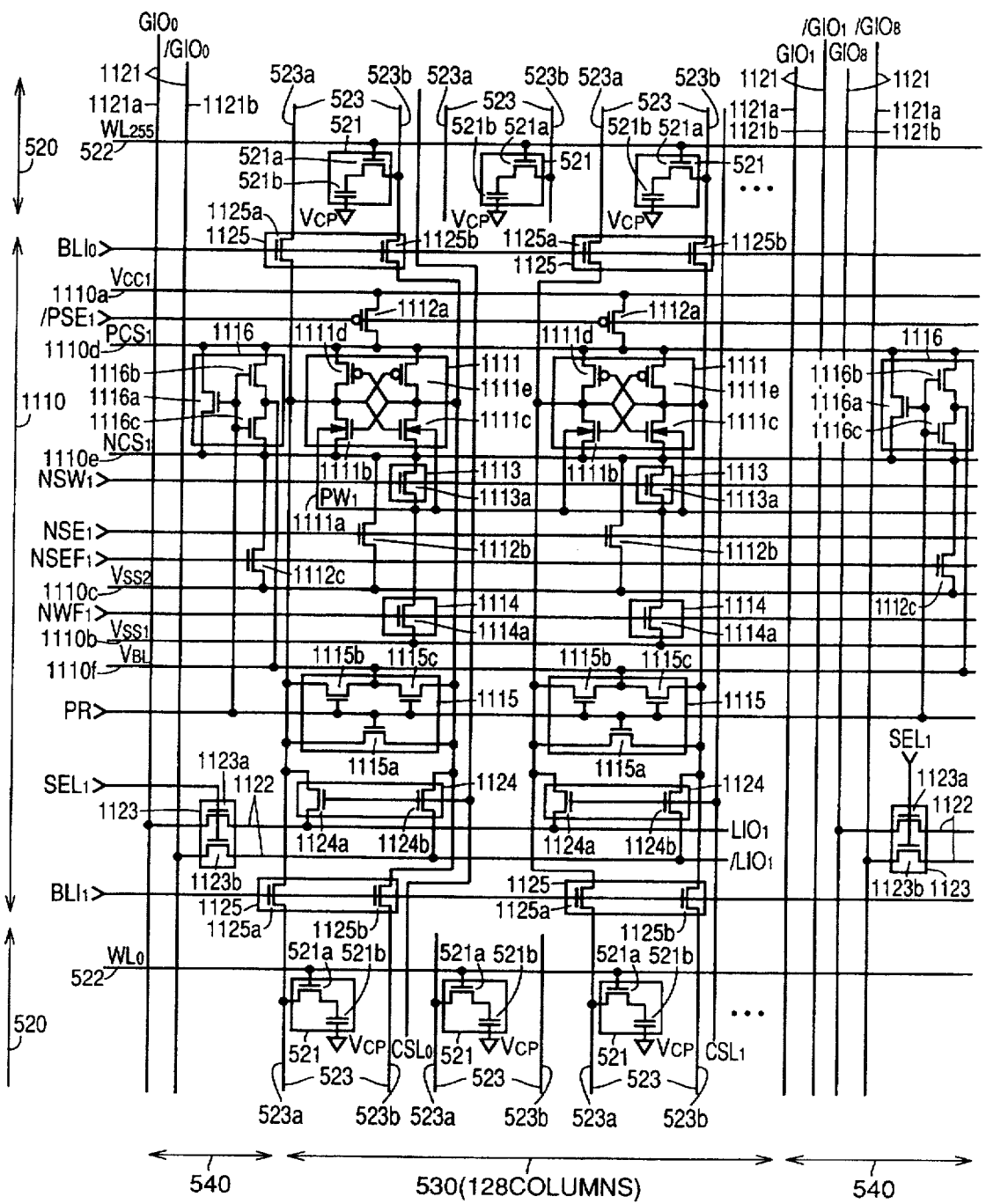
FIG. 4 is a circuit diagram showing in greater detail the memory cell array and the peripheral circuitry of FIG. 3.

FIG. 4 is a circuit diagram showing in greater detail the memory cell block 520 and the sense amplifier block 1110 of FIG. 3. Referring to FIG. 4, memory cell 521 includes a capacitor 521a and an n channel memory transistor 521b. To one electrode of capacitor 521a, cell plate potential $V_{CP}$ is applied. Transistor 521b is connected between bit line 523a or 523b and capacitor 521a. Sense amplifier 1111 includes n channel MOS transistors 1111b and 1111c, and p channel MOS transistors 1111d and 1111e. Transistor 1111b is connected between bit line 523a and n channel common source line 1110e, and has its gate connected to bit line 523b. Transistor 1111c is connected between bit line 523b and n channel common source line 1110e, and has its gate connected to bit line 523a. Transistor 1111d is connected between bit line 523a and p channel common source line 1110d, and has its gate connected to bit line 523b. Transistor 1111e is connected between bit line 523b and p channel common source line 1110d, and has its gate connected to bit line 523a. N channel MOS transistors 1111b and 1111c of the sense amplifier 1111 included in one sense amplifier block 1110 are formed in one p type well 1111a, while n channel MOS transistors 1111b and 1111c of sense amplifier 1111 included in another sense amplifier block 1110 are formed in another p type well.

Bit line precharge circuit 1115 includes an n channel equalize transistor 1115a and n channel precharge transistors 1115b and 1115c. Transistor 1115a is connected between bit lines 523a and 523b, and receives at its gate the precharge signal PR. Transistor 1115b is connected between bit line 523a and precharge potential line 1110f, and receives at its gate the precharge signal PR. Transistor 1115c is connected between bit line 523b and precharge potential line 1110f, and receives at its gate the precharge signal PR. Common source line precharge circuit 1116 includes an n channel equalize transistor 1116a and n channel precharge transistors 1116b and 1116c. Transistor 1116a is connected between p channel common source line 1110d and n channel common source line 1110e, and receives at its gate the precharge signal PR. Transistor 1116b is connected between p channel common source line 1110d and precharge potential line 1110f, and receives at its gate the precharge signal PR. Transistor 1116c is connected between n channel common source line 1110e and precharge potential line 1110g, and receives at its gate the precharge signal PR.

Figure 5:
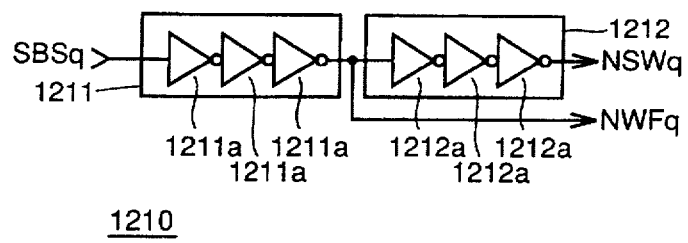
FIG. 5 is a schematic diagram showing the well potential control circuit used in the DRAM of FIG. 1.

FIG. 5 is a schematic diagram showing well potential control circuit 1210 for generating source/well short control signal NSWq and well potential fixing control signal NWFq, in block related signal generating circuit 1200. Referring to FIG. 5, block related signal generating circuit 1200 includes inverting and delaying circuits 1211 and 1212. Inverting and delaying circuit 1211 is provided corresponding to sense amplifier block 1110. Memory cell block 520 is selected in response to row address signals RAS, /RA8 to RA11/RA11, and the inverting and delaying circuit 1211 corresponding to sense amplifier blocks 1100 on both sides of the selected memory cell block 520 receives sense amplifier block selection signal SBSq at the H level, and provides a well potential fixing control signal NWFq which is obtained by inverting and delaying the received signal SBSq. Inverting and delaying circuit 1212 receives well potential fixing control signal NWFq, and provides source/well short control signal NSWq by inverting and delaying the received signal NWFq.

Figure 6:
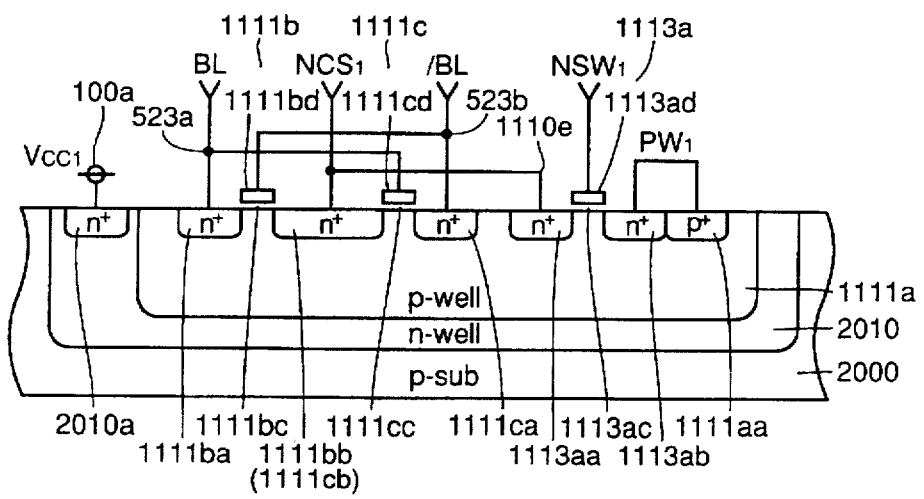
FIG. 6 is a schematic cross section of the semiconductor substrate on which an n channel sense amplifier of FIG. 4 is formed.

FIG. 6 is a schematic cross section of a semiconductor substrate in which transistors 1111b and 1111c of sense amplifier 1111 and n channel MOS transistor 1113a of switching circuit 1113 are formed. Referring to FIG. 6, an n type well 2010 is formed in a p type semiconductor substrate 2000. In n type well 2010, an $n^+$ diffusion region 2010a is formed, which diffusion region 2010a is connected to power supply potential node 100a. The n type well 2010 is fixed at the power supply potential Vcc1 through diffusion region 2010a. A p type well 1111a is formed in n type well 2010. In p type well 1111a, transistors 1111b and 1111c of sense amplifier 1111 and transistor 1113a of switching circuit 1113 are formed. In p type well 1111a, a $p^+$ type diffusion region 1111aa is formed. A well potential PWq is applied through $p^+$ diffusion region 1111aa to p type well 1111a.

Transistor 1111b in sense amplifier 1111 includes source/drain 1111ba and 1111bb, and a gate 1111bd. One of the source/drain regions 1111ba is formed of $n^+$ diffusion region formed in p type well 1111a, and connected to bit line 523a. The other one of source/drain regions 1111bb is formed of $n^+$ type diffusion region formed in p type well 1111a, and connected to n channel common source line 1110e. Gate 1111bb is formed on p type well 1111a between source/drain regions 1111ba and 1111bb, with a gate insulating film 1111bc interposed. Transistor 1111c includes source/drain 1111ca and 111cb, and a gate 1111bb. One of the source/drain 1111ca is formed of an $n^+$ diffusion region formed in p type well 1111a, and connected to bit line 523b. The other one of the source/drain 1111cb is formed of an $n^+$ type diffusion region formed in p type well 1111a and connected to n channel common source line 1110e. Gate 1111bd is formed on a p type well 1111a between source/drain 1111ca and 1111cb, with a gate insulating film 1111bc interposed.

Transistor 1113a in switching circuit 1113a has source/drain 1113aa and 1113ab, and a gate 1113ad. One of the source/drain 1113aa is formed of an $n^+$ type diffusion region formed in p type well 1111a, and connected to n channel common source line 1110e. The other one of the source/drain 1113ab is formed of an $n^+$ type diffusion region formed in p type well 1111a, and connected through p type diffusion region 1111aa to p type well 1111a. Gate 1113ab is formed on p type well 1111a between source/drain 1113aa and 1113ab with a gate insulating film 1113ac interposed. Source/well short control signal NSWq is applied to the gate 1113ad.

Figure 7:
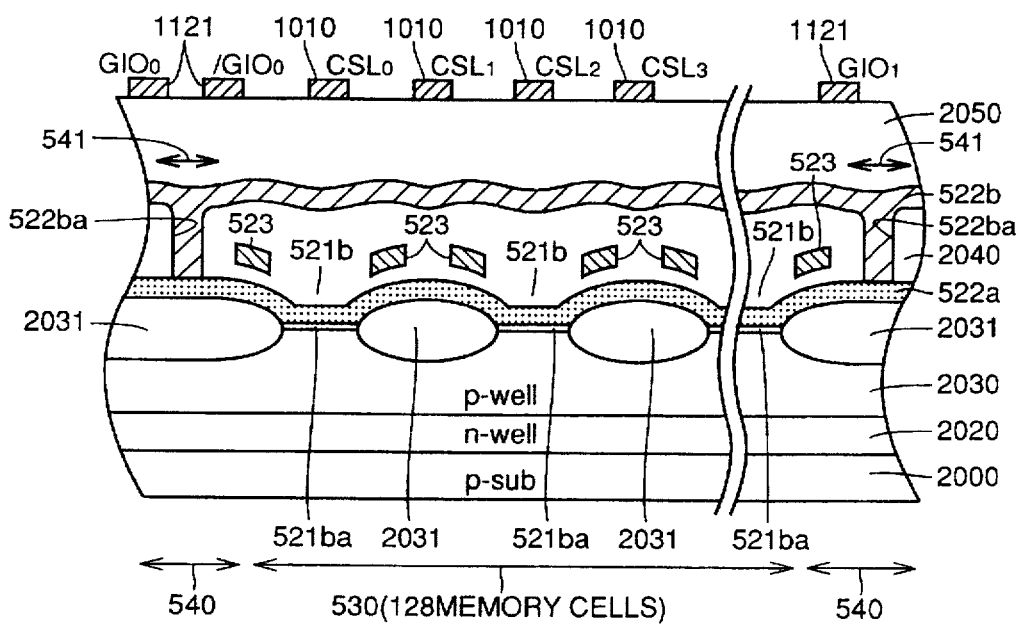
FIG. 7 is a schematic cross section of the memory cell array of FIG. 1.

FIG. 7 is a schematic cross section of a memory cell block 520 in the direction of extension of word line 522. An n type well 2020 is formed in a p type semiconductor substrate. A p type well 2030 is formed in n type well 2020, and element isolating region 231 is formed in the p well and formed of an insulator. Word line 522 includes a lower portion 522a positioned at a lower layer, and an upper portion 522b positioned at an upper layer. Lower portion 522a constitutes gate of memory transistor 521b, and is of polycrystalline silicon. Upper portion 522b is formed of a metal (aluminum in this embodiment) having smaller resistance value than that of lower portion 522a, on interlayer insulating film 2040. Upper portion 522b is connected to lower portion 522a at every column block 530 (128 bit line pairs 523), through contact hole 522ba at a word line shunt region 541 in the column block dividing region 540. Since upper portion 522b having smaller resistance value is formed, delay in transmitting signals over word line 522 can be suppressed. Global I/O line pair 1121 is formed in column block dividing region 540 on interlayer insulating film 250. Column selection line 1010 is also formed in the same layer as global I/O line pair 1121.

Next, reading operation of the DRAM thus structured will be described with reference to FIG. 8. First, until the row address strobe signal ext/RAS lowers from the H level to the L level at time t0 as shown in (a) of FIG. 8, potentials WLs of word lines 522 are all at $Vss_1$ as shown in FIG. 8(f), and n channel memory transistor 521b in memory cell 521 is off, hence memory cell 521 is kept at a data holding state. Bit line separation signals BLIp are all at the boosted potential Vpp as shown in FIG. 8(e), and all the bit line pairs 523 are connected to the corresponding sense amplifiers 1111 and to the precharge circuits 1115. Further, precharge signal PR is at the H level as shown in FIG. 8(d). Therefore, upon reception of this signal, bit line precharge circuit 1115 precharges the potentials BLt and/BLt (t=0, 1, . . . , 127) of bit lines 523a and 523b to the precharge potential $V_{BL}$ of (½) ($Vcc_1+VSS_2$) as shown in FIG. 8(p). Common source line precharge circuit 1116 precharges potentials PCSq and NCSq of p channel common source line 1110d and n channel common source line 1110e, respectively, to the precharge potential $V_{BL}$, as shown in FIG. 8(m).

Figure 8:
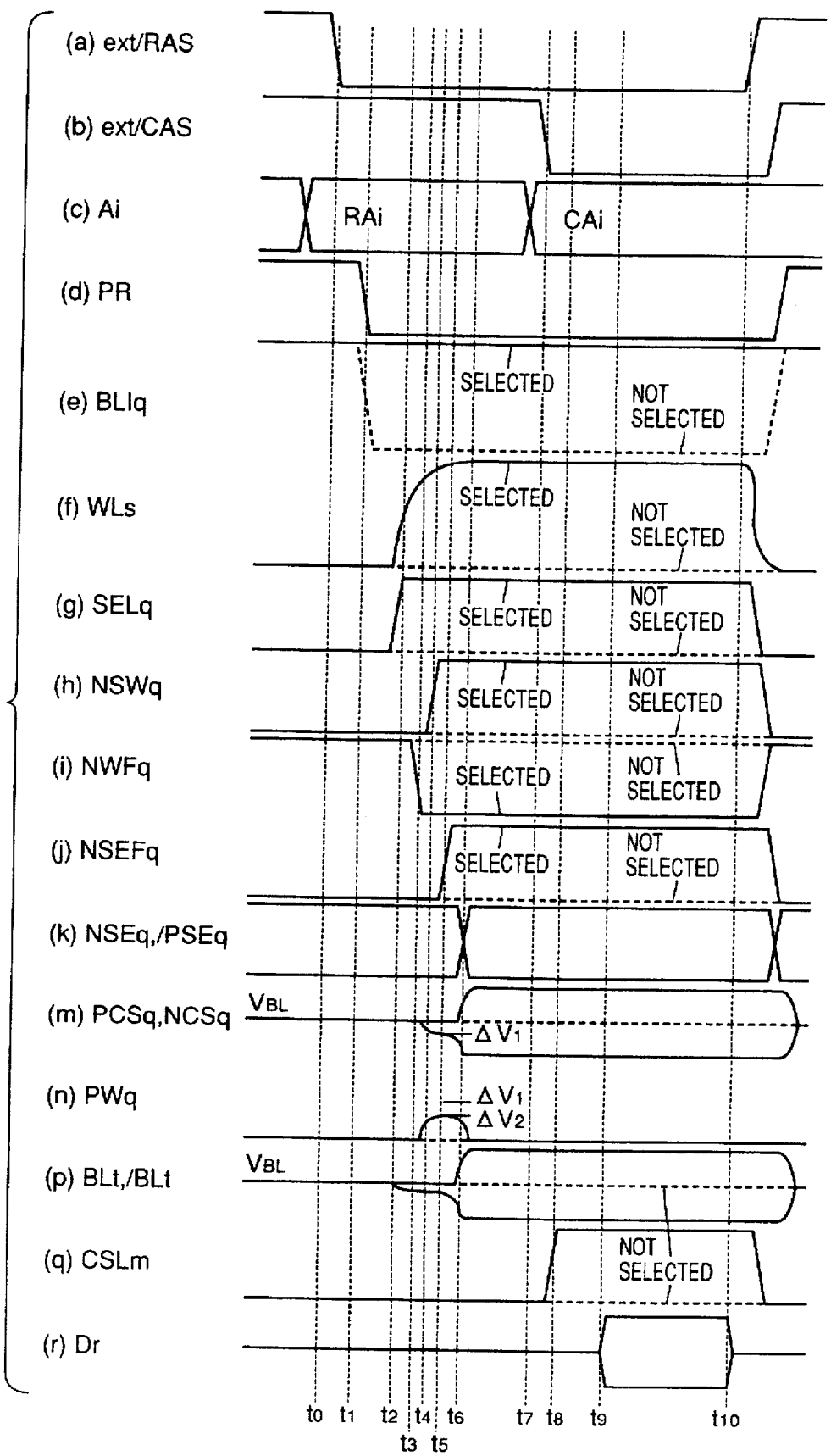
FIG. 8 is a timing chart showing the operation of the DRAM shown in FIGS. 1 to 7.

The first sense signal NSEFq, n channel sense amplifier enable signal NSEq and p channel sense amplifier enable signal /PSEq are at the L level ($Vss_1$), L level and H level ($Vcc_1$) as shown in (j) and (k) of FIG. 8, respectively. Therefore, the potential PCSq of p channel common source line 1110d and potential NCSq of n channel common source line 1110e are kept at the precharge potential $V_{BL}$, power supply potential $Vcc_1$ and ground potential $Vss_2$ are not supplied to sense amplifier 1111, and therefore sense amplifiers 1111 are all inactive. Since source/well short control signal NSWq and well potential fixing control signal NWFq are at the L level and H level as shown in (h) and (i) of FIG. 8, n channel MOS transistor 1113 of switching circuit 1113 and n channel MOS transistor 1114a of switching circuit 1114 receiving these signals are off and on, respectively, p type well 1111a in which n channel MOS transistors 1111b and 1111c of sense amplifier 1111 are formed and n channel common source line 1110e are not connected, p type well 1111a and ground potential line 1110b are connected, and hence the potential PWq of the p type well is at the ground potential $Vss_1$ as shown in (n) of FIG. 8.

Further, column selection signals CSLm are all at the L level as shown in (q) of FIG. 8 and bit line pair 523 is separated from local I/O line pair 1122. Selection signals SELq are also all at the L level as shown in (g) of FIG. 8, and local I/O line pair 1122 is separated from global I/O line pair 1121. At this time, since input/output buffer 1500 is inactivated by write/read control circuit 1400, the output data Dr is at a high impedance state as shown in FIG. 8(r).

When row address strobe signal ext/RAS falls to the L level at time $t_0$ as shown in FIG. 8(a), the row address strobe signal /RAS output from /RAS buffer 200 also attains to the L level, row address buffer 300 latches address signal Ai and provides row address signals RAi, /RAi, block related signal generating circuit 1200 keeps the bit line separation signal BLIp selected by the row address signals RAi and/RAi at time $t_1$ at the boosted potential Vpp. The circuit 1200 lowers the non-selected bit line separation signal BLIp to the L level, and in response, the non-selected bit line pair 523 is separated from sense amplifier 1111 and bit line precharge circuit 1115 by bit line separating circuit 1125. Precharge signal generating circuit 1300 lowers the precharge signal PR to the L level at time t1 prescribed time period after the time $t_0$ as shown in FIG. 8(d). In response, bit line precharge circuit 1115 stops precharging bit lines 523a and 523b, and common source line precharge circuit 11116 also stops precharging p channel common source line 1110d and n channel common source line 1110e.

Then, in response to the row address signals RAi and /RAi taken in the DRAM at the falling edge of row address strobe signal ext/RAS, the potential WLs of the selected word line 522 in the selected memory cell block 520 rises to the boosted potential Vpp as shown in FIG. 8(f), selection signal SELq corresponding to row address signals RAi and /RAi rises to the H level at time $t_2$ as shown in FIG. 8(g), and the selected local I/O line pair 1122 and the corresponding global I/O line pair 1121 are connected by global I/O gate circuit 1123.

N channel memory transistor 521b in the memory cell 521 connected to the selected word line 522 turns on, charges are exchanged between the other electrode of capacitor 521a and the bit line 523a or 523b, and potential BLt, /BLt of bit line 523a or 523b is slightly increased or decreased from the precharge potential $V_{BL}$, in accordance with the data of H level ($Vcc_1$) or the L level ($Vss_2$) stored in the capacitor 521 of memory cell 521, as shown in FIG. 8(p). Thereafter, well potential fixing control signal NWFq attains to the L level at time $t_3$ as shown in FIG. 8(i), and in response, n channel MOS transistor 1114a in switching circuit 1114 turns off, and thus p type well 1111a in which n channel MOS transistors 1111b and 1111d of sense amplifier 1111 are formed is separated from the ground potential line 1110b.

At time $t_4$, source/well short control signal NSWq rises to the H level, and in response, n channel MOS transistor 1113a in switching circuit 1113 is rendered conductive. The p type well 1111a in which n channel MOS transistors 1111b and 1111c of sense amplifier 1111 are formed is electrically connected to n channel common source line 1110e, charges stored in parasitic capacitance incidental to n channel common source line 1110e flow to the parasitic capacitance incidental to p type well 111a, the potential NCSq of n channel common source line 1110e lowers by $\Delta V_1$ from bit line precharge potential $V_{BL}$ as shown in FIG. 8(m), the potential PWq rises by $\Delta V_2$ from $Vss_1$ as shown in FIG. 8(n), and it becomes equal to the potential NCSq of n channel common source line 1110e.

Then, when first sense signal NSEFq rises to the H level at time $t_5$ as shown in FIG. 8(j), n channel sense amplifier enable transistor 1112c having smaller size for initial sensing turns on, n channel common source line 1110e is slowly discharged, and thus sense amplifier 1111 performs sensing operation with high sensitivity. Then, when sense amplifier enable signals NSEq and/PSEq attain to the H level and L level at time $t_6$, respectively, as shown in FIG. 8(k), n channel sense amplifier enable transistor 1112b and p channel sense amplifier enable transistor 1112a which are of larger size are rendered conductive, potential PCSq of p channel common source line 1110d and potential NCSq of n channel common source line 1110e are charged to the power supply potential $Vcc_1$ and discharged to the ground potential $Vss_2$ as shown in FIG. 8(m) respectively, so that sense amplifier 1111 performs amplifying operation at high speed. Of the bit lines 523a and 523b, one having slightly higher potential is amplified to the power supply potential $Vcc_1$ and one having lower potential is amplified to the ground potential $Vss_2$, as shown in FIG. 8(p).

At this time, through n channel MOS transistor 1113a in switching circuit 1113, p type well 1111a in which n channel MOS transistors 1111b and 1111c of sense amplifier 1111 are formed is electrically connected to n channel common source line 1110e. Therefore, the potential PWq of the p type well also lowers to the ground potential $Vss_2$, following the lowering of potential NCSq of n channel common source line 1110e, as shown in FIG. 8(n).

When column address strobe signal ext/CAS falls to the L level at time $t_7$ as shown in FIG. 8(b), the column address strobe signal /CAS output from /CAS buffer 700 also attains to the L level, and column address buffer 800 receiving this signal latches the address signal Aj and provides column address signals CAi and /CAi. Column selection signal CSLm selected in response to the column address signals CAi, /CAi attains to the H level at time $t_8$ as shown in FIG. 8(q), and bit line pair 523 corresponding to the column selection signal CSLm which has attained to the H level is selected and connected to local I/O line pair 1122 by means of local I/O gate circuit 1124, and potential difference of bit line 523 amplified by sense amplifier 1111 is transmitted to global I/O line pair 1121 through local I/O line pair 1122.

Further, input/output buffer 1500 is activated by write/read control circuit 1400 to output data, and of the data stored in memory cells transmitted from global I/O line pair 1121, 4 bits of data Dr are output at time $t_9$ as shown in FIG. 8(r), in response to the data selected by data selection signal DSn.

As described above, in the DRAM of Embodiment 1, when sense amplifier 1111 starts sensing operation, p type well 1111a in which n channel MOS transistors 1111b and 1111c of sense amplifier 1111 are formed is conducted to n channel common source line 1110e by means of switching circuit 1113, charges stored in n channel common source line 1110e are moved to p type well 1111a, so that effectively using charges stored in n channel common source line 1110e, the potential of the p type well 1111a is increased. Therefore, power consumption caused by charging/discharging of the p type well 111aa can be reduced.

Further, when sense amplifier 1111 starts sensing operation, p type well 1111a in which n channel MOS transistors 1111b and 1111c of sense amplifier 1111 are formed is connected to n channel common source line 1110e, and backgate/source voltage of n channel MOS transistors 1111b and 1111c is set to zero. Therefore, the threshold voltage of n channel MOS transistors 1111b and 1111c is made smaller than when the p type well 1111a is fixed at the ground potential $Vss_1$. Therefore, a DRAM which allows high speed sensing operation and lower power supply potential can be obtained.

Assume that potential difference in reading generated between bit lines 523a and 523b when potential WLs of word line 522 becomes larger than the junction voltage (about 0.6 V) between drains of n channel MOS transistors 1111b and 1111c of sense amplifier 1111 and p well 1111a in which these n channel MOS transistors 1111b and 1111c are formed. Even at this time, the drains of n channel MOS transistors 1111b and 1111c and p type well 1111a are not forward biased, as the potential PWq of p type well 1111a is set to the ground potential $Vss_1$ by means of switching circuit 1114, and hence undesirable reduction in potential difference in reading, caused by flow of charges from the p type well 1111a to the drains, can be avoided.

Further, switching circuits 1113 and 1114 are arranged for every sense amplifier 1111. Therefore, biasing of potential in p type well 1111a in which n channel MOS transistors 1111b and 1111c of sense amplifier 1111 are formed can be eliminated. Therefore, the time necessary for the potential of p type well 1111a to be stabilized is not made longer because of the resistance of p type well 1111a. Even when p type well 1111a suffers from noise, original potential can be readily recovered, and sense amplifier 1111 operates stably. Therefore, the sense amplifier 1111 has higher controllability.

Though switching circuits 1113 and 1114 are formed only on the sides of n channel MOS transistors 1111b and 1111c in Embodiment 1, similar switching circuits may be provided only on the sides of p channel MOS transistors 1111d and 1111e to obtain similar effects.

In Embodiment 1, ground potential $Vss_1$ (0 V) and boosted ground potential $Vss_2$ (0.5 V) are used. However, these two potentials may not be distinguished, and only the ground potential $Vss_1$ or ground potential $Vss_2$ may be used to obtain similar effects.

Further, in Embodiment 1, switching circuits 11113 and 1114 are provided for every sense amplifier 1111. However, even when these are provided for every plural sense amplifiers 1111 (for example, in every four sense amplifiers), the biasing of potential in p type well 1111a in which n channel MOS transistors 1111b and 1111c are formed is small, and therefore controllability of the sense amplifier 1111 can be improved.

[Embodiment 2]

Figure 9:
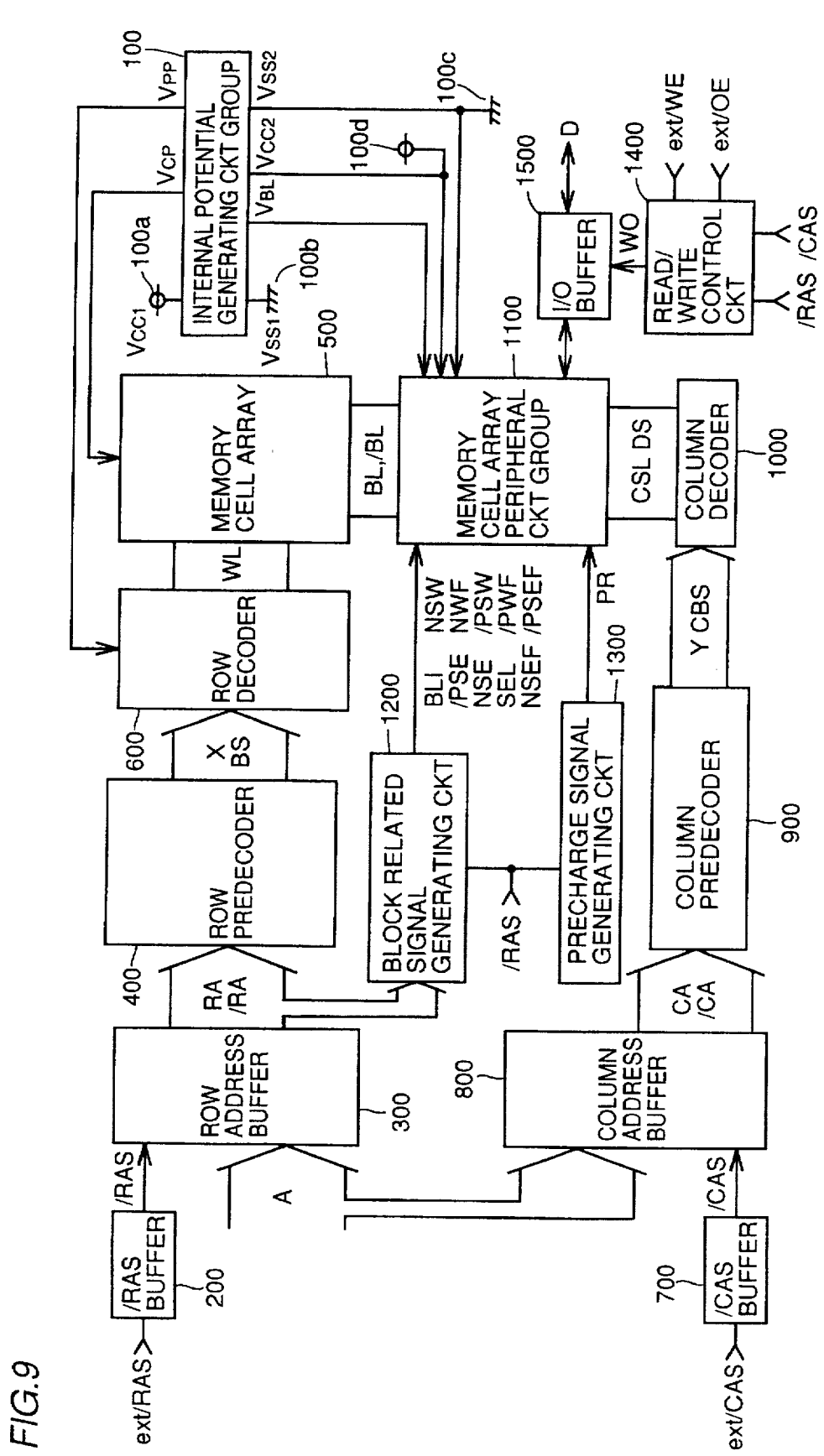
FIG. 9 is a block diagram showing a DRAM in accordance with Embodiment 2 of the present invention.

A DRAM in accordance with Embodiment 2 of the present invention will be described with reference to FIGS. 9 to 11. FIG. 9 is a block diagram showing the DRAM in accordance with Embodiment 2. This DRAM differs from the DRAM of Embodiment 1 shown in the block diagram of FIG. 1, in the following points. Namely, block related signal generating circuit 1200 newly outputs a first sense signal /PSEFq, a source/well short control signal /PSWq and well potential fixing signal /PWFq, of which logics are inverted from those of first sense signal NSEFq, source/well short control signal NSWq and well potential fixing signal NWFq; structure of the sense amplifier block 1110 in memory cell array peripheral circuit group 1100 is different; internal potential generating circuit group 100 supplies power supply potential $Vcc_2$ (2.8 V) obtained by lowering power supply potential $Vcc_1$ (3.3 V) to power supply potential node 100d; and precharge potential $V_{BL}$ is set to (½) ($Vcc_2$+$Vss_2$) in Embodiment 1, and that bit line changes between $Vcc_2$ and $Vss_2$ (in Embodiment 1, changes between $Vcc_1$ and $Vss_2$). In the following, like numerals denote like components as Embodiment 1, and description thereof is not repeated.

Figure 10:
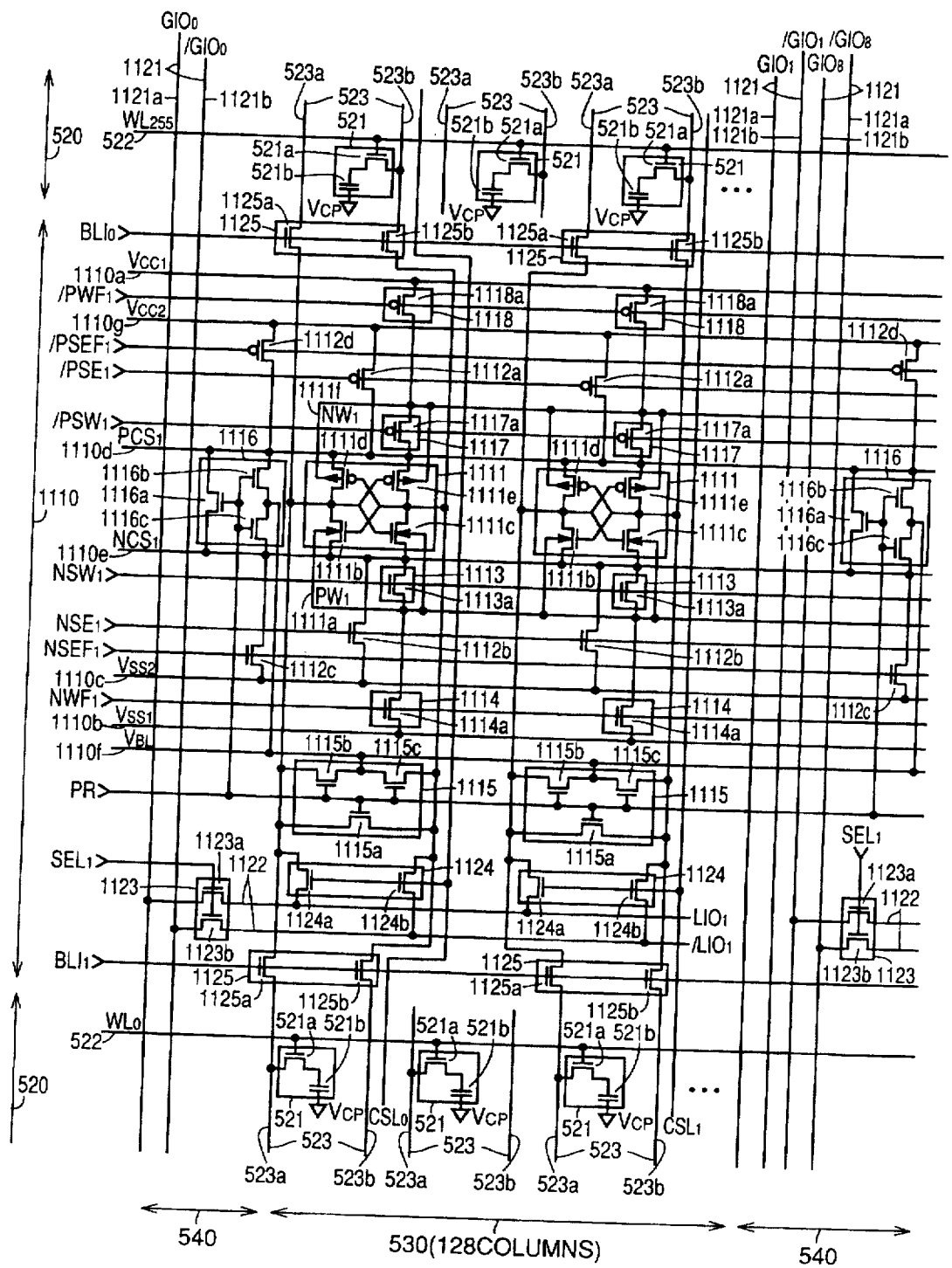
FIG. 10 is a schematic diagram showing a memory cell array and peripheral circuitry of the DRAM shown in FIG. 9.

FIG. 10 is a schematic diagram showing a sense amplifier block 1110 and peripheral circuitry thereof in Embodiment 2. Referring to FIG. 10, power supply potential line 1110g is connected to power supply potential node 1110d. A p channel sense amplifier enable transistor 1112a is connected between p channel common source line 1110d and power supply potential line 1110g. A p channel sense amplifier enable transistor 1112d is connected between p channel common source line 1110d and power supply potential line 1110g, and receives at its gate, first sense signal /PSEFq. The transistor 1112d has smaller ratio W/L between channel width W and channel length L than that of transistor 1112a and it performs initial sensing. A switching circuit 1117 includes a p channel MOS transistor 1117a. The transistor 1117a is connected between p channel common source line 1110d and an n type well 1111f in which transistors 1111d and 1111e of sense amplifier 1111 are formed, and receives at its gate, the source/well short control signal /PSWq. Therefore, switching circuit 1117 is controlled in response to source/well short control signal /PSWq. Switching circuit 1118 includes a p channel MOS transistor 1118a. Transistor 1118a is connected between n type well 1111f and power supply potential line 1110a, and receives at its gate, well potential fixing control signals /PWFq. Therefore, switching circuit 1118 is controlled in response to well potential fixing control signals /PWFq.

This newly added p channel sense amplifier enable transistor 1112d and switching circuits 1117 and 1118 turn on or off in the similar manner as n channel sense amplifier enable transistor 1112c and switching circuits 1113 and 1114. Transistors 1111b and 111c of sense amplifier 1111 included in one sense amplifier block 1110 are formed in one p type well 1111a. Transistors 1111d and 1111e of sense amplifier 1111 included in one sense amplifier block 1110 are formed in one n type well 1111f. Transistors of sense amplifier 1111 included in another sense amplifier block 1110 are formed in another well.

Figure 11:
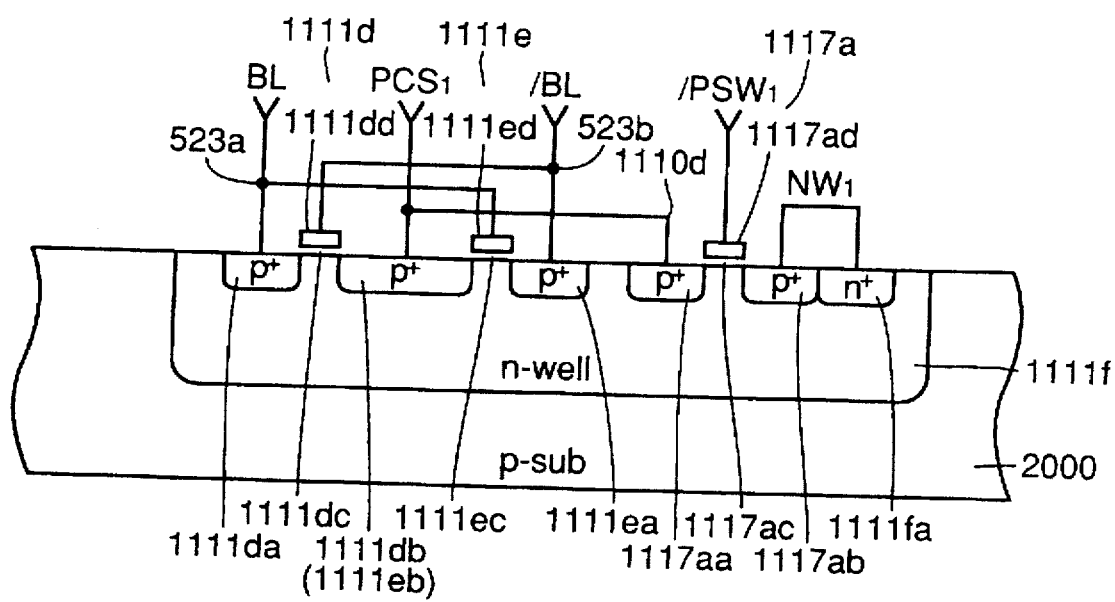
FIG. 11 is a schematic cross section showing a semiconductor substrate on which a p channel sense amplifier of FIG. 10 is formed.

FIG. 11 is a schematic cross section showing a semiconductor substrate in which transistors 1111d, 1111e and 1117a are formed. An n type well 1111f is formed in a p type semiconductor substrate 2000. Referring to FIG. 11, $n^+$ type diffusion region 1111fa is formed in n type well 1111f. Well potential NWq is applied to n type well 1111f through $n^+$ diffusion region 1111fa.

Transistor 1111d in sense amplifier 1111 has source/drain 1111da and 1111db, and a gate 1111dd. One of the source/drain 1111da is formed in n type well 1111f, and constituted by a $p^+$ type diffusion region connected to bit line 523a. The other one of source/drain 1111db is formed in n type well 1111f, and formed by a $p^+$ type diffusion region connected to p channel common source line 1110d. Gate 1111dd is formed on an n type well 1111f between source/drain 1111da and 1111db, with a gate insulating film 1111dc interposed. Transistor 1111e includes source/drain 1111ea and 1111eb, and a gate 1111ed. One of the source/drain 1111ea is formed in n type well 1111f, and formed of a $p^+$ type diffusion region connected to bit line 523b. The other one of the source/drain 1111db is formed in n type well 1111f, and is formed of a $p^+$ type diffusion region connected to p channel common source line 1110d. Gate 1111ed is formed on n type well 1111f between source/drain 1111ea and 1111eb with gate insulating film 1111ec interposed. Transistor 1117a of switching circuit 1117 has source/drain 1117aa and 1117ab, and a gate 1117ad. One of the source/drain 1117aa is formed in n type well 1118f, and formed of a $p^+$ type diffusion region connected to p channel common source line 11110. The other one of the source/drain 1117ab is formed in n type well 1111f, and formed of $p^+$ type diffusion region connected to n type well 1111f through n type diffusion region 1111fa. Gate 1117ad is formed on n type well 1117f between source/drain 1117aa and 1117ab, with gate insulating film 1117ac interposed. Source/well short control signal /PSWq is applied to the gate 1117ad.

The DRAM of Embodiment 2 structured as described above provides the similar effect as Embodiment 1. Further, when sense amplifier 1111 starts sensing operation, n type well 1111f in which p channel MOS transistors 1111d and 1111e of sense amplifier 1111 are formed is conducted to p channel common source line 1110d through switching circuit 1117, and charges stored in n type well 1111f are moved to p channel common source line 1110 so that the potential of n type well 1111f is lower while effectively using charges stored in n type well 1111f. Therefore, power consumption caused by charging/discharging of n type well 1111f can be reduced.

Further, when sense amplifier 1111 starts sensing operation, n type well 1111f in which p channel MOS transistors 1111d and 1111e of sense amplifier 1111 are formed in electrically connected to p channel common source line 1110d, and backgate source voltage of p channel MOS transistors 1111d and 1111e are set to zero. Therefore, the absolute value of the threshold voltage of p channel MOS transistors 1111d and 1111e can be made smaller than when n type well 1111f is fixed at power supply potential $Vcc_1$, and therefore a DRAM allowing high speed sensing operation and low power supply potential can be obtained.

Assume that potential difference in reading generated between bit lines 523a and 523b when the potential WLs of word line 522 becomes greater than junction voltage (about 0.6 V) between drains of p channel MOS transistors 1111d and 1111e of sense amplifier 1111 and n type well 1111f in which these p channel MOS transistors 1111d and 1111e are formed. Even at this time, there is not a forward bias between the n type well 1111f and the drains of p channel MOS transistors 1111d and 1111e as the potential NWq of n type well 1111f has been set to the power supply potential $Vcc_1$ by means of switching circuit 1118 at this time, and therefore charges do not flow to the n type well 1111f from the drain, thus potential difference in reading is not made smaller.

Further, since switching circuits 1117 and 1118 are arranged for every sense amplifier 1111, there is not biasing of potential in n type well 1111f in which p channel MOS transistors 1111d and 1111e of sense amplifier 1111 are formed. Therefore, time necessary for the potential of n type well 1111f to stabilize is not made longer by the resistance of n type well 1111f, and even when n type well 1111f suffers from noise, original potential can be readily recovered. Since sense amplifier 1111 operates stably, controllability of the sense amplifier 1111 can be improved.

Though ground potential $Vss_1$ (0 V) and boosted ground potential $Vss_2$ (0.5 V) are distinguished in Embodiment 2, these may not be distinguished, and only the ground potential $Vss_1$ or $Vss_2$ may be used to provide the same effects.

Further, though power supply potential $Vcc_1$ (3.3 V) and lowered power supply potential $Vcc_2$ (2.8 V) are distinguished in Embodiment 2, similar effects can be obtained by using only the power supply potential $Vcc_1$ or $Vcc_2$.

Though switching circuits 1113, 1114, 1117 and 1118 are provided for every sense amplifier 1111 in Embodiment 2, biasing of potential in p type well 1111a and in n type well 1111f is small even when these are provided for every plural sense amplifiers 1111 (for example, every four sense amplifiers), and controllability of the sense amplifier 1111 can be improved.

[Embodiment 3]

Figure 12:
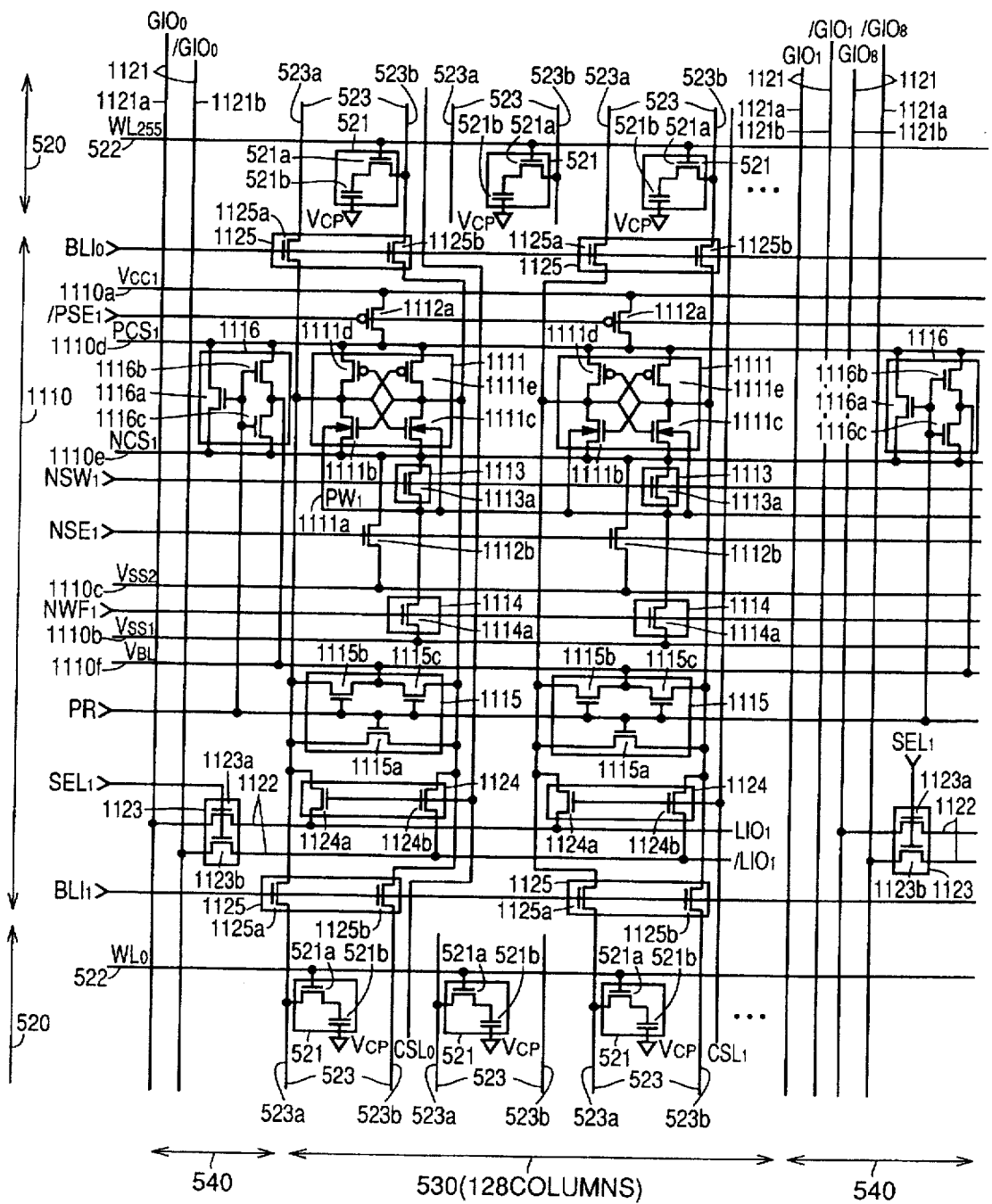
FIG. 12 is a schematic diagram showing a sense amplifier and peripheral circuitry in a DRAM in accordance with Embodiment 3 of the present invention.

A DRAM in accordance with Embodiment 3 of the present invention will be described with reference to FIGS. 12 and 3. The DRAM of Embodiment 3 differs from the DRAM of Embodiment 1 in that block related signal generating circuit 1200 does not provide first sense signal NSEFq, and that the structure of sense amplifier block 1100 of memory cell peripheral circuit group 1100 is different. Like components are denoted by like numerals as in Embodiment 1, and description thereof is not repeated.

FIG. 1 is a schematic diagram showing sense amplifier block 1100 and peripheral circuitry thereof in accordance with Embodiment 3. This embodiment differs from sense amplifier block 1100 of Embodiment 1 shown in FIG. 4 in that, in FIG. 10, the sense amplifier enable transistor 1112c for initial sensing is omitted. This transistor is omitted from the following reason. Namely, when p type well 1111a in which n channel MOS transistors 1111b and 111c of sense amplifier 1111 are formed is connected to n channel common source line 1110e at the time of sensing, charges move from n channel common source line 1110e to p type well 1111a, causing potential NCSq of n channel common source line 1110e to lower. By using this, initial sensing in which n channel common source line 1110e is discharged may be performed, without initial sensing transistor.

Figure 13:
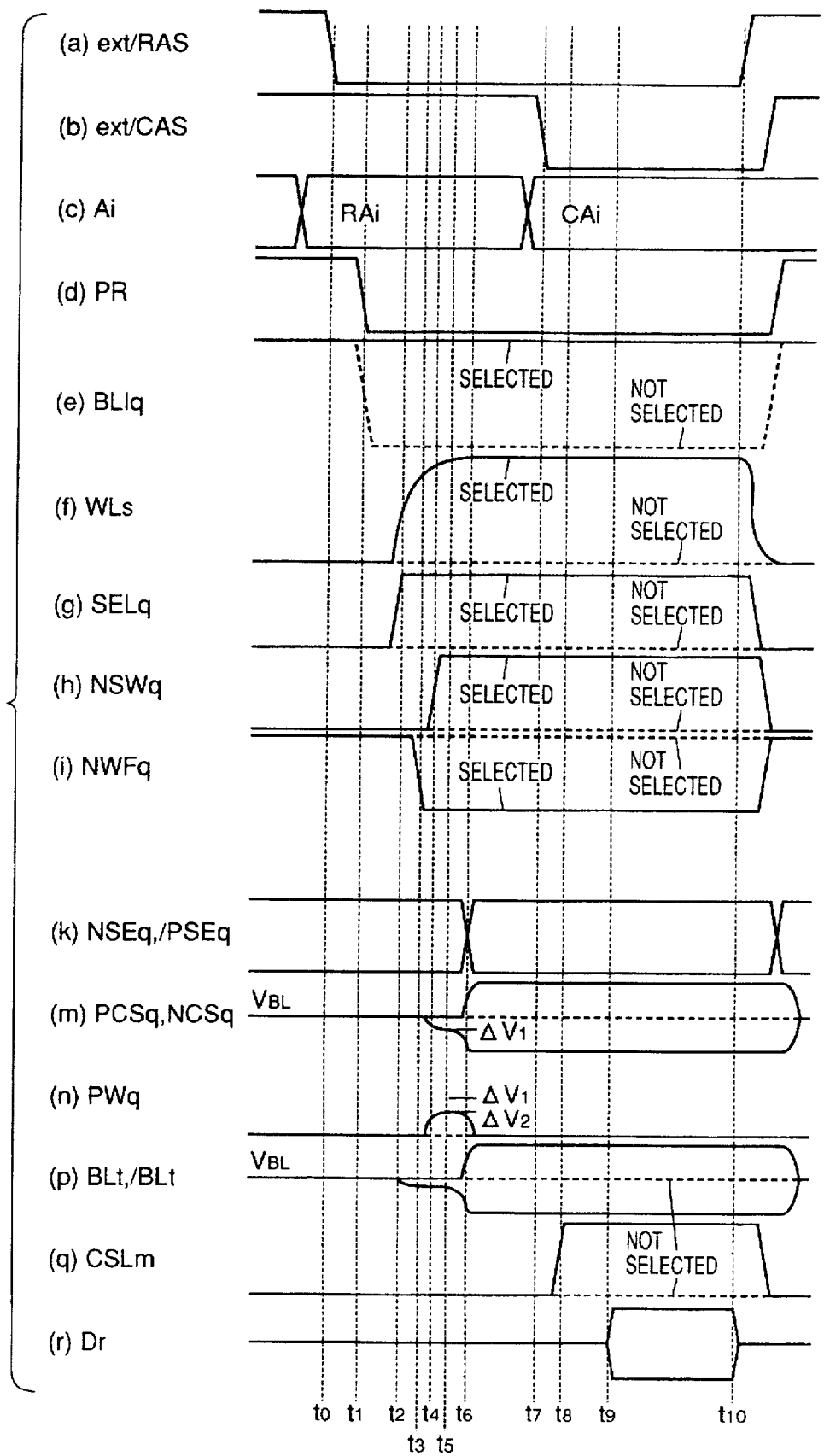
FIG. 13 is a timing chart showing the operation of the DRAM of FIG. 12.

In this Embodiment 3 also, the operation is almost the same as the operation of the DRAM in accordance with Embodiment 1 shown in FIG. 8 except that first sense signal NSEFq is not provided, as shown in FIG. 13, and similar effects as Embodiment 1 can be obtained. Further, since n channel sense amplifier enable transistor for initial sensing is omitted, a DRAM having smaller layout area can be obtained.

Though switching circuits 1113 and 1114 are formed only on the sides of n channel MOS transistors 1111b and 1111c in Embodiment 3, similar switching circuits may be provided only on the side of p channel MOS transistors 1111d and 1111e to provide similar effects.

Further, though ground potential $Vss_1$ (0 V) and ground potential $Vss_2$ (0.5 V) are distinguished in Embodiment 3, these may not be distinguished, and similar effects can be obtained even when only the ground potential $Vss_1$ or $Vss_2$ is used.

Though switching circuits 11113 and 1114 are provided for every sense amplifier 1111 in Embodiment 3, biasing of potential in p well 1111a in which n channel MOS transistors 1111b and 1111c of sense amplifier 1111 are formed is small even when these circuits are provided for every plural sense amplifiers 1111 (for example, every four sense amplifiers), and even at that time, controllability of the sense amplifier 1111 can be improved.

[Embodiment 4]

Figure 14:
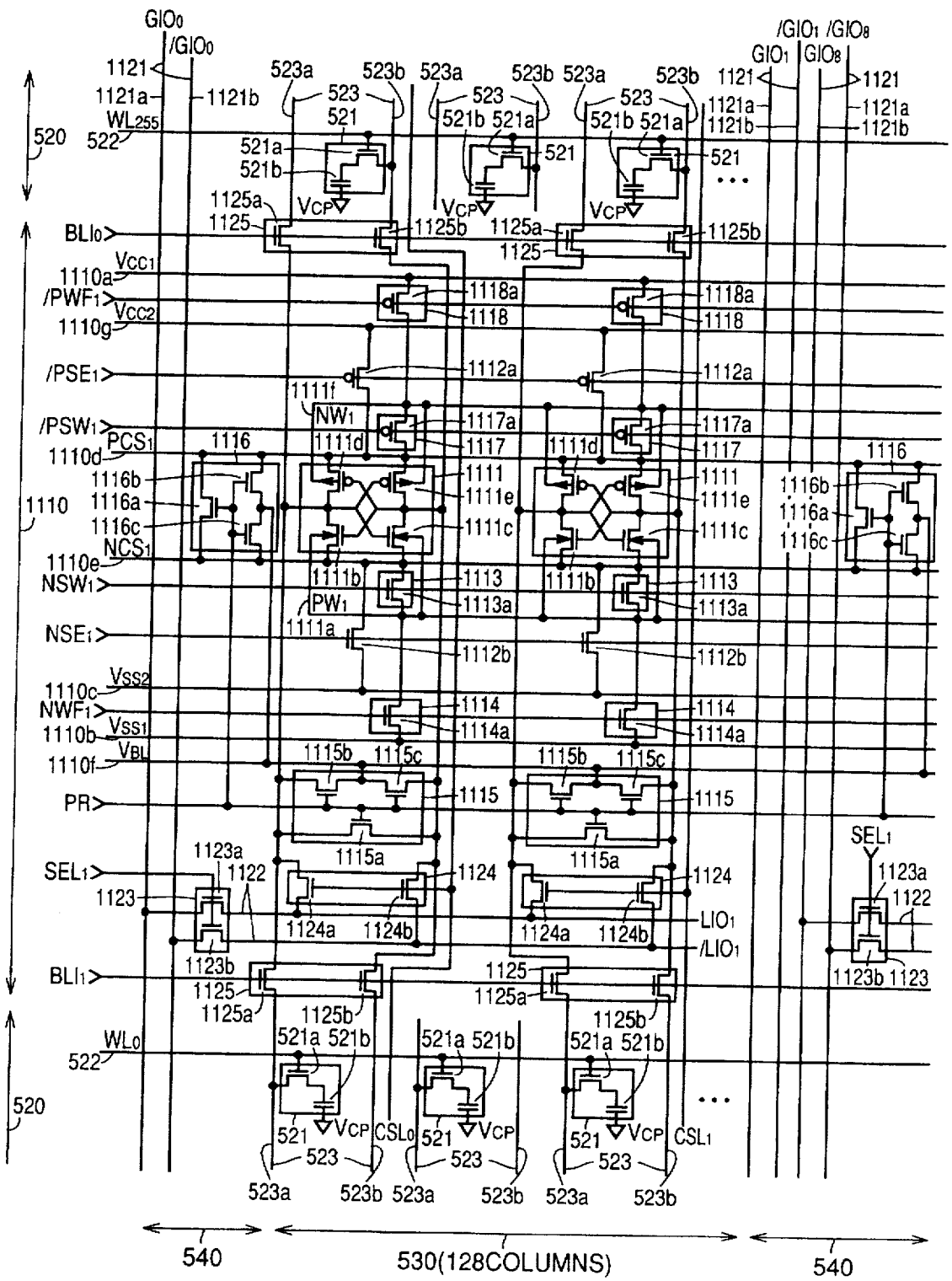
FIGS. 14 and 15 are schematic diagrams showing memory cell array and peripheral circuitry of the DRAM in accordance with Embodiments 4 and 5 of the present invention.

A DRAM in accordance with Embodiment 4 of the present invention will be described with reference to FIG. 14. FIG. 14 is a schematic diagram showing sense amplifier block 1110 and peripheral circuitry thereof in the DRAM in accordance with Embodiment 4. This embodiment differs from the sense amplifier block 1110 of the DRAM of Embodiment 2 shown in FIG. 10 in that from similar technical idea as in Embodiment 3, sense amplifier enable transistors 1112c and 1112d for initial sensing are omitted.

The operation of Embodiment 4 is similar to the operation of the DRAM in accordance with Embodiment 2 except that first sense signals NSEFq and /PSEFq are not provided, and similar effects as Embodiment 2 can be obtained. Further, since n channel and p channel sense amplifier enable transistors for initial sensing are omitted, a DRAM having smaller layout area can be obtained.

Though ground potential $Vss_1$ (0 V) and boosted ground potential $Vss_2$ (0.5 V) are distinguished in Embodiment 4, similar effects can be obtained even when these are not distinguished but only the ground potential $Vss_1$ or $Vss_2$ is used.

Though power supply potential $Vcc_2$ (3.3 V) and lowered power supply potential $Vcc_2$ (2.8 V) are distinguished in Embodiment 4, similar effects can be obtained even when these are not distinguished but only the power supply potential $Vcc_1$ or $Vcc_2$ is used.

Further, though switching circuits 1113, 1114, 1117 and 1118 are provided for every sense amplifier 1111 in Embodiment 4, biasing of potential in p type well 1111a and in n type well 1111f is small even when these are provided for every plural sense amplifiers 1111 (for example, every four sense amplifiers), and even at that time, controllability of the sense amplifier 1111 can be improved.

[Embodiment 5]

A DRAM in accordance With Embodiment 5 of the present invention will be described with reference to FIGS. 15 to 17. The DRAM of Embodiment 5 differs from the DRAM of Embodiment 1 in that well potential control circuit 1210 generating source/well short control signal NSWq and well potential fixing control signal NWFq in block related signal generating circuit 1200 has a different structure, the waveform of well potential fixing control signal NWFq is different, and that sense amplifier block 1110 of memory cell peripheral circuit group 1100 has different structure. In the following, like components are denoted by like numerals as Embodiment 1, and description thereof is not repeated.

Figure 15:
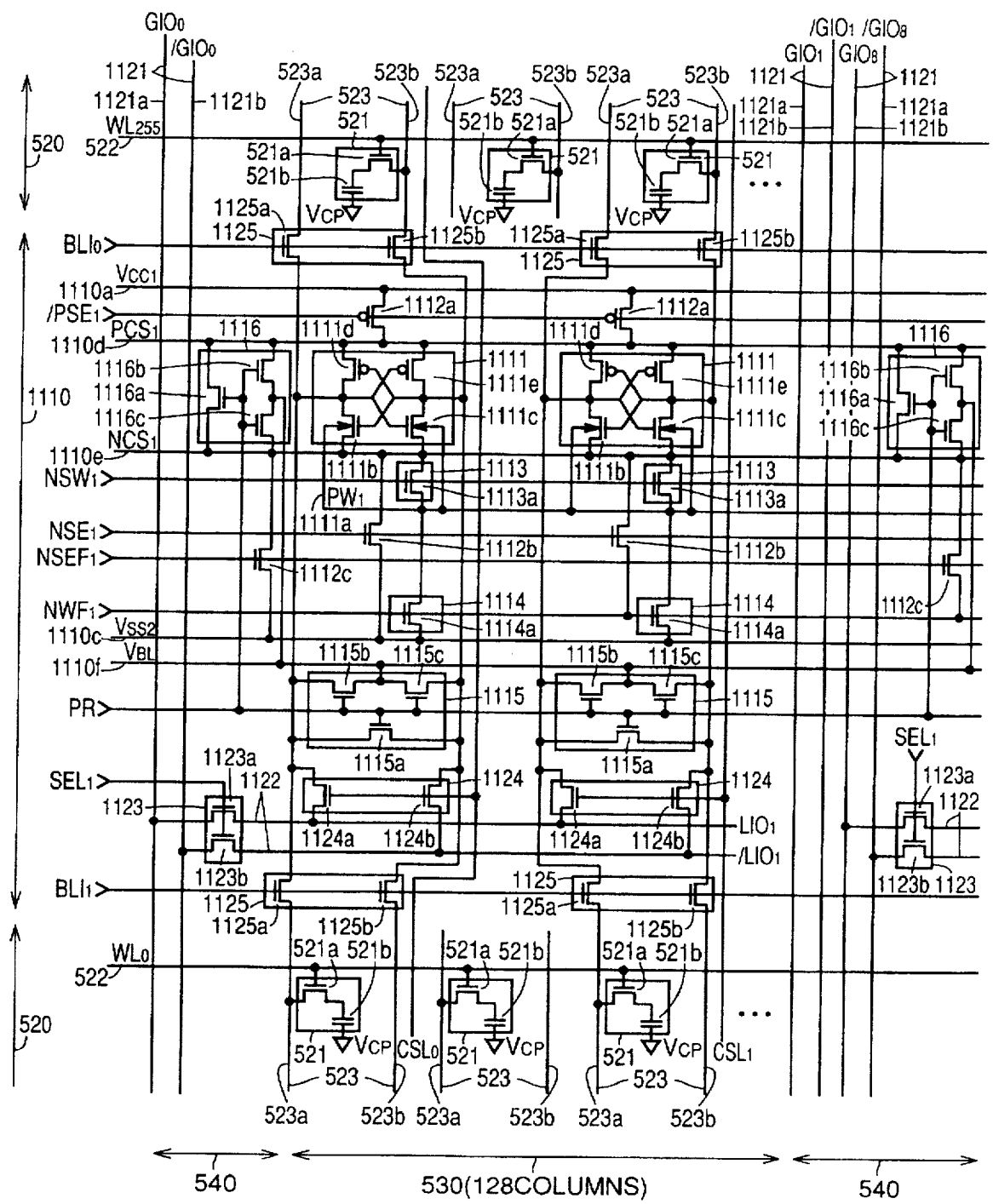
Figure 16:
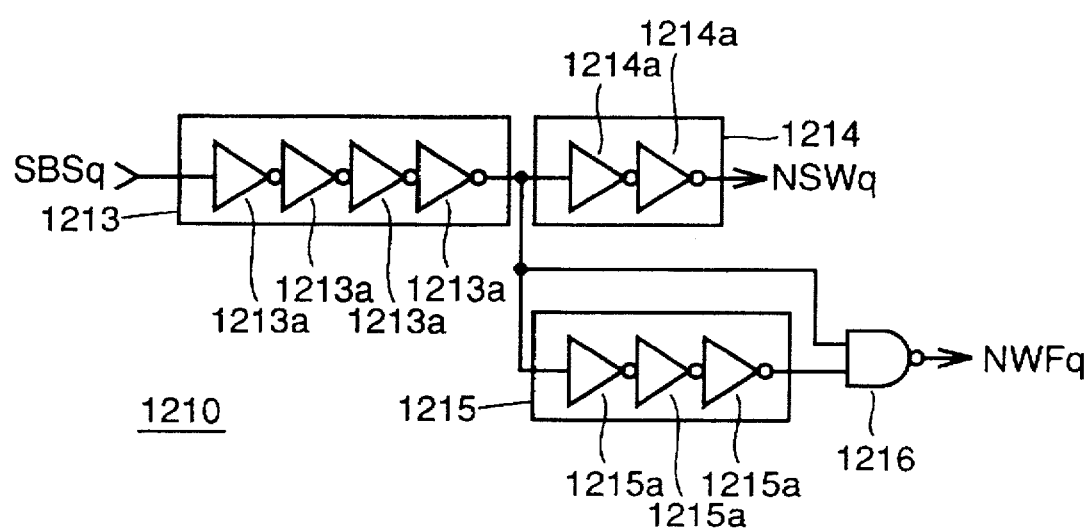
FIG. 16 is a schematic diagram showing a well potential control circuit used in the DRAM of FIG. 15.

FIG. 15 is a schematic diagram showing sense amplifier block 1110 and peripheral circuitry thereof in accordance with Embodiment 5. The embodiment of FIG. 15 differs from sense amplifier block 1110 of Embodiment 1 shown in FIG. 4 in that though ground potentials $Vss_1$ and $Vss_2$ are distinguished in the embodiment of FIG. 4, in the embodiment of FIG. 15, these potentials are not distinguished and only the ground potential $Vss_2$ is used. FIG. 16 is a schematic diagram showing well potential control circuit 1210. Referring to FIG. 16, a delay circuit 1213 receives sense amplifier block selection signal SBSq and provides a delayed signal, and it includes an inverter 1213a. A delay circuit 1214 includes an inverter 1214a, receives the delayed signal from delay circuit 1213, and outputs a source/well short control signal NSWq by delaying the received signal. Inverting and delaying circuit 1215 includes an inverter 1215a, receives delayed signal from delay circuit 1213, and outputs an inverted and delayed signal of the received signal. An NAND circuit 1216 receives the delayed signal from delay circuit 1213 and the inverted and delayed signal from inverting and delaying circuit 1215, and outputs well potential fixing control signal NWFq, which control signal attains to the L level when both of the received signals are at the H level, and attains to H level otherwise.

Since well potential control circuit 1210 is structured in this manner, well potential fixing control signal NWFq attains to the L level in the period from time $t_3$ when the delay signal from delay circuit 1213 rises to the H level to the time $t_{11}$ when the inverted and delayed signal output from inverting and delaying circuit 1215 lowers to the L level, as shown in FIG. 17(i). In Embodiment 1, the potential PWq of p type well 1111a is lowered to the ground potential $Vss_2$ by means of n channel sense amplifier enable transistor 1112b through n channel MOS transistor 1113a in switching circuit 1113. However, there may be a possibility that the time necessary for lowering the potential of p type well 1111a becomes longer because of the resistance in n channel MOS transistor 1113a, so that it cannot follow the lowering of the potential at n channel common source line 1110e. Taking this possibility into consideration, the well potential fixing control signal NWFq is adapted to rise to the H level again at time $t_{11}$ prescribed time period after the time $t_3$ when it falls to the L level, so as to prevent lowering of potential of p type well 1111a through n channel MOS transistor 1114a in switching circuit 1114.

Figure 17:
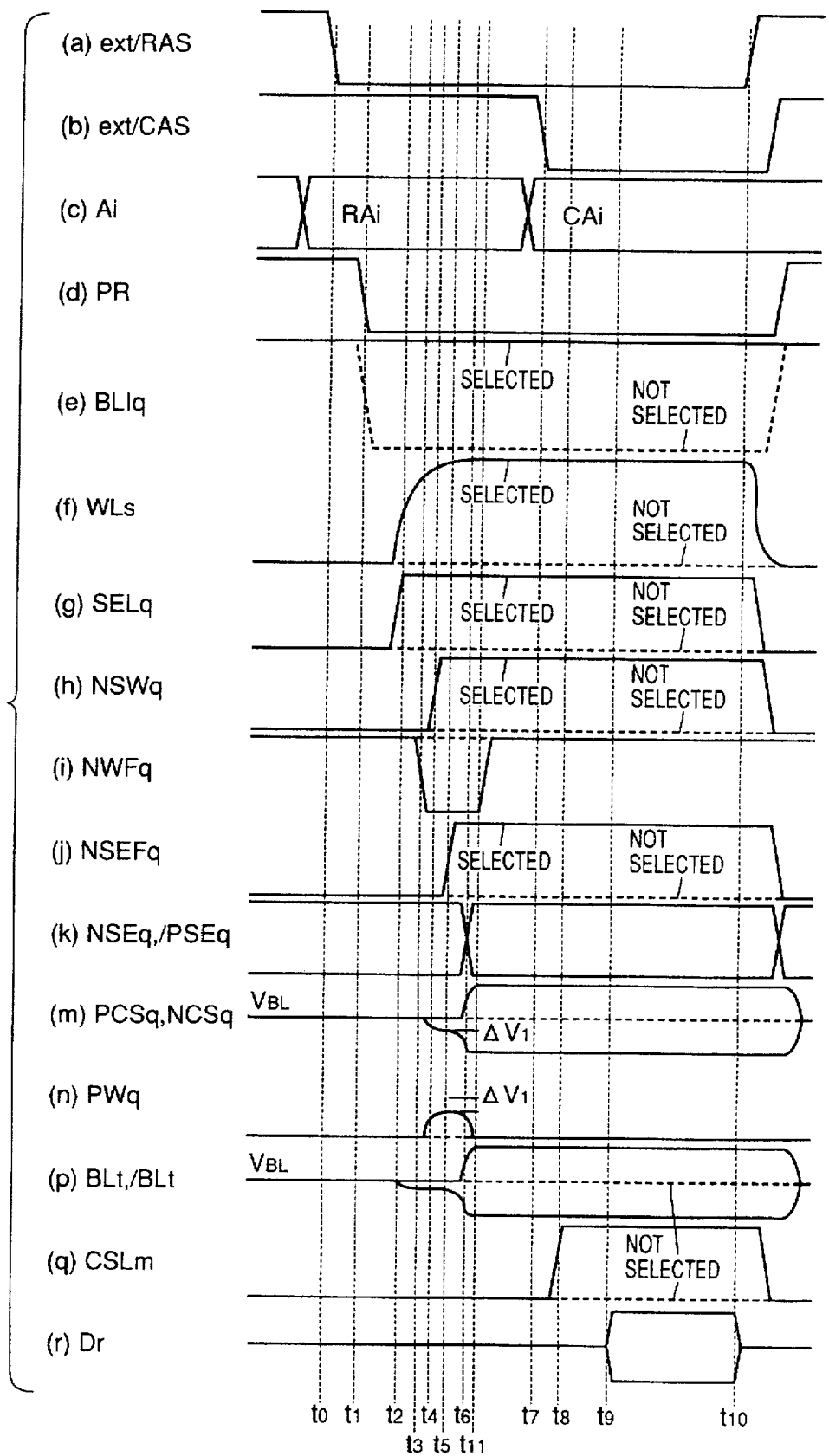
FIG. 17 is a timing chart showing the operation of the DRAM of FIG. 15.

As described above, in Embodiment 5, the timing of well potential fixing control signal NWFq is different as shown in FIG. 17 and the timing of operation of the switching circuit 1114 based thereon is different. However, except these points, the operation is almost the same as that of Embodiment 1, and similar effects as Embodiment 1 can be obtained.

Further, lowering of the potential of p type well 1111a is ensured.

Though switching circuits 1113 and 1114 are provided only on the sides of n channel MOS transistors 1111b and 1111c in Embodiment 5, similar switches may be provided only on the side of p channel MOS transistors 1111d and 1111e, to provide similar effects.

Though switching circuits 1113 and 1114 are provided for every sense amplifier 1111 in Embodiment 5, biasing of potential in p type well 1111a in which n channel MOS transistors 1111b and 1111c are formed is small even when these are provided for every plural sense amplifiers 1111 (for example, every four sense amplifiers), and even at that time, controllability of the sense amplifier 1111 can be improved.

Further, similar to Embodiment 3, n channel sense amplifier enable transistor 1112c for initial sensing may be omitted.

[Embodiment 6]

A DRAM in accordance with Embodiment 6 of the present invention will be described with reference to FIG. 18. The DRAM of Embodiment 6 differs from the DRAM of Embodiment 2 in that, in addition to the differences between the DRAMs of Embodiments 5 and 1, the waveform of the signal /PWFq having inverted logic to well potential fixing control signal NWFq differs. In the following, like reference numerals are allotted to like components as in Embodiments 2 and 5, and detailed description thereof will not be repeated.

Figure 18:
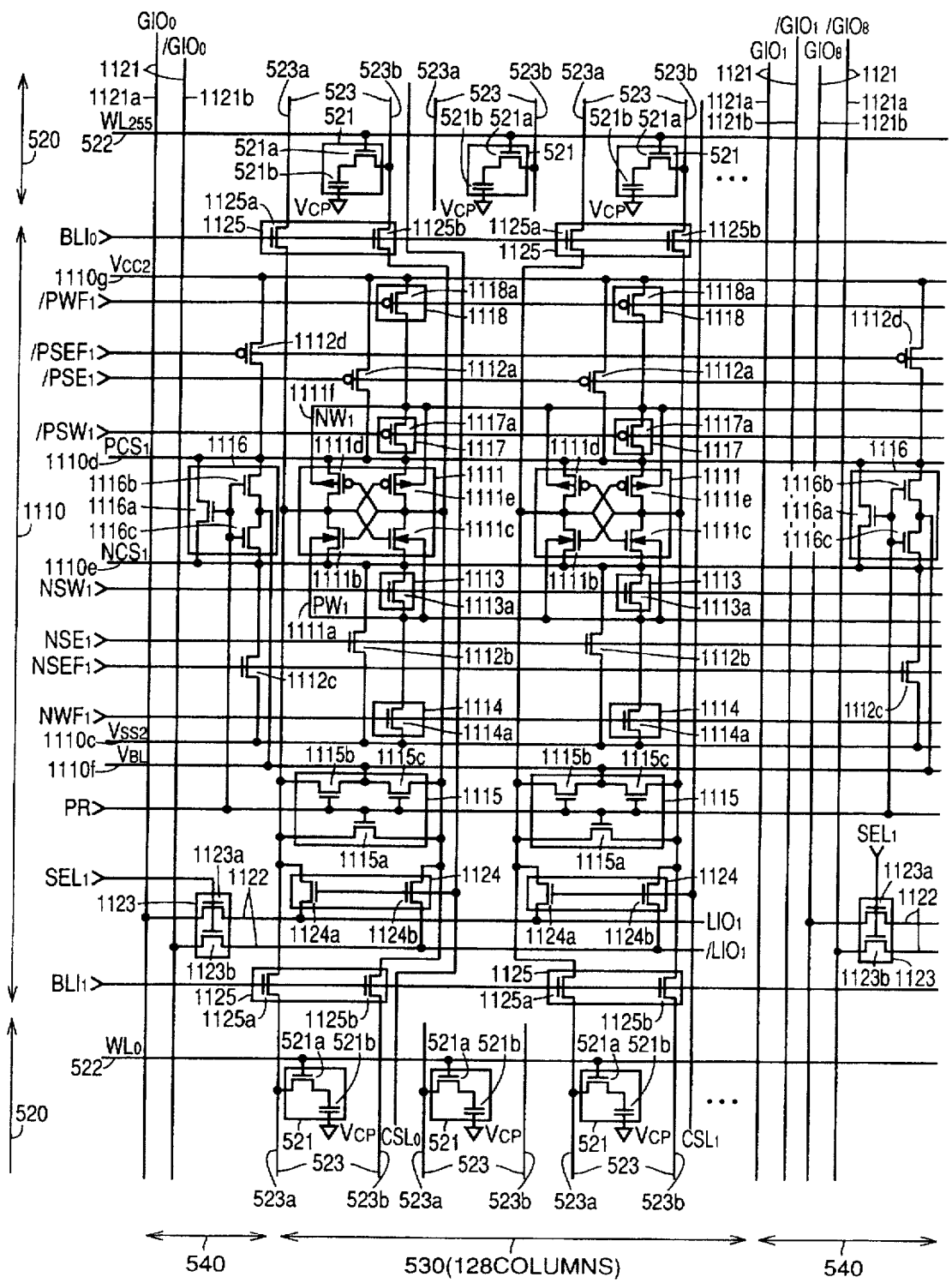
FIGS. 18 to 23 are schematic diagrams showing a memory cell array and a peripheral circuitry in the DRAM in accordance with Embodiments 6 to 11 of the present invention.

FIG. 18 shows sense amplifier block 1110 and peripheral circuitry thereof in accordance with Embodiment 6. The embodiment of FIG. 18 differs from the sense amplifier block 1110 of Embodiment 2 shown in FIG. 10 in that while power supply potentials $Vcc_1$ and $Vcc_2$ and ground potentials $Vss_m$ and $Vss_2$ are distinguished in the embodiment of FIG. 10, these are not distinguished in FIG. 18 and only the power supply potential $Vcc_2$ and ground potential $Vss_2$ are used.

As described above, the timing of well potential fixing control signal NWFq differs in Embodiment 6 also, and the timing of operation of the switching circuit 1114 based thereon is different. Except these points, the operation is almost similar to that of Embodiment 2, and similar effects can be obtained.

Further, lowering of the potential of p type well 1111a and increase of the potential of n type well 1111f are ensured.

In Embodiment 6, switching circuits 1113, 1114, 1117 and 1118 are provided for every sense amplifier 1111. However, biasing of potentials in p type well 1111a in which n channel MOS transistors 1111b and 1111c are formed and in n type well 1111f in which p channel MOS transistors 1111d and 1111e are formed is small even when these are provided for every plural sense amplifiers 1111 (for example, every four amplifiers), and even at that time, controllability of sense amplifier 1111 can be improved.

[Embodiment 7]

Figure 19:
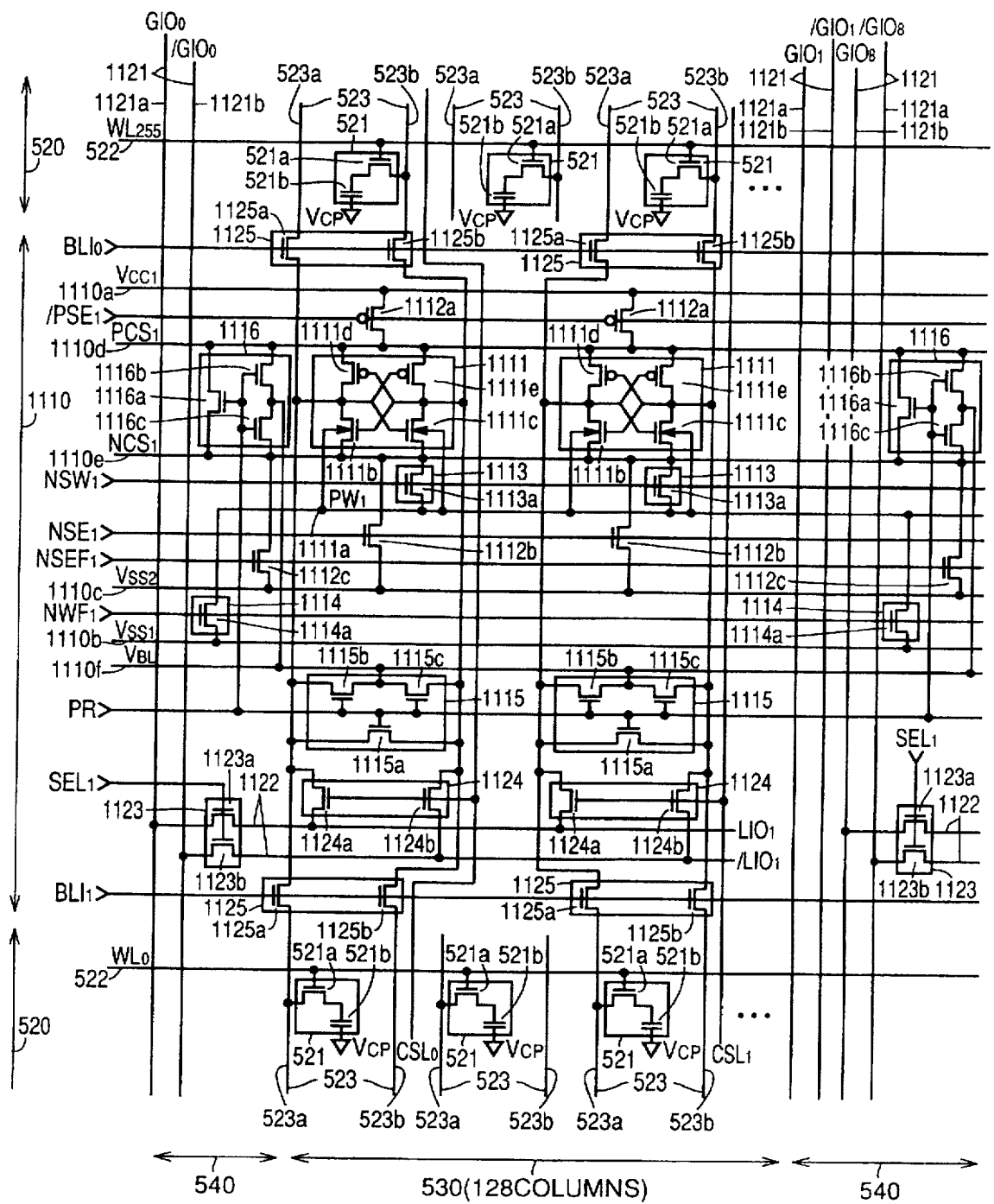

A DRAM in accordance with Embodiment 7 of the present invention will be described with reference to FIG. 19. In the DRAM in accordance with Embodiment 7, switching circuit 1114 of the DRAM in accordance with Embodiment 3 or Embodiment 5 is provided not for every sense amplifier 1111 but for every column block dividing region 540 in which word line shunt region 541 and global I/O line pair 1121 are arranged. In Embodiment 7, specifically, the switching circuit 1114 is provided on an extended part of word line shunt region 541. FIG. 19 is a schematic diagram of sense amplifier block 1110 and peripheral circuitry thereof, showing an example in which switching circuit 1114 of the DRAM of Embodiment 1 is provided for every column block dividing region 540 as a representative. The operation of Embodiment 7 is similar to the operations of Embodiments 1, 3 and 5, and similar effects can be obtained.

Further, switching circuit 1114 is provided not for every sense amplifier 1111 but for every column block dividing region 540, so that the number of elements is reduced and the layout area of the DRAM can be made smaller.

Though switching circuits 1113 and 1114 are provided only on the side of n channel MOS transistors 1111b and 1111c in Embodiment 7, similar switching circuits may be provided only on the side of p channel MOS transistors 1111d and 1111e, and similar effects can be obtained.

Though ground potentials $Vss_1$ (0 V) and $Vss_2$ (0.5 V) are distinguished in Embodiment 7, these potentials may not be distinguished, and even when only the ground potential $Vss_1$ is used or only the ground potential $Vss_2$ is used as in Embodiment 5, similar effects can be obtained.

Though switching circuit 11113 is provided for every sense amplifier 1111 in Embodiment 7, biasing of potential in p type well 1111a is small even when the switch is provided for every plural sense amplifier 1111 (for example, every four sense amplifiers) and controllability of the sense amplifier 1111 can be improved.

[Embodiment 8]

Figure 20:
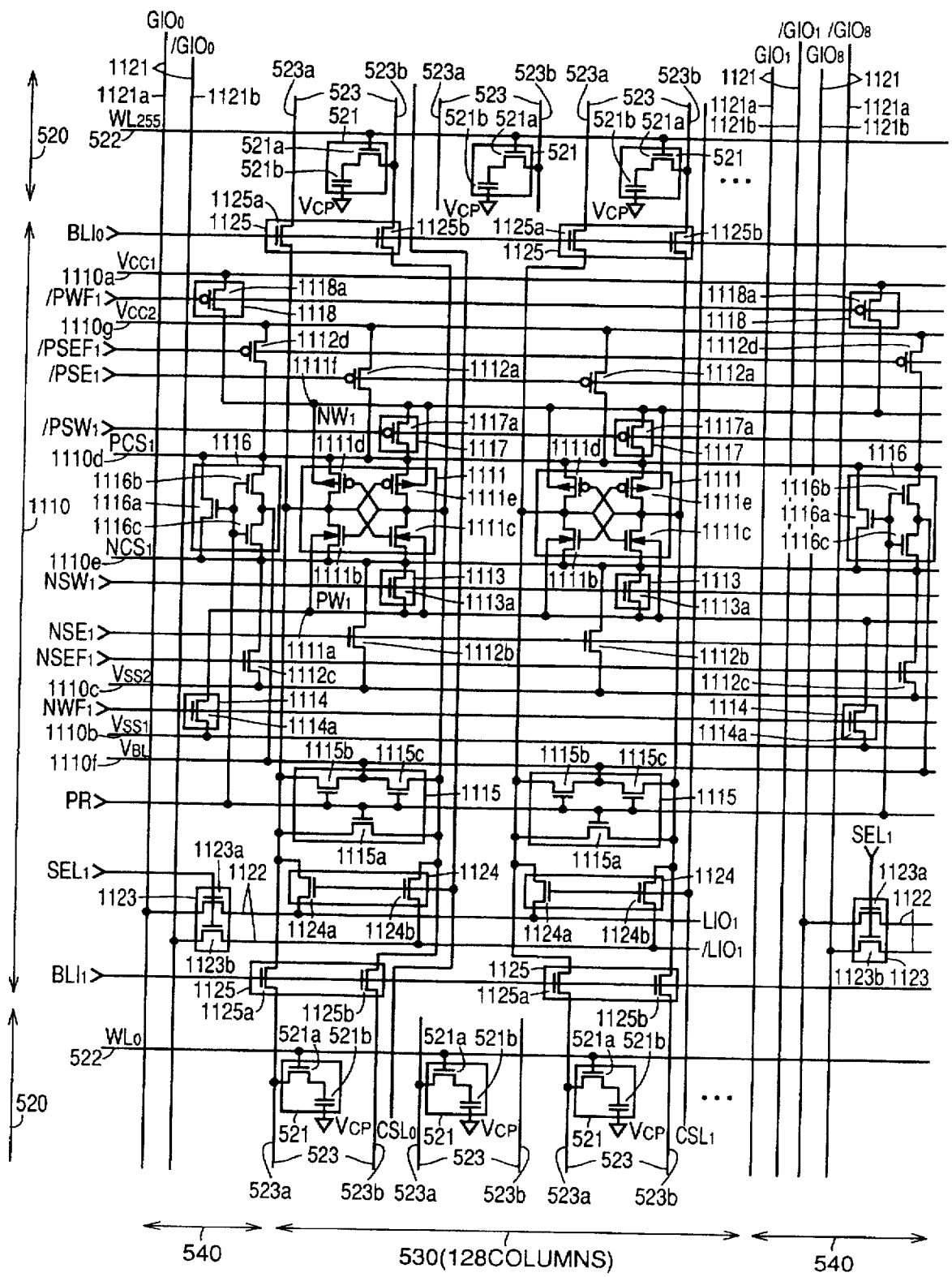

A DRAM in accordance with Embodiment 8 of the present invention will be described with reference to FIG. 20. In the DRAM of Embodiment 6, switching circuits 1114 and 1118 of the DRAM in Embodiment 4 or 6 are provided not for every sense amplifier 1111 but for every column block dividing region 540 in which word line shunt region 541 and global I/O line pair 1121 are arranged, as in Embodiment 7. In Embodiment 8, specifically, switching circuits 1114 and 1118 are provided on an extension of word line shunt region 541. FIG. 20 is a schematic diagram of a sense amplifier block 1110 and peripheral circuitry thereof, showing an example in which switching circuits 1114 and 1118 of the DRAM in accordance with Embodiment 2 are provided for every column block dividing region 540, as a representative. In Embodiment 8 also, operation is similar to those of Embodiments 2, 4 and 6, and similar effects can be obtained.

Since switching circuits 1114 and 1118 are provided not for every sense amplifier 1111 but for every column block dividing region 540, the number of elements can be reduced, and the layout area of the DRAM can be reduced.

Though ground potentials $Vss_1$ (0 V) and $Vss_2$ (0.5 V) are distinguished in Embodiment 8, only the ground potential $Vss_1$ may be used or only the ground potential $Vss_2$ may be used as in Embodiment 6, and similar effects can be obtained.

Though switching circuits 1113 and 1117 are provided for every sense amplifier 1111 in Embodiment 8, biasing in potentials of p type well 1111a and of n type well 1111f is small even when these are provided for every plural sense amplifiers 1111 (for example, every four amplifiers), and controllability of sense amplifier 1111 can be improved.

[Embodiment 9]

Figure 21:
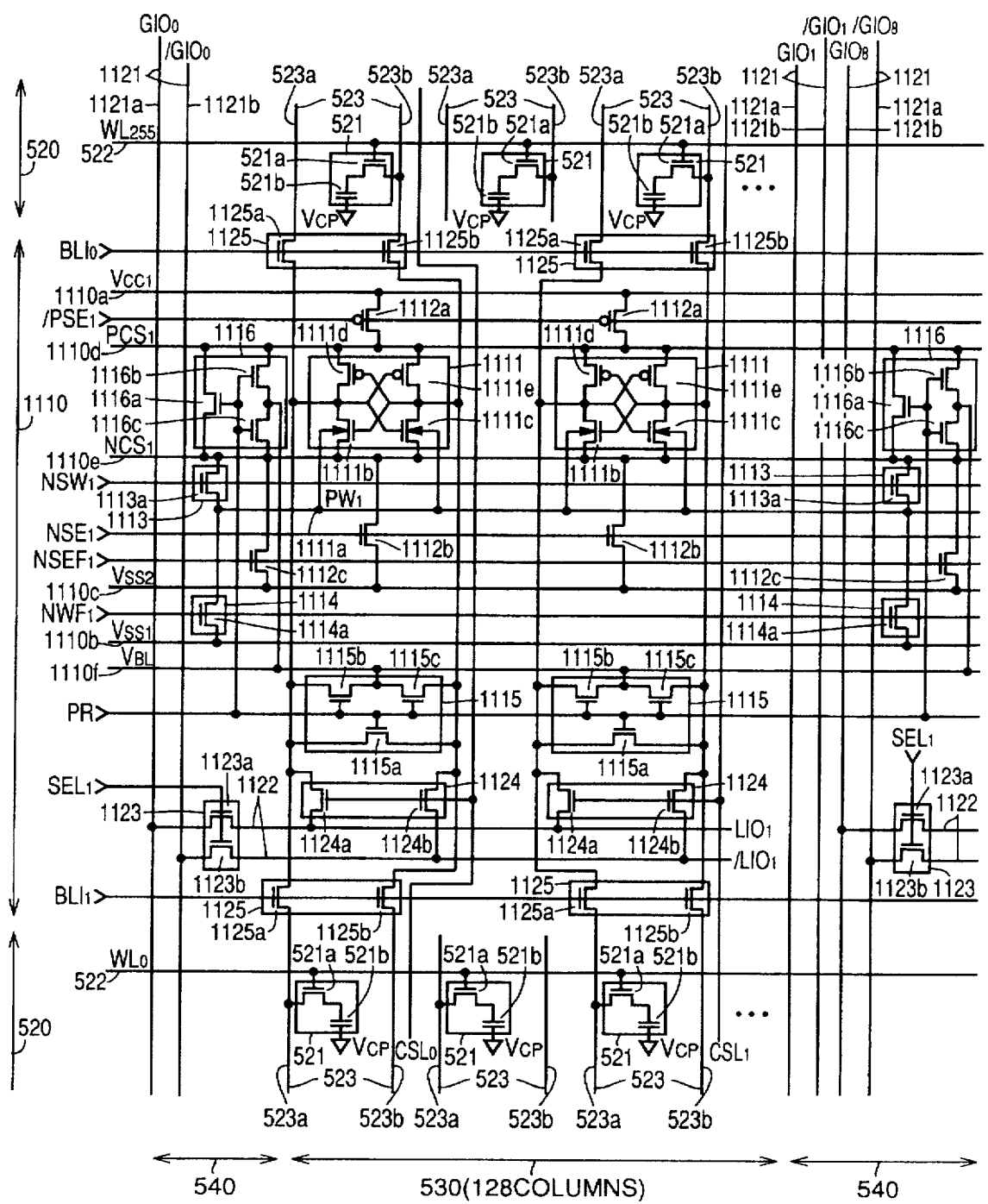

A DRAM in accordance with Embodiment 9 of the present invention will be described. In the DRAM of Embodiment 9, switching circuits 1113 and 1114 of the DRAM in Embodiment 3 or Embodiment 5 are provided not for every sense amplifier 1111 but for every column block dividing region 540 in which word line shunt region 541 and global I/O line pair 1121 are arranged. In Embodiment 9, switching circuits 1113 and 1114 are specifically provided on an extension of word line shunt region 541. FIG. 21 is a schematic diagram of sense amplifier block 1110 and peripheral circuitry thereof, showing an example in which the switching circuits 1113 and 1114 of the DRAM in accordance with Embodiment 1 are provided for every column block dividing region 540 as a representative. The operation of Embodiment 9 is similar to that of Embodiments 1, 3 and 5, and similar effects can be obtained.

Since switching circuits 1113 and 1114 are provided not for every sense amplifier 1111 but for every column block dividing region 540, the number of elements can be reduced and the layout area of the DRAM can be reduced.

Though switching circuits 1113 and 1114 are provided only on the side of n channel MOS transistors 1111b and 1111c in Embodiment 9, similar effects can be obtained even when similar switching circuits are provided only on the side of p channel MOS transistors 1111d and 1111e.

Though ground potentials $Vss_1$ (0 V) and $Vss_2$ (0.5 V) are distinguished in Embodiment 9, these may not be distinguished, and even when only the ground potential $Vss_1$ is used or only the ground potential $Vss_2$ is used as in Embodiment 5, similar effects can be obtained.

[Embodiment 10]

Figure 22:
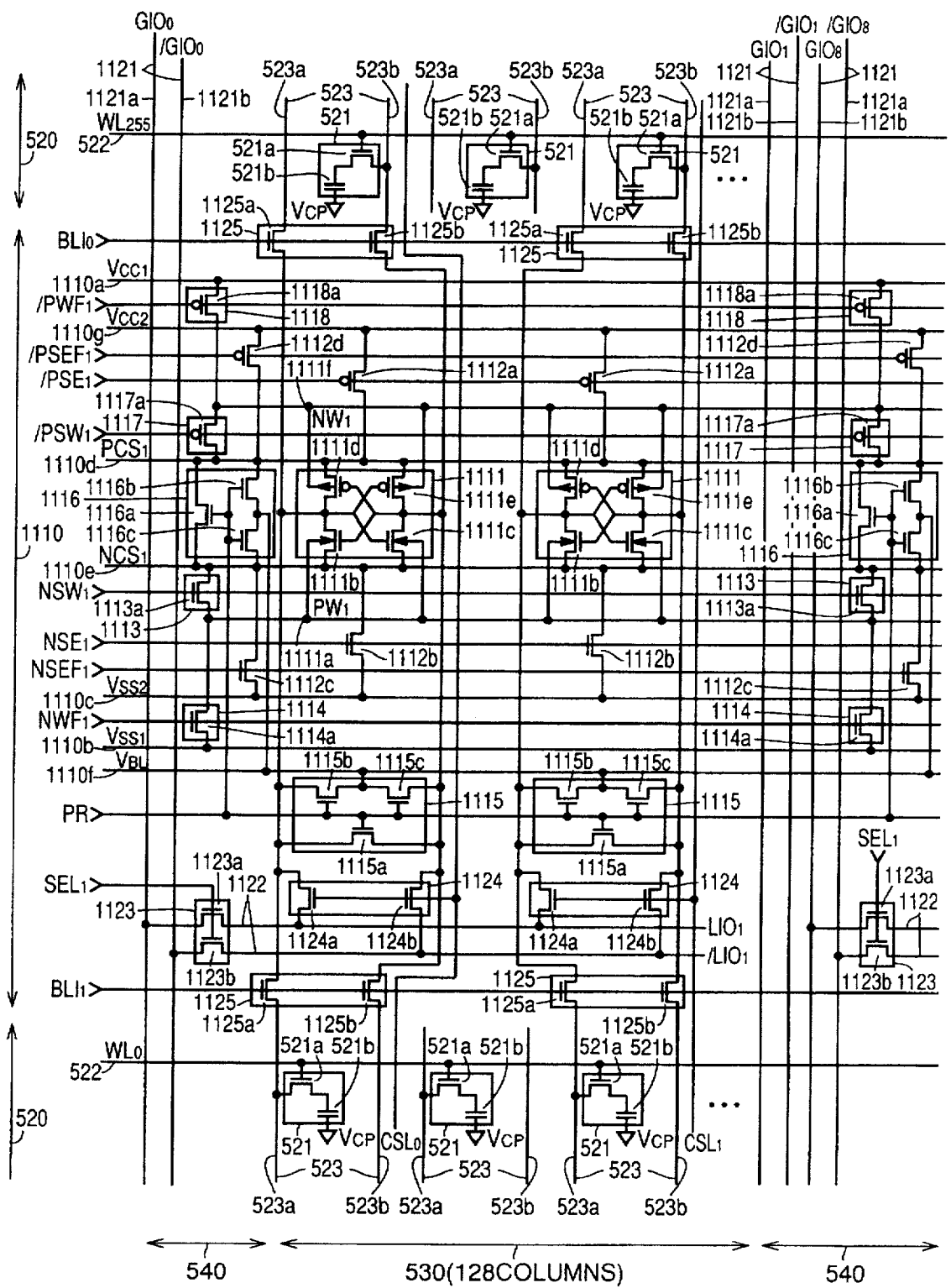

A DRAM in accordance with Embodiment 10 of the present invention will be described with reference to FIG. 22. In the DRAM of Embodiment 10, switching circuits 1113, 1114, 1117 and 1118 of the DRAM of Embodiment 4 or Embodiment 6 are provided not for every sense amplifier 1111 but for every column block dividing region 540 in which word line shunt region 541 and global I/O line pair 1121 are arranged. In this Embodiment 10, switching circuits 1113, 1114, 1117 and 1118 are provided on an extension of word line shunt region 541. Here, FIG. 22 is a schematic diagram of sense amplifier block 1110 and peripheral circuitry thereof, showing an example in which switching circuits 1113, 1114, 1117 and 1118 in the DRAM of Embodiment 2 are provided for every column block dividing region 540 as a representative. The operation of Embodiment 10 is similar to the operations of Embodiments 2, 4 and 6, and similar effects can be obtained.

Further, since switching circuits 1113, 1114, 1117 and 1118 are provided not for every sense amplifier 1111 but for every column block dividing region 540, the number of elements can be reduced and the layout area of the DRAM can be reduced.

Further, though power supply potentials $Vcc_1$ (3.3 V) and $Vcc_2$ (2.8 V) and ground potentials $Vss_1$ (0 V) and $Vss_2$ (0.5 V) are distinguished in Embodiment 10, these may not be distinguished, and even when only the power supply potential $Vcc_1$ and the ground potential $Vss_1$ are used, or only power supply potential $Vcc_2$ and ground potential $Vss_2$ are used as in Embodiment 6, similar effects can be obtained.

[Embodiment 11]

A DRAM in accordance with Embodiment 11 of the present invention will be described with reference to FIGS. 23 and 24. The DRAM of Embodiment 11 differs from the DRAM of Embodiment 3 in the following points. Namely, block related signal generating circuit 1200 does not provide well potential fixing control signal NWFq, and sense amplifier block 1110 in memory cell peripheral circuit group 1100 has a different structure. In the following, like reference characters denote like components as Embodiment 3, and detailed description will not be repeated.

Figure 23:
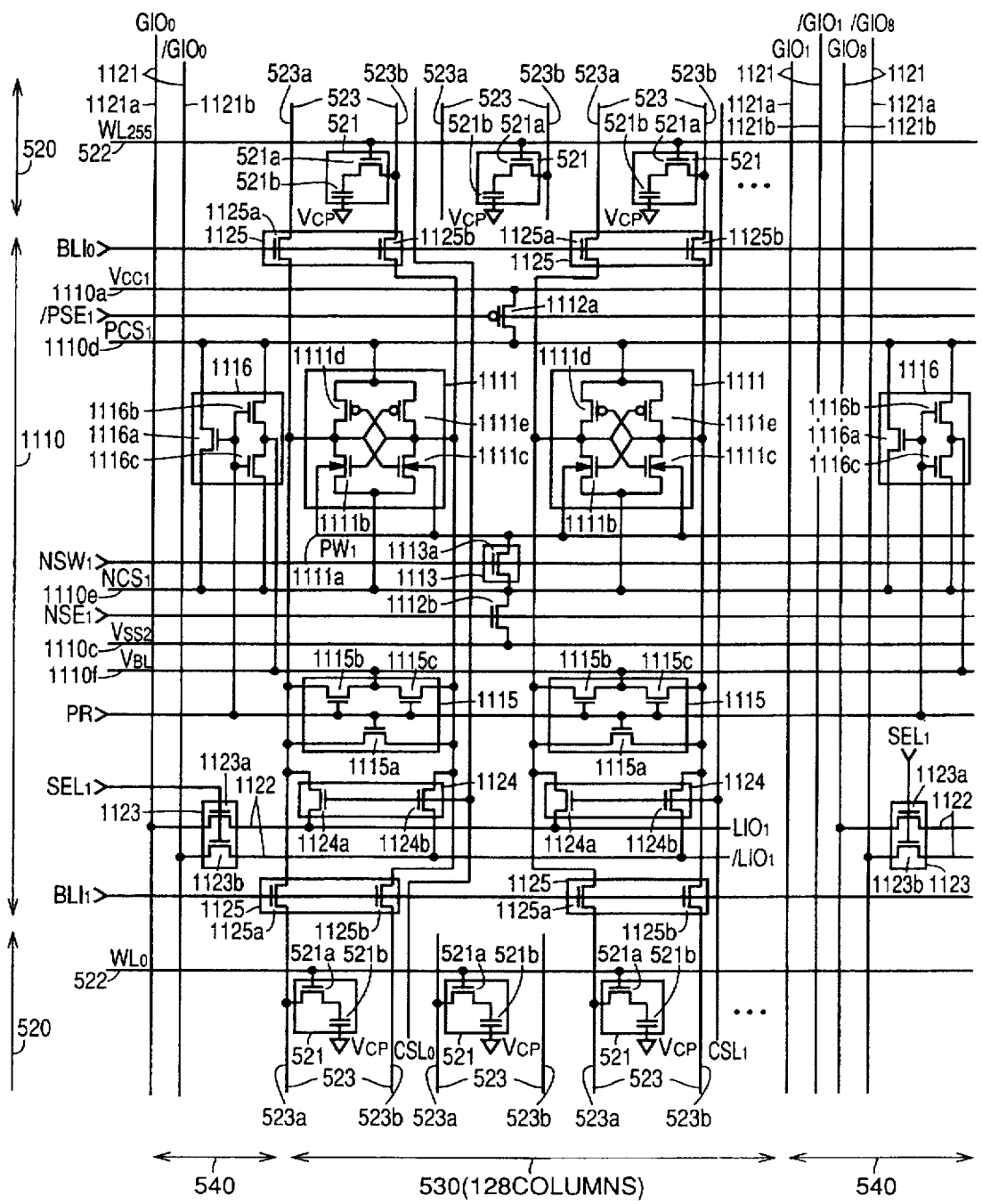

FIG. 23 shows sense amplifier block 1110 and peripheral circuitry thereof in the DRAM in accordance with Embodiment 11. Referring to FIG. 23, this embodiment differs from sense amplifier block 1110 of the DRAM in accordance with Embodiment 3 shown in FIG. 12 in the following points. First, switching circuit 1114 is omitted, and accordingly, ground potential line 1110b is also omitted. The switching circuit is omitted from the following reason. In Embodiment 3, row address strobe signal ext/RAS rises to the H level at time $t_{10}$ as shown in FIG. 13, well potential fixing control signal NWFq rises accordingly, so that p type well 1111a is connected to ground potential line 1110b. Therefore, when potential NCSq of n channel common source line 1110e rises from the ground potential $Vss_2$ to $V_{BL}$, the positive charges are generated in p type well 1111a by coupling of pn junction capacitance between p type well 1111a and source/drain 1113aa of n channel MOS transistor 1113a and source/drain 1111bb of n channel MOS transistor 1111b. The generated charges are discharged through switching circuit 1114 to the ground potential 1110b. Hence, the switching circuit is omitted so as to reduce power consumption.

Further, Embodiment 11 differs from Embodiment 3 in that switching circuit 1113, p channel sense amplifier enable transistor 1112a and n channel sense amplifier enable transistor 1112b are provided not for every sense amplifier 1111 but for every other sense amplifier 1111.

Figure 24:
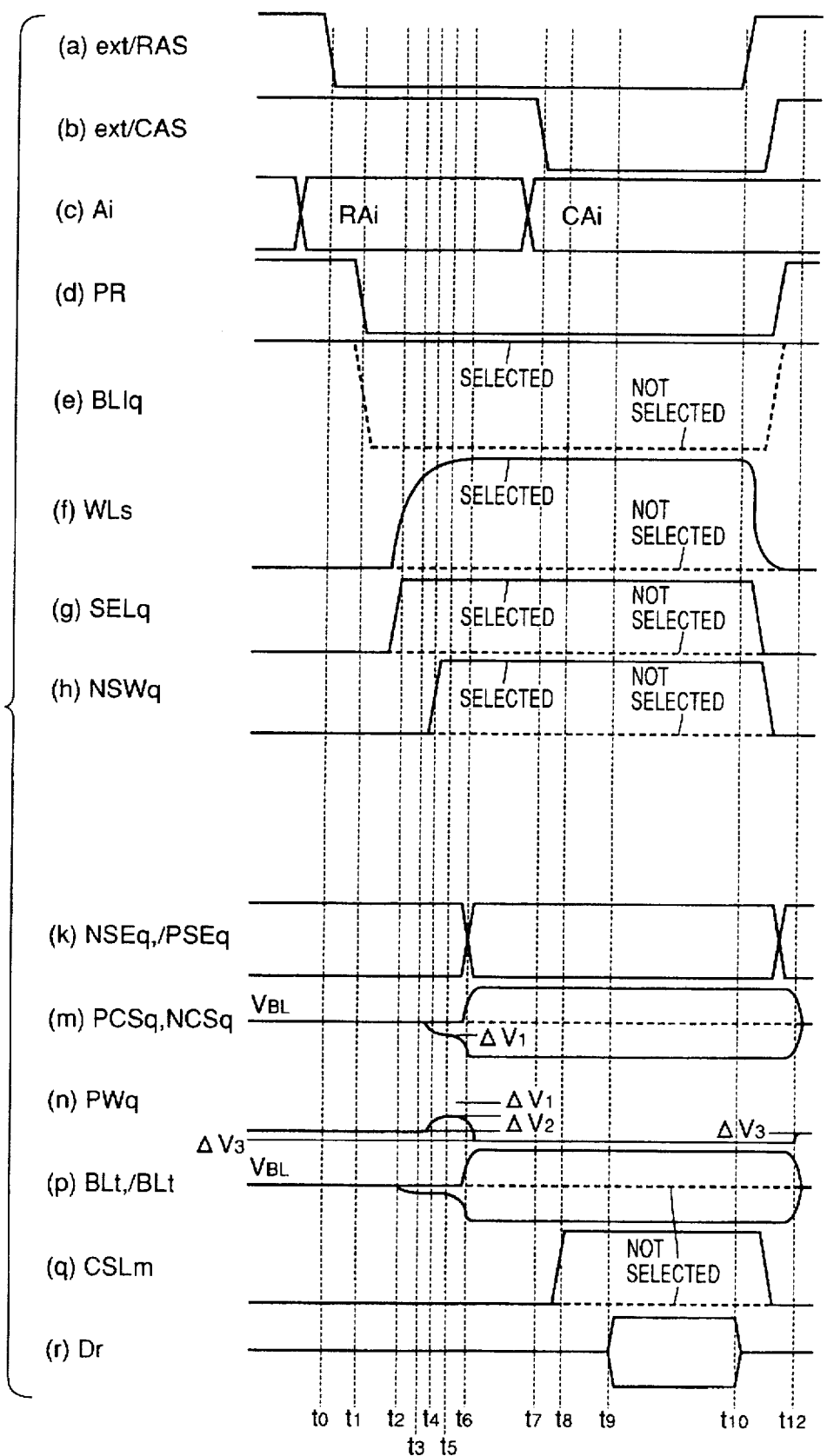
FIG. 24 is a timing chart showing the operation of the DRAM of FIG. 23.

FIG. 24 is a timing chart showing the operation of the DRAM in accordance with Embodiment 11. If differs from the timing chart of FIG. 13 showing the operation of the DRAM in accordance with Embodiment 3 in that the well potential fixing control signal NWFq is not provided, and that even when potential PWq of p type well 1111a rises by $\Delta V_3$ because of junction capacitance in response to the change of potential of n channel common source line NCSq from the ground potential $Vss_2$ to $V_{BL}$ at time $t_{12}$, it is not fixed to ground potential $Vss_1$ or $Vss_2$. Except these points, this embodiment provides almost similar effects to Embodiment 3 shown in FIG. 13. Further, since the switching circuit 1114 is omitted, a DRAM having small layout area can be obtained.

Further, p channel sense amplifier enable transistor 1112a, n channel sense amplifier enable transistor 1112b and switching circuit 1113 are provided not for every sense amplifier 1111 but for every other sense amplifiers 1111. A DRAM having smaller layout area can be obtained.

Though switching circuit 1113 is provided for every two sense amplifier 1111 in Embodiment 11, it may be provided for every four sense amplifiers 1111, or it may be provided for every column block dividing region 540 as in Embodiment 9 shown in FIG. 21.

Though switching circuit 1113 is provided only on the side of n channel MOS transistors 1111b and 1111c in Embodiment 11, similar switching circuit may be provided only on the side of p channel MOS transistor 1111d and 1111e to provide the same effect.

[Embodiment 12]

Figure 25:
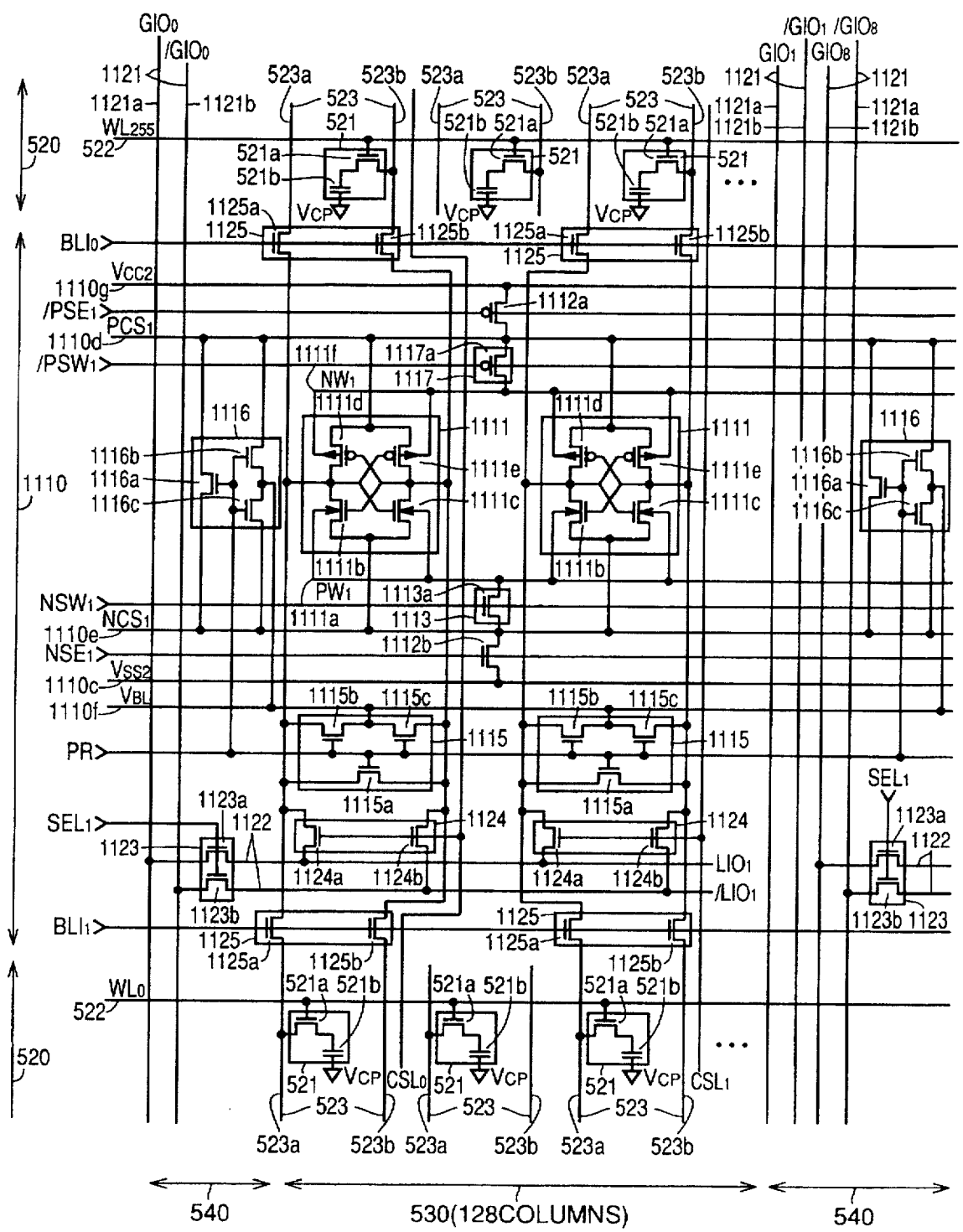
FIGS. 25 to 31 are schematic diagrams showing a memory cell array and a peripheral circuitry in the DRAM in accordance with Embodiments 12 to 18, respectively, of the present invention.

A DRAM in accordance with Embodiment 12 of the present invention will be described with reference to FIG. 25. FIG. 25 is a schematic diagram showing sense amplifier 1110 and peripheral circuitry thereof in the DRAM of Embodiment 12. This embodiment differs from sense amplifier block 1110 of the DRAM in accordance with Embodiment 4 shown in FIG. 14 in that switching circuits 1114 and 1118 are omitted from the same technical idea as in Embodiment 11, and that ground potential line 1110b and power supply potential line 1110a are omitted accordingly.

The operation of Embodiment 12 is almost similar to the operation of the DRAM in accordance with Embodiment 4, except that well potential fixing control signal NWFq and well potential fixing control signal /PWFq are not provided. Further, since switching circuits 1114 and 1118 are omitted, a DRAM having small layout area can be obtained.

In Embodiment 12, switching circuits 1113 and 1118 are provided for every two sense amplifiers 1111. However, it may be provided for every four sense amplifiers 1111, or it may be provided for every column block dividing region 540 as in Embodiment 10 shown in FIG. 22.

[Embodiment 13]

Figure 26:
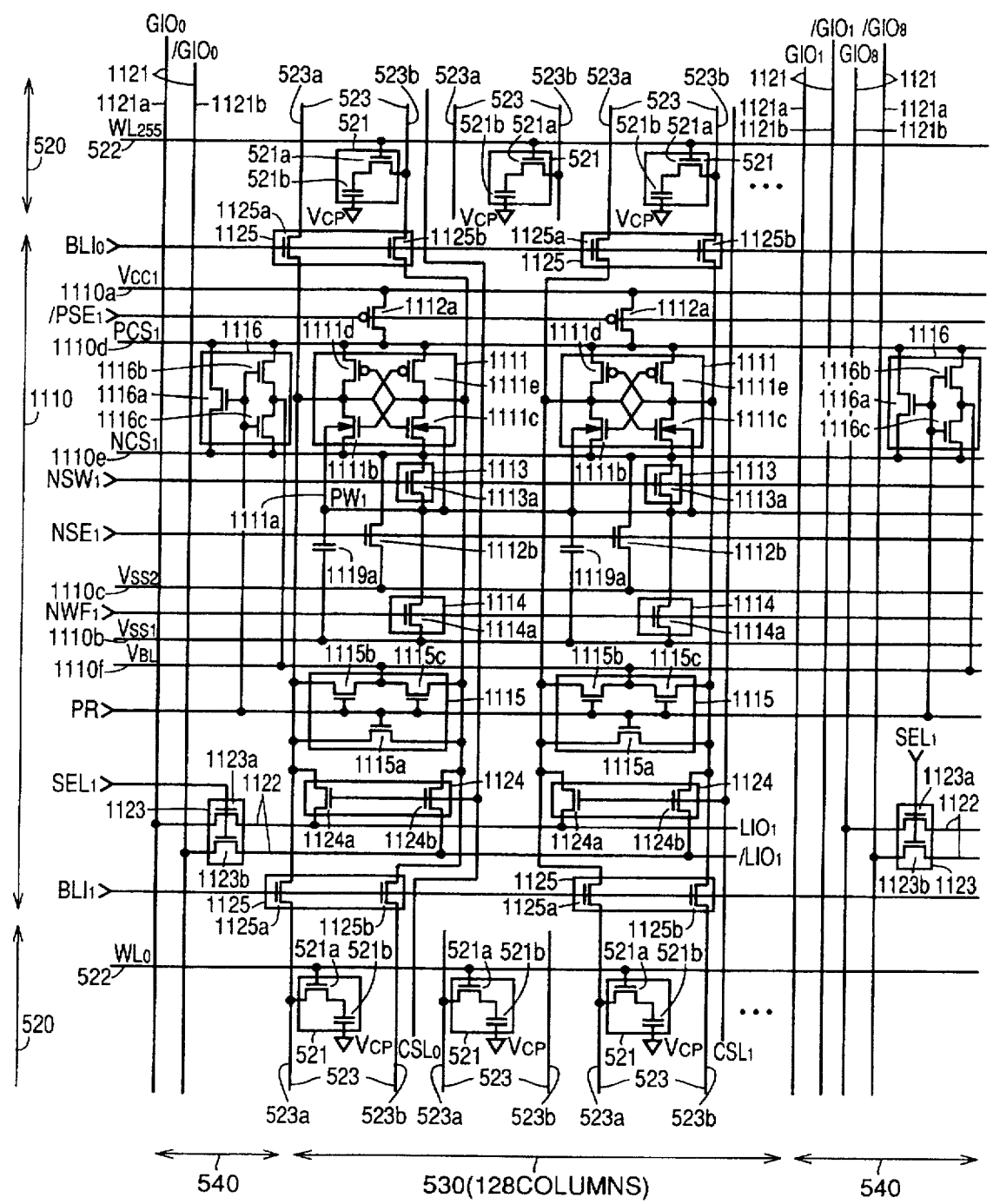

A DRAM in accordance with Embodiment 13 of the present invention will be described with reference to FIG. 26. The DRAM in accordance with Embodiment 13 differs from the DRAM of Embodiment 3 or Embodiment 11 in that a capacitor 1119a for adjustment is intentionally connected to p type well 1111a, in which n channel MOS transistors 1111b and 1111c of sense amplifier 1111 are formed in the DRAM of Embodiment 3 or Embodiment 11. FIG. 26 is a schematic diagram of a sense amplifier block 1110 and peripheral circuitry thereof, showing an example in which capacitor 1119a is connected to p type 1111a in the DRAM of Embodiment 3, as a representative. The operation of Embodiment 13 is similar to the operation of Embodiment 3 shown in FIG. 13 or the operation of Embodiment 11 shown in FIG. 24, and similar effects can be obtained.

Here, the amount of changes $\Delta V_1$ and $\Delta V_2$ of the potential NCSq of n channel common source line 1110e and of potential PWq of p type well 1111a in which n channel MOS transistors 1111b and 1111c of sense amplifier 1111 are formed, shown in (m) and (n) of FIG. 13 or FIG. 24 are represented by the following equations, where $C_{NCS}$ represents combined capacitances of parasitic capacitance incidental to n channel common source line 1110e and capacitance of the intentionally connected capacitor, represents combined capacitance of parasitic capacitance incidental to p type well 1111a and of the capacitor intentionally connected, and $V_0$ represents potential of p type well 1111a before n channel common source line 1110e is connected to p type well 1111a:

$$\Delta V_1 = (V_{BL} - V_0) C_{PW} / (C_{NCS} + C_{PW}) \quad (1)$$

$$\Delta V_2 = (V_{BL} - V_0) C_{NCS} / (C_{NCS} + C_{PW}) \quad (2)$$

Here, in order to perform initial sensing by the lowering of potential NCSq of n channel common source line 110e, a condition that $\Delta V1$ is greater than the threshold voltage of n channel MOS transistors 1111b and 1111c of sense amplifier 1111 must be satisfied. Therefore, when this condition is satisfied simply by the parasitic resistances, it is not necessary to intentionally connect a capacitor as in Embodiment 3 or Embodiment 11. However, if this condition is not satisfied, capacitor 1119a is connected as in Embodiment 13. By doing so, similar effects can be obtained in Embodiment 13, as in Embodiment 3 or Embodiment 11.

Though switching circuit 1113 (and 1114) and capacitor 1119a are formed only on the side of n channel MOS transistors 1111b and 1111c of sense amplifier 1111 in Embodiment 13, similar switching circuit and the capacitor may be provided only on the side of p channel MOS transistors 1111d and 1111e, and similar effects can be obtained. Though in Embodiment 13, ground potentials $Vss_1$ (0 V) and $Vss_2$ (0.5 V) are distinguished, these may not be distinguished, and even when only the ground potential $Vss_1$ or $Vss_2$ is used, similar effects can be obtained. Though capacitor 1119a is provided for every sense amplifier 1111 in Embodiment 13, it may be formed for every plural sense amplifier 1111 (for example, every four sense amplifier), or it may be formed on column block dividing region 540, especially on an extension of shunt region 541 of the word line.

[Embodiment 14]

Figure 27:
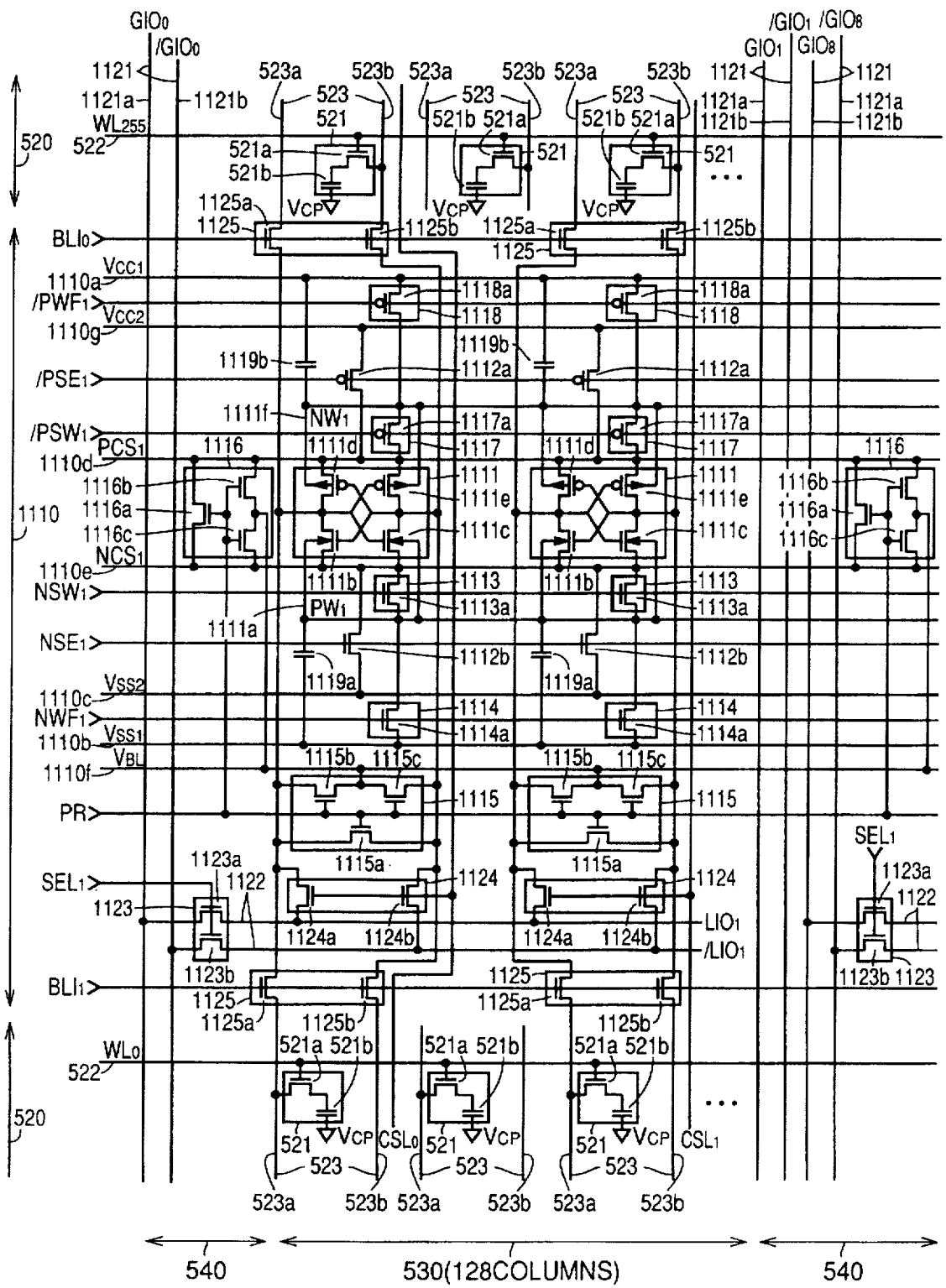

A DRAM in accordance with Embodiment 14 of the present invention will be described with reference to FIG. 27. The DRAM of Embodiment 14 differs from the DRAM of Embodiment 4 or Embodiment 12 in that capacitors 1119a and 1119b for adjustment are intentionally connected to n type well 1111f and p type well 1111a in which n channel MOS transistors 1111b and 1111c of sense amplifier 1111 are formed in the DRAM of Embodiment 4 or Embodiment 12, based on the same technical idea as in Embodiment 13. FIG. 27 is a schematic diagram of a sense amplifier block 1110 and peripheral circuitry thereof, showing an example in which capacitors 1119a and 1119b are connected to p type well 1111a and n type well 1111f in the DRAM of Embodiment 4, as a representative.

The operation of Embodiment 14 is similar to the operation of Embodiment 4 or Embodiment 12, and similar effects can be obtained.

Though capacitors 1119a and 1119b are provided for every sense amplifier 1111 in Embodiment 14, they may be provided for every plural sense amplifiers 1111 (for example, every four sense amplifiers), or they may be provided on the column block dividing region 540, specifically on an extension of shunt region 541 of the word line.

[Embodiment 15]

Figure 28:
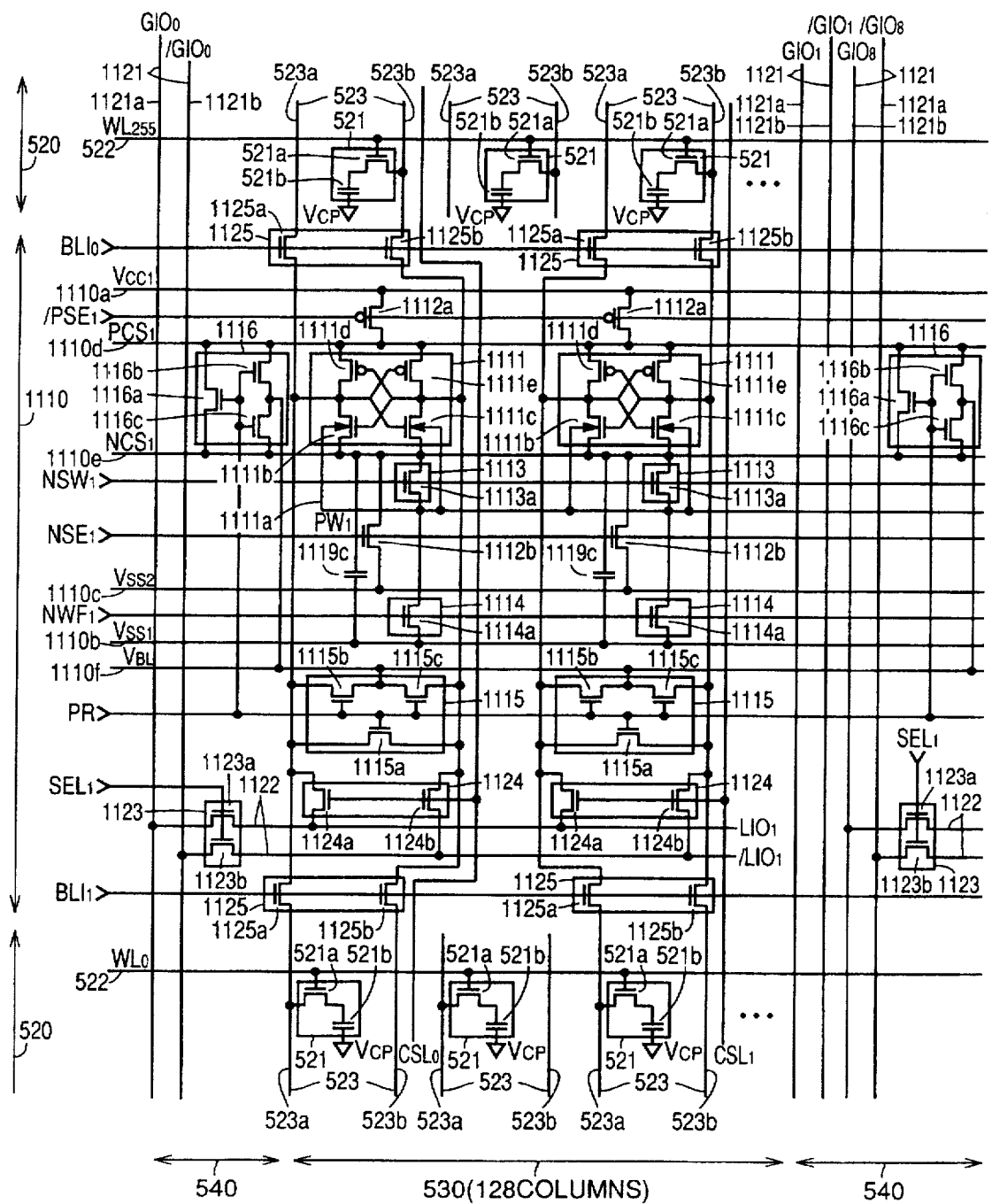

A DRAM in accordance with Embodiment 15 of the present invention will be described with reference to FIG. 28. The DRAM of Embodiment 15 differs from the DRAM of Embodiment 3 or Embodiment 11 in that a capacitor 1119c for adjustment is intentionally connected to n channel common source line 1111e of the DRAM of Embodiment 3 or Embodiment 11. FIG. 28 is a schematic diagram of a sense amplifier block 1110 and peripheral circuitry thereof, showing an example in which capacitor 1119c is connected to n channel common source line 1110e of the DRAM in accordance with Embodiment 3. The operation of Embodiment 15 is similar to the operation of Embodiment 3 shown in FIG. 13 or the operation of Embodiment 11 shown in FIG. 24. When the value $\Delta V_2$ shown in (n) of FIG. 13 or FIG. 24 is too small and the threshold voltage of n channel MOS transistors 1111b and 1111c of sense amplifier 1111 cannot be made sufficiently small, capacitor 1119c is provided to n channel common source line 11110e, in view of the equation (2) described in Embodiment 13. By doing so, similar effects as in Embodiment 3 or Embodiment 11 can be obtained.

Though switching circuits (1113 and 1114) and capacitor 1119c are formed only on the side of n channel MOS transistors 1111b and 1111c of sense amplifier 1111 in Embodiment 15, similar switching circuits and capacitor may be provided only on the side of p channel MOS transistors 1111d and 1111e, and similar effects can be obtained. Further, though ground potentials $Vss_1$ (0 V) and $Vss_2$ (0.5 V) are distinguished in Embodiment 105, they may not be distinguished, and even when only the ground potential $Vss_1$ or $Vss_2$ is used, similar effects can be obtained. Further, though capacitor 1119c is provided for every sense amplifier 1111 in Embodiment 15, it may be provided for every plural sense amplifiers 1111 (for example, every four sense amplifiers).

[Embodiment 16]

Figure 29:
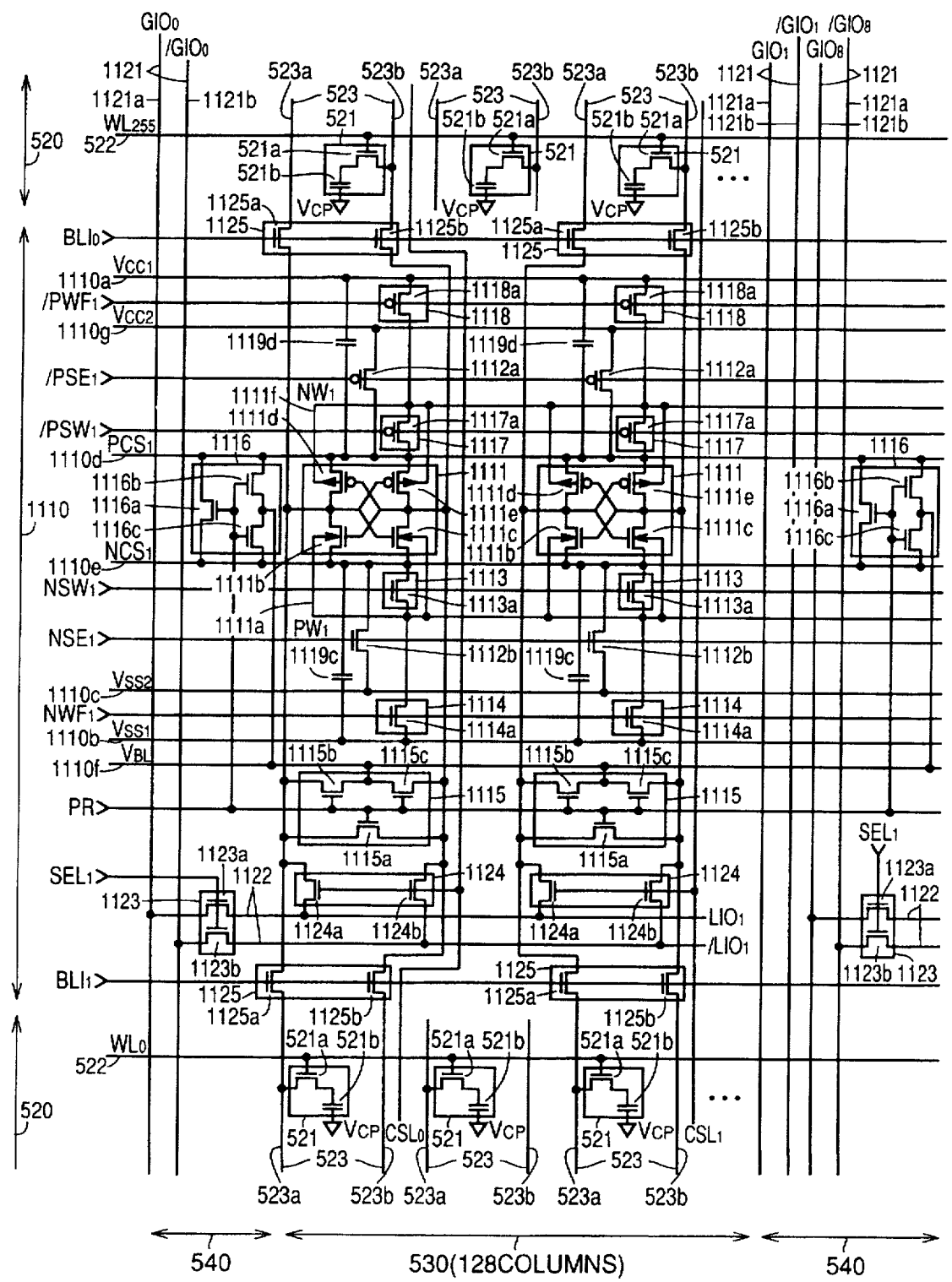

A DRAM in accordance With Embodiment 16 of the present invention will be described with reference to FIG. 29. The DRAM of Embodiment 16 differs from the DRAM of Embodiment 4 or Embodiment 12 in that capacitors 1119c and 1119d for adjustment are intentionally connected to n channel common source line 1110e and p channel common source line 1110d of the DRAM in accordance with Embodiment 4 or Embodiment 12, based on the same technical idea as in Embodiment 15. FIG. 29 is a schematic diagram of sense amplifier block 1110 and peripheral circuitry thereof, showing an example in which capacitors 1119c and 1119d are connected respectively to n channel common source line 1110e and p channel common source line 1110d of the DRAM of Embodiment 4, as a representative. The operation of Embodiment 16 is similar to the operation of Embodiment 4 or Embodiment 12 and similar effects can be obtained. Though capacitors 1119c and 1119d are provided for every sense amplifier 1111 in Embodiment 16, these may be provided for every plural sense amplifiers 1111 (for example, every four sense amplifiers).

[Embodiment 17]

Figure 30:
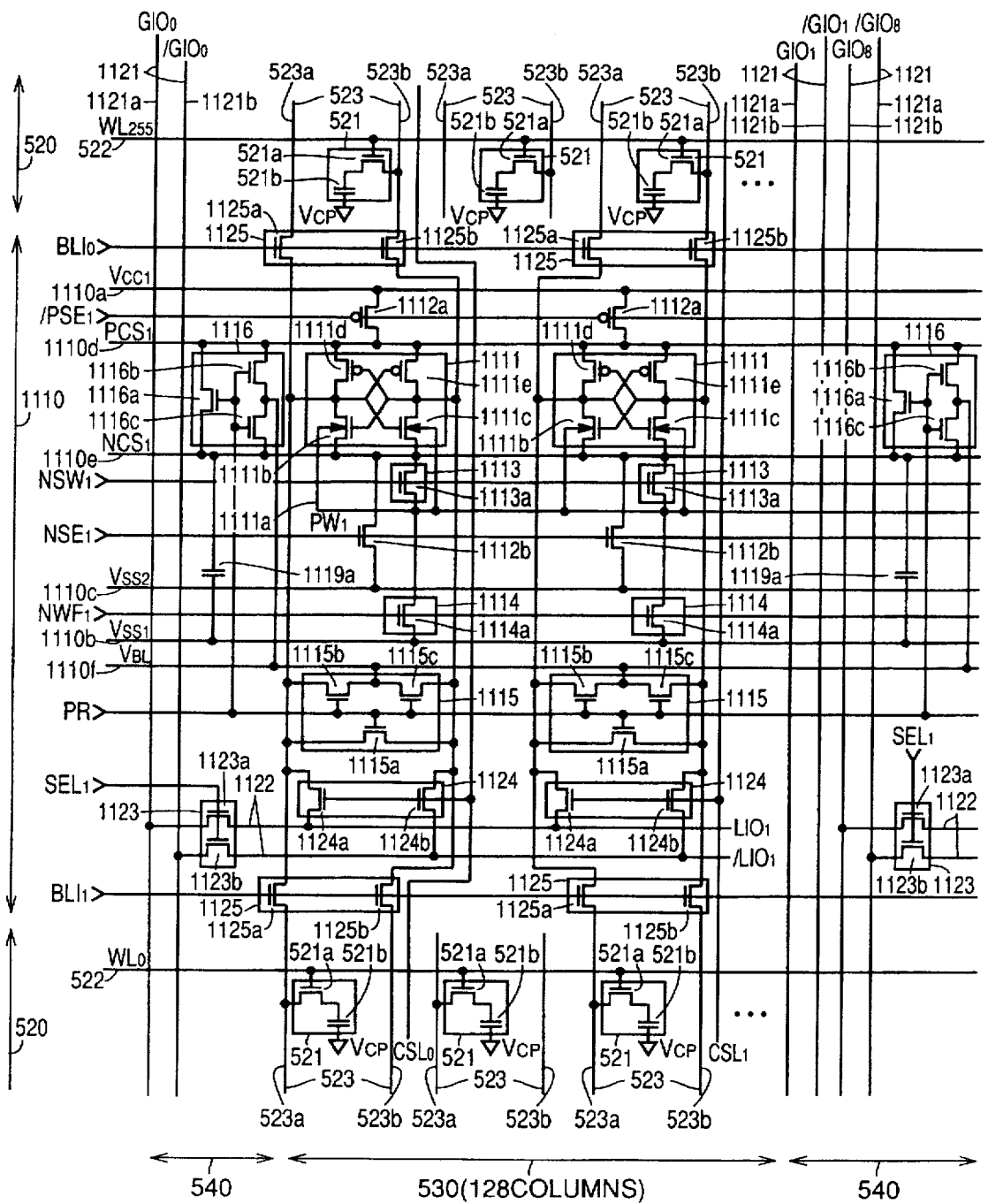

A DRAM in accordance with Embodiment 17 of the present invention will be described with reference to FIG. 30. The DRAM of Embodiment 17 differs from the DRAM of Embodiment 15, in that capacitor 1119c for adjustment in the DRAM of Embodiment 15 is provided not for every sense amplifier 1111 but for every column block dividing region 540 in which word line shunt region 541 and global I/O line pair 1121 are arranged. FIG. 30 is a schematic diagram of sense amplifier block 1110 and peripheral circuitry thereof showing an example in which capacitor 1119c is specifically provided on an extension of word line shunt region 541. The operation of Embodiment 17 is similar to the operation of Embodiment 15, and similar effects can be obtained.

Further, since capacitor 1119c is provided not for every sense amplifier 1111 but for every column block dividing region 540, the number of elements can be reduced, and the layout area of the DRAM can be reduced.

Though switching circuit 1113 (and 1114) and capacitor 1119c are provided only on the side of n channel MOS transistors 1111b and 1111c in Embodiment 17, similar switching circuit and capacitor may be provided only on the side of p channel MOS transistors 1111d and 1111e, and similar effects can be obtained. Though in Embodiment 17, ground potentials $Vss_1$ (0 V) and $Vss_2$ (0.5 V) are distinguished, they may not be distinguished and only the ground potential $Vss_1$ or ground potential $Vss_2$ may be used to obtain similar effects.

[Embodiment 18]

A DRAM in accordance with Embodiment 18 of the present invention will be described with reference to FIG. 31. The DRAM of Embodiment 18 differs from the DRAM of Embodiment 16 in that capacitors 1119c and 1119d for adjustment in the DRAM of Embodiment 16 are provided not for every sense amplifier 1111 but for every column block dividing region 540 in which word line shunt region 541 and global I/O line pair 1121 are arranged.

Figure 31:
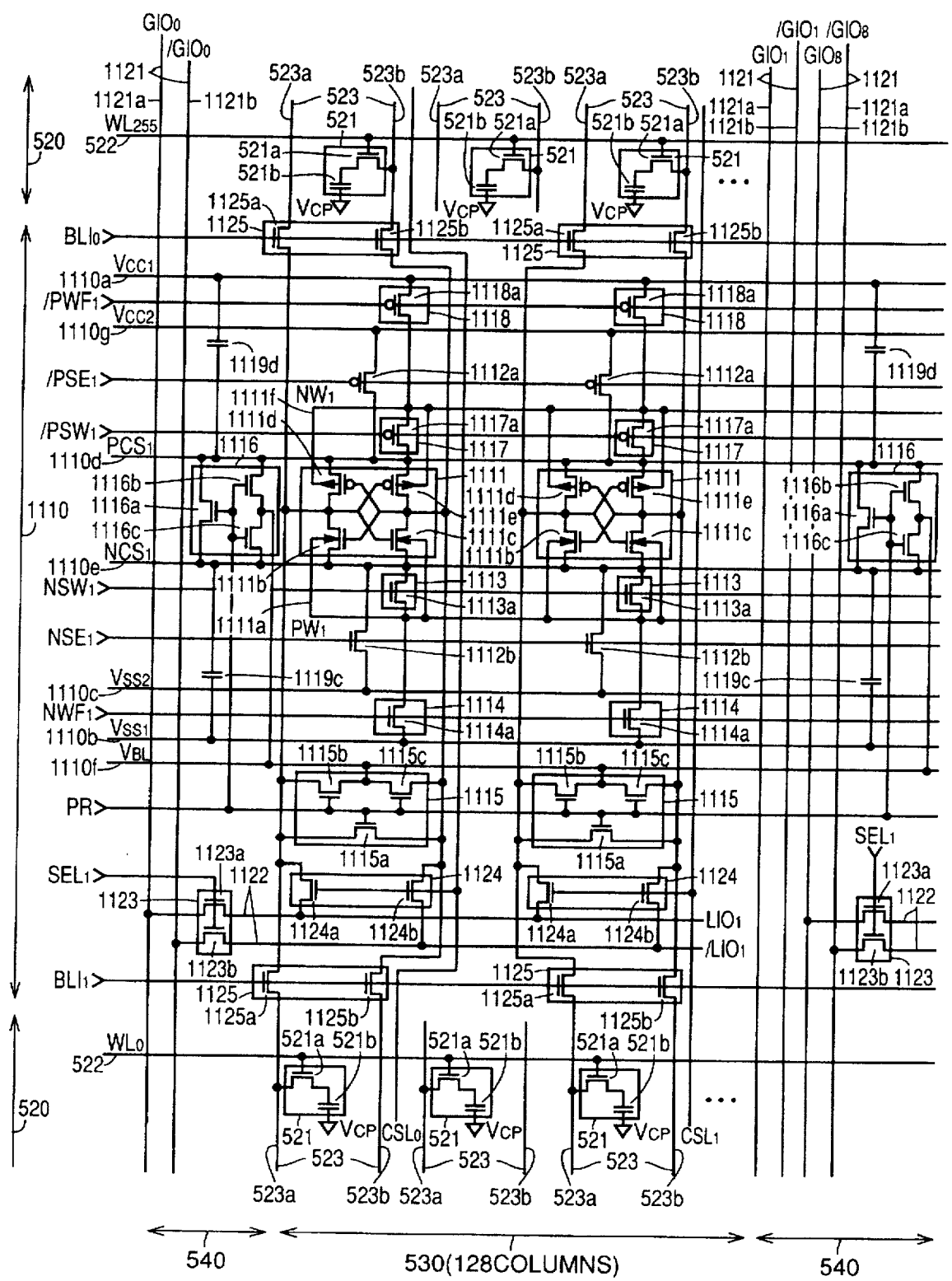

FIG. 31 is a schematic diagram of sense amplifier block 1110 and peripheral circuitry thereof, showing an example in which capacitors 1119c and 1119d are provided on an extension of word line shunt region 541. The operation of Embodiment 18 is similar to the operation of Embodiment 16, and similar effects can be obtained.

Further, since capacitors 1119c and 1119d are provided not for every sense amplifier 1111 but for every column block dividing region 540, the number of elements is reduced, and the layout area of the DRAM can be reduced.

[Embodiment 19]

A DRAM of Embodiment 19 in accordance with the present invention will be described with reference to FIGS. 32A, 32B, 33A and 33B. In Embodiment 19, the DRAM of Embodiments 1 to 18 are formed on an SOI (Silicon On Insulator) substrate. In the DRAM of Embodiments 1 to 18, there is a well. However, since the DRAM of Embodiment 19 is formed on an SOI substrate, there is not a well but a body.

Figure 32A:
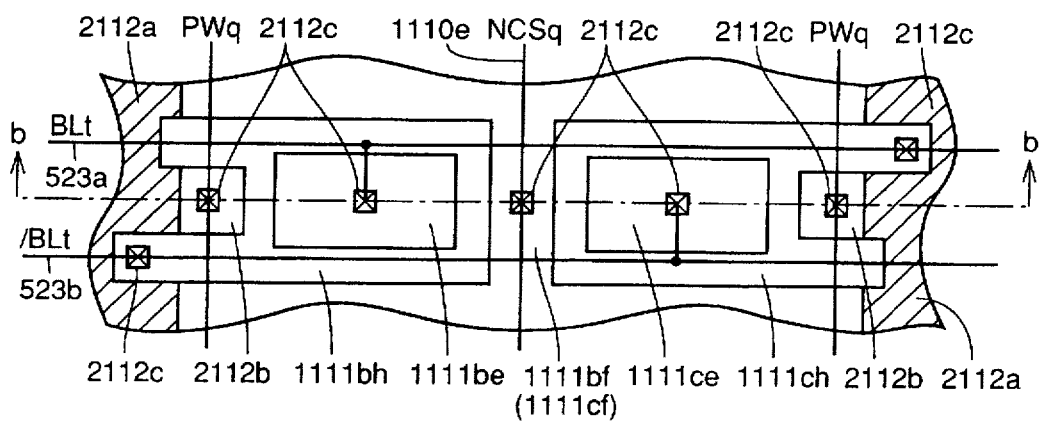
FIG. 32A is a schematic plan view showing an SOI substrate on which an n channel sense amplifier in a DRAM in accordance with Embodiment 19 is formed.
Figure 32B:
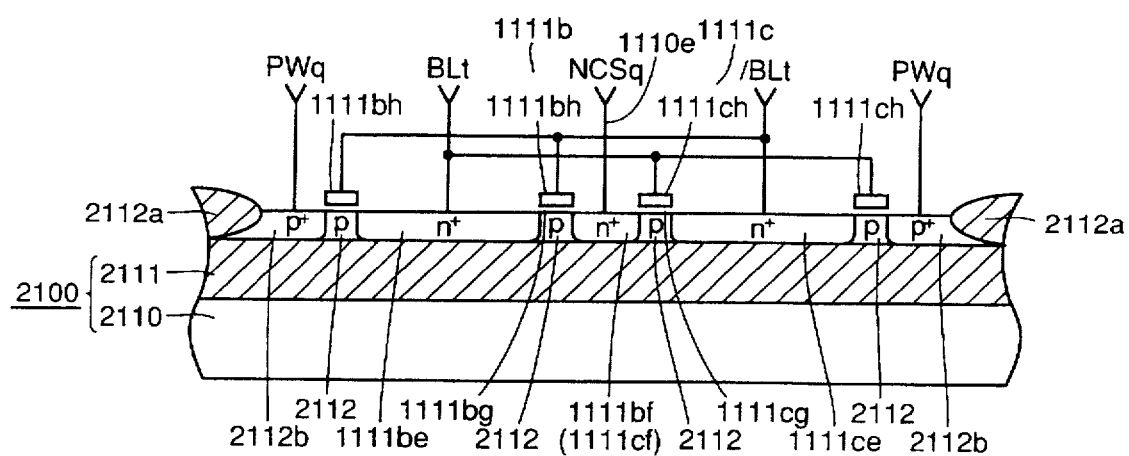
FIG. 32B is a cross section taken along the line b—b of FIG. 32A.

FIG. 32 is a schematic plan view showing a portion of an SOI substrate on which transistors 1111b and 1111c of sense amplifier 1111 are formed. FIG. 32B is a schematic cross section taken along the line B—B of FIG. 32A. Referring to FIGS. 32A and 32B, an insulating layer 2111 of silicon oxide film is formed on or in a p type semiconductor substrate (silicon substrate) 2110. Insulating layer 2111 and semiconductor substrate 2110 constitute an SOI substrate 2110. A p type body region 2112 of the transistor is formed in an active region on insulating layer 2111. An element isolating region 2112a of LOCOS (Local Oxidation of Silicon) is formed adjacent to a $p^+$ type diffusion region 2112b. The $p^+$ type diffusion region 2112b has higher impurity concentration than p type body 2112. A potential PWq is applied through diffusion region 2112b to body 2112. In FIG. 32A, reference character 2112c represents a contact hole.

Transistor 1111b has source/drain 1111be, 1111bf and a gate 1111bh. One of the source/drain 1111be is formed of an n type diffusion region formed in p type body 2112. The other source/drain 1111bf is formed of an n type diffusion region formed in p type body 2112. Gate 1111bh is formed on p type body 2112 between source/drain 1111b and 1111bf with a gate insulating film 1111bg interposed. Transistor 1111c has source/drain 1111ce and 1111cf, and a gate 1111bh. One of the source/drain 1111ce is formed of an n type diffusion region formed in p type body 2112. The other one of source/drain 1111cf is formed of an n type diffusion region formed in p type body 2112. Source/drain 1111cf (1111bf) is shared by an adjacent transistor 1111b. Gate 1111bh is formed on body 2112 between source/drain 1111ce and 1111cf with a gate insulating film 1111cg interposed.

Figure 33A:
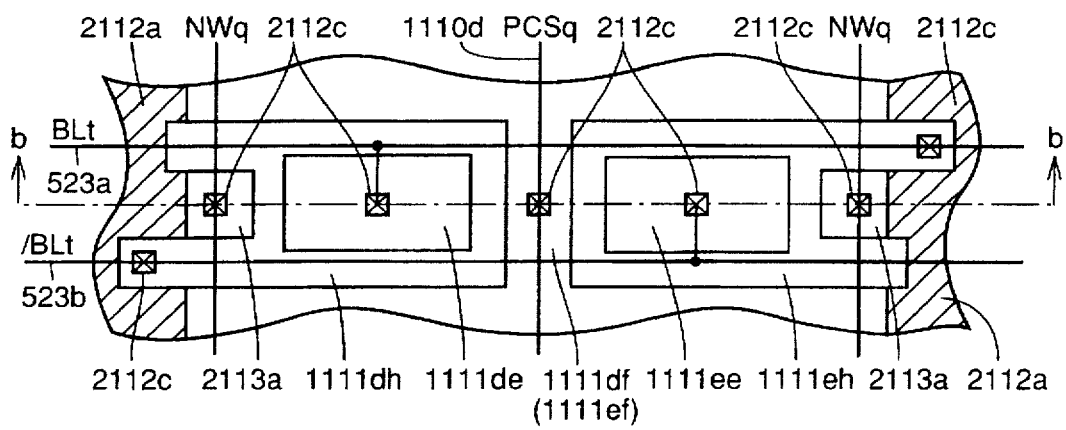
FIG. 33A is a schematic plan view showing an SOI substrate on which a p channel sense amplifier in the DRAM of FIGS. 32A and 32B is formed.
Figure 33B:
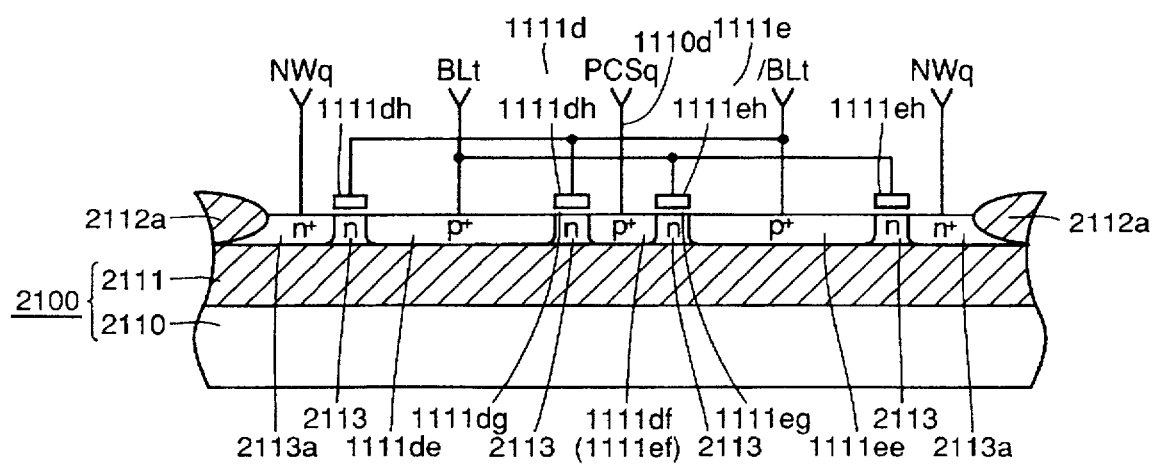
FIG. 33B is a cross section taken along the line b—b of FIG. 33A.

FIG. 33A is a schematic plan view showing a portion of an SOI substrate on which p channel MOS transistors 1111d and 1111e of sense amplifier 1111 are formed. FIG. 33B is a schematic cross section taken along the line b—b of FIG. 33A. Referring to FIGS. 33A and 33B, an n type body 2113 is formed in an active region on insulating layer 2111. An $n^+$ diffusion region 2113a is formed in n type body 2113, and it has higher impurity concentration than body 2113. A potential NWq is applied to the body 2113 through the diffusion region 2113a.

P channel MOS transistor 1111d has source/drain 1111de and 1111df, and a gate 1111dh. One of the source/drain 1111de is formed of a p type diffusion region formed in n type body 2113. The other one of the source/drain 1111df is formed of a p type diffusion region formed in n type body 2113. Gate 1111dh is formed on n type body 2113 between source/drain 1111de and 1111df with gate insulating film 1111dg interposed. The p channel MOS transistor 1111e has source/drain 1111ee and 1111ef, and a gate 1111eh. One of the source/drain 1111ee is formed of a p type diffusion region formed in n type body 2113. Source/drain 1111ef is formed of a p type diffusion region formed in n type body 2113. The source/drain 1111ef (1111df) is shared by adjacent transistor 1111d. Gate 1111eh is formed on n type body 2113 between source/drain 1111ee and 1111ef with a gate insulating film 1111eg interposed.

The DRAM of Embodiment 19 structured in the above described manner operates in the similar manner as the DRAM of Embodiments 1 to 18, and similar effects can be obtained. Further, the DRAM of Embodiment 19 is formed on a SOI substrate, so that bottom surfaces of source/drain 1111be, 1111bf (1111cf), 1111ce of n channel MOS transistors 1111b and 1111c of sense amplifier 1111 and bottom surfaces of source/drain 1111de, 1111df (1111ef), 1111ee of p channel MOS transistors 1111d and 1111e are in contact with contact with the insulating layer 2111, and hence pn junction area between source/drain 1111be, 1111bf (1111cf), 1111ce and p type body 2112, and pn junction area of source/drain 1111de, 1111df (1111ef), 1111ee and n type body 2113 are small. Therefore, leak current flowing through the junctions can be reduced, and power consumption can be reduced.

Further, since pn junction area between source/drain 1111be, 1111bf (1111cf), 1111ce and p type body 2112 and pn junction area between source/drain 1111de, 1111df (1111ef), 1111ee and n type body 2113 are small, parasitic capacitance of source/drain 1111be, 1111bf (1111cs), 111ce, 1111de, 1111df (1111ef) and 1111ee becomes smaller. In addition, unlike a bulk (as in the structure of FIG. 6), there is not a junction capacitance between wells. Accordingly, parasitic capacitance incidental thereto can be made smaller. This allows high speed sensing operation, and reduces power consumption necessary for charging/discharging the body in order to change the back bias.

[Embodiment 20]

A DRAM in accordance with Embodiment 20 of the present invention will be described with reference to FIG. 34. In the DRAM of Embodiment 20, memory cell array 500 in the DRAM in accordance with Embodiments 1 to 19 has a divided word line structure. Therefore, row decoder 600 is divided into a main row decoder 610 and a sub row decoder 620.

Figure 34:
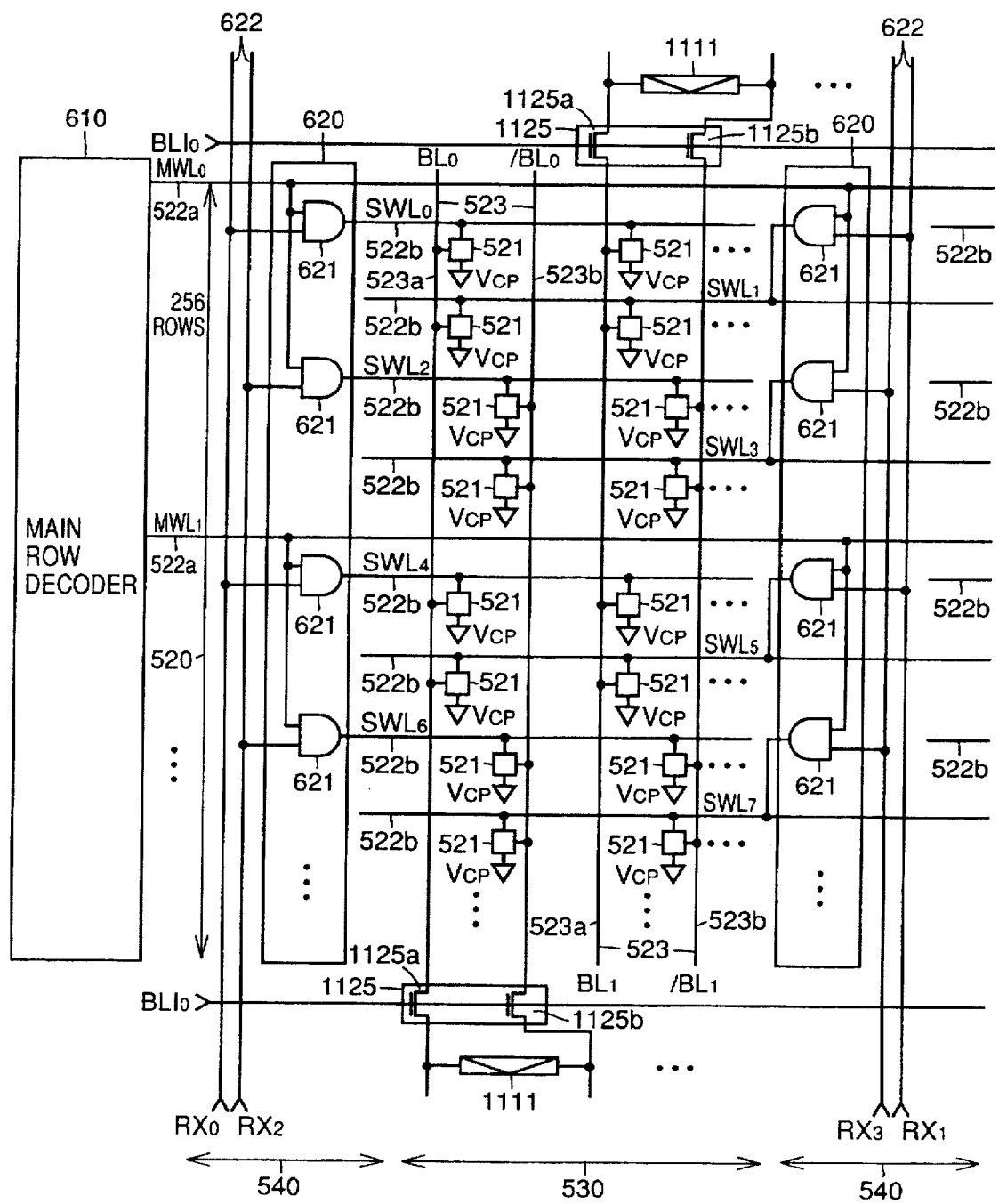
FIG. 34 is a schematic diagram of a sense amplifier in a DRAM in accordance with Embodiment 20 of the present invention.

FIG. 34 is a schematic diagram showing a part of memory cell array 500 in the DRAM in accordance with Embodiment 20. Referring to FIG. 34, main word line 522a is formed of a first layer of aluminum and arranged for 16 column blocks 530. Sub word line 522b is arranged in plural rows and connected to a plurality of memory cells 521. Sub word line 522b is formed of polycide, and constitutes a gate of memory cell transistor 521b. Four sub word lines 522b (corresponding to four rows) correspond to one main word line 522a. One memory cell block 520 includes 256 rows of sub word lines 522b, and thus includes 64 main word lines 522a.

Main row decoder 610 is provided corresponding to each memory cell block 520, and receives row predecode signals X4 to X15 and corresponding block selection signal BSj from row predecoder 400. When the corresponding block selection signal BSj attains to the H level, one of 64 main word lines 522a is selectively set to the H level, in response to row predecode signals X4 to X15. Sub row decoder 620 is formed in each column block dividing region 540, and has plural partial sub decoders 621. Each of the partial sub decoder 621 is provided corresponding to a sub word line. Partial sub decoder 621 boosts corresponding sub word line 522b to a boosted potential Vpp, in response to potential MWLu (U=0, 1, ... 63) of the corresponding main word line 522a and to one of sub word line driving signals RX0 to RX3. Sub word line driving signals RX0 to RX3 are generated by converting row predecode signals X0 to X3 to have the amplitude of boosted potential Vpp. When the potential MWLu of main word line 522a and sub word line driving signal both attain to H level (Vpp level), corresponding sub word line 522b is raised to the boosted potential Vpp. Sub word line driving signal line 622 is for transmitting sub word line driving signals RX0 to RX3, and is arranged in column block dividing region 540. Sub word line driving signal line 622 is formed of a second layer of aluminum which is upper than the first layer of aluminum.

The DRAM of Embodiment 20 thus structured operates similarly as the DRAMs of Embodiments 1 to 19, and similar effects can be obtained. Further, since the DRAM of Embodiment 20 has divided word line structure, the wiring pitch of main word lines 522a formed of the first layer of aluminum is made four times the pitch of sub word lines 522b formed of polycide, which facilitates patterning by photolithography and etching.

[Embodiment 21]

Figure 35:
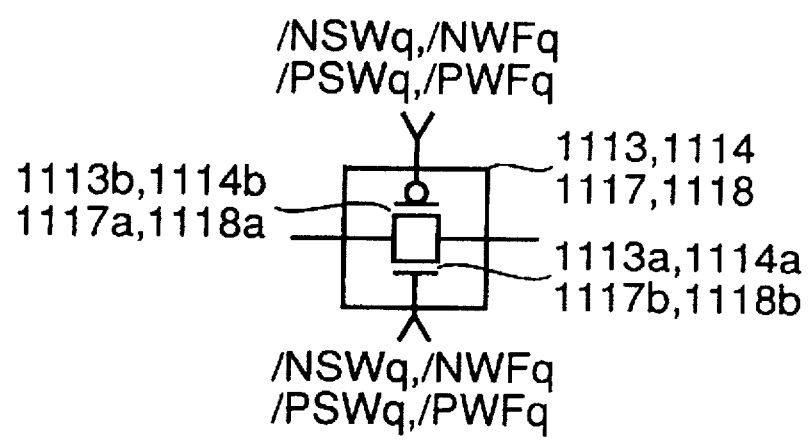
FIG. 35 is a schematic diagram of a sense amplifier in a DRAM in accordance with Embodiment 21 of the present invention.

A DRAM in accordance with Embodiment 21 of the present invention will be described with reference to FIG. 35. While the switching circuit 1113, 1114, 1117 or 1118 of the DRAM in Embodiments 1 to 20 is formed of a single transistor, in the DRAM of Embodiment 21, the switch includes n channel MOS transistor 1113a, 1114a, 1117b or 1118b and p channel MOS transistor 11113b, 1114b, 1117a or 1118a which are connected parallel to each other and receiving complementary signals at their gates, as shown in FIG. 35. The DRAM of Embodiment 21 operates in the similar manner as the DRAM of Embodiments 1 to 20, and provides similar effects.

[Embodiment 22]

Figure 36:
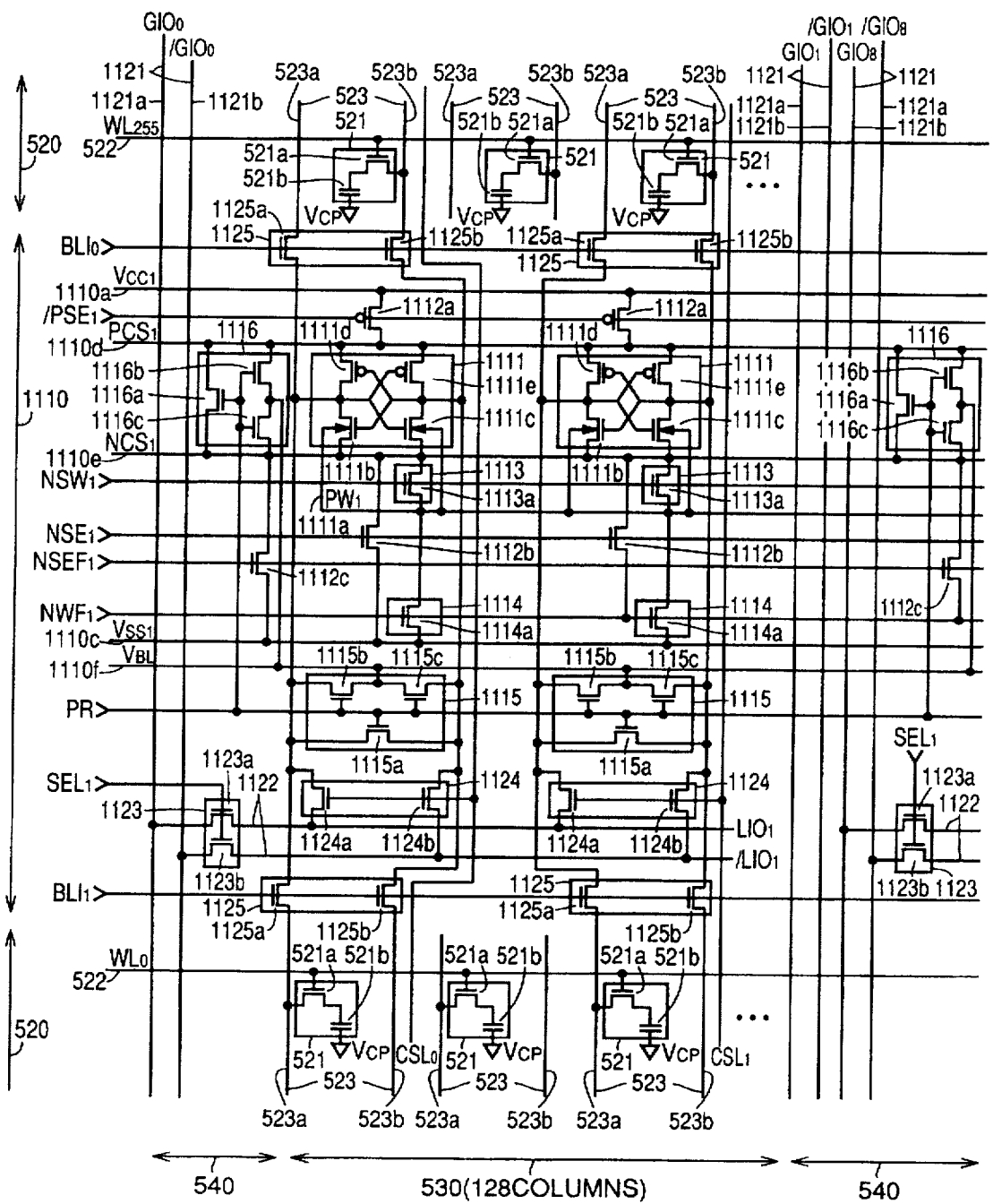
FIGS. 36 and 37 are schematic diagrams showing memory cell array and peripheral circuitry in the DRAM in accordance with Embodiments 22 and 23 of the present invention.

As shown in FIG. 36, a DRAM of Embodiment 22 differs from that of FIG. 15 in using a ground potential $Vss_1$ (0 V) instead of $Vss_2$ (0.5 V).

[Embodiment 23]

Figure 37:
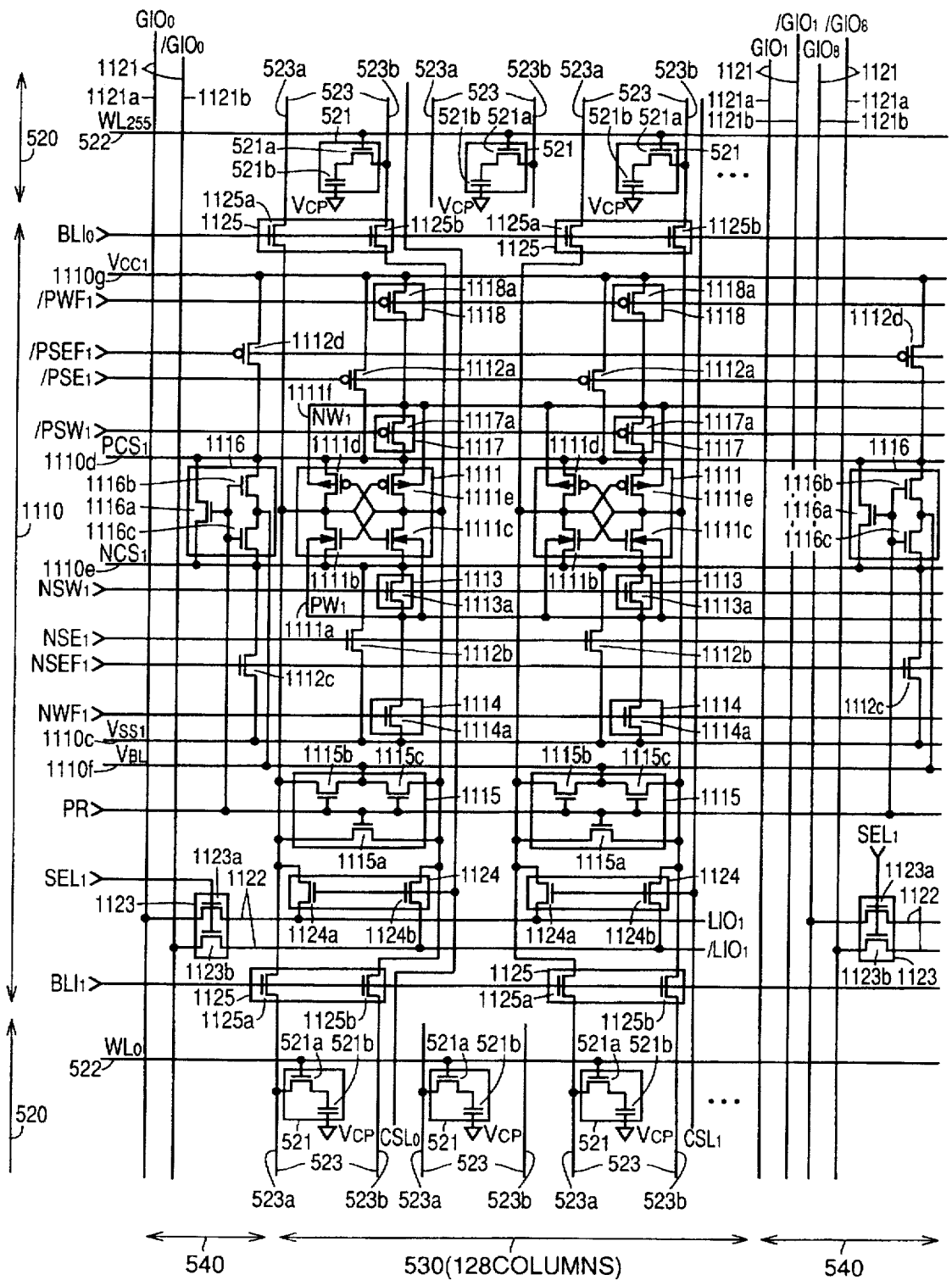
Figure 38:
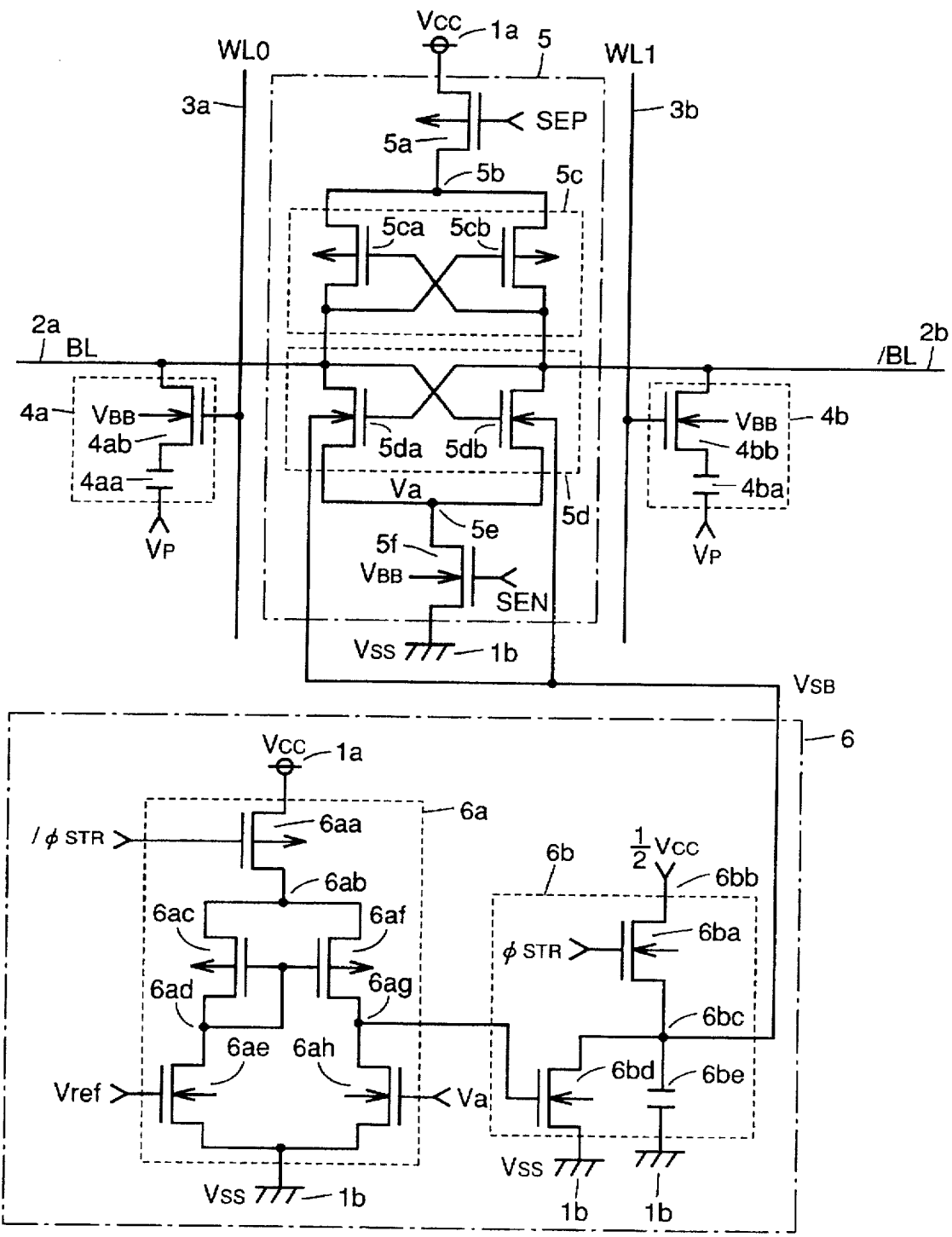
FIG. 38 is a schematic diagram showing a part of a conventional DRAM.
Figure 39:
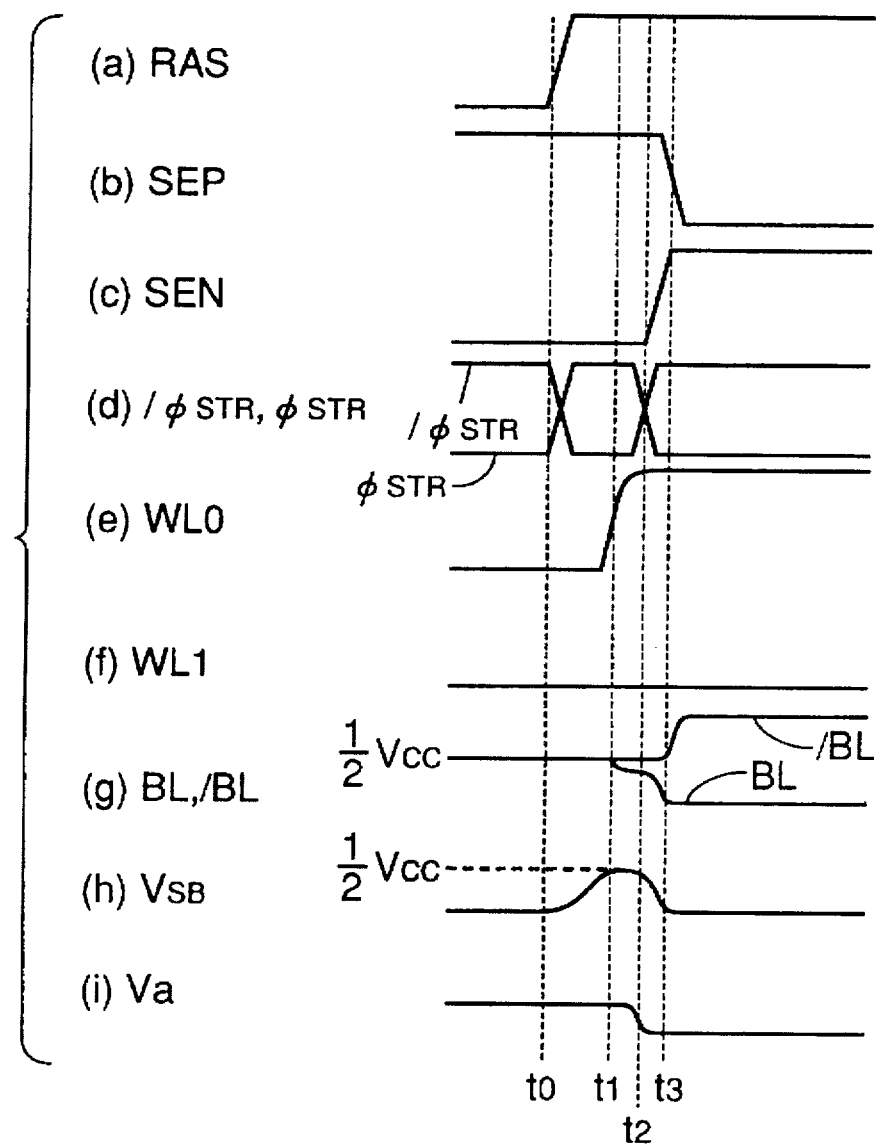
FIG. 39 is a timing chart showing the operation of the DRAM of FIG. 38.

As shown in FIG. 37, a DRAM of Embodiment 23 differs from that of FIG. 18 in using a power supply potential $Vcc_1$ (3.3 V) instead of $Vcc_2$ (2.8 V) and a ground potential $Vss_1$ (0 V) instead of $Vss_2$ (0.5 V).

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell;

a word line connected to said memory cell;

a bit line pair crossing said word line and having a first bit line connected to said memory cell and a second bit line complementary to said first bit line;

a first semiconductor region of a first conductivity type;

a first source line;

a second source line;

source line precharging means responsive to a prescribed precharge signal for precharging said first and second source lines to an intermediate potential between first and second potentials;

a sense amplifier including (a) a first MOS transistor of a second conductivity type formed in said first semiconductor region, connected between said first bit line and said first source line and having its gate connected to said second bit line, (b) a second MOS transistor of the second conductivity type formed in said first semiconductor region, connected between said second bit line and said first source line, and having its gate connected to said first bit line, (c) a third MOS transistor of the first conductivity type connected between said first bit line and said second source line, and having its gate connected to said second bit line, and (d) a fourth MOS transistor of the first conductivity type connected between said second bit line and said second source line and having its gate connected to said first bit line;

a first sense amplifier enable transistor connected between a first potential node to which said first potential is applied and said first source line, and turning on in response to a first sense amplifier enable signal;

a second sense amplifier enable transistor connected between a second potential node to which said second potential is applied and second source line, and turning on in response to a second sense amplifier enable signal; and first switching means connected between said first source line and said first semiconductor region and turning on in response to a first control signal before said sense amplifier is active.

2. The semiconductor memory device according to claim 1, wherein said first potential is lower than said second potential, and said first conductivity type is p type and said second conductivity type is n type;

said semiconductor memory device further comprising:

bit line precharge means for precharging said first and second bit lines to said intermediate potential; and second switching means connected between said first semiconductor region and a third potential node to which a third potential lower than said second potential is applied, and turning on in response to a second control signal.

3. The semiconductor memory device according to claim 2, wherein said second switching means turns off in response to turning on of said first switching means, and turns on again while said first switching means is on.

4. The semiconductor memory device according to claim 2, wherein said third potential is equal to said first potential, and said third potential node is connected to said first potential node.

5. The semiconductor memory device according to claim 2, wherein said third potential is lower than said first potential.

6. The semiconductor memory device according to claim 1, wherein said first potential is higher than said second potential, and said first conductivity type is n type and said second conductivity type is p type;

said semiconductor memory device further comprising:

bit line precharge means for precharging said first and second bit lines to said intermediate potential; and second switching means connected between said first semiconductor region and a third potential node to which a third potential higher than said second potential is applied, and turning on in response to a second control signal.

7. The semiconductor memory device according to claim 6, wherein said second switching means turns on in response to turning on of said first switching means, and turns on again while said first switching means is on.

8. The semiconductor memory device according to claim 6, wherein said third potential is equal to said first potential, and said third potential node is connected to said first potential node.

9. The semiconductor memory device according to claim 6, wherein said third potential is higher than said first potential.

10. The semiconductor memory device according to claim 1, further comprising:

a second semiconductor region of the second conductivity type; and third switching means connected between said second source line and said second semiconductor region, turning on in response to a third control signal while said sense amplifier is active; wherein said third and fourth MOS transistors of the first conductivity type in said sense amplifier are formed in said second semiconductor region.

11. The semiconductor memory device according to claim 10, wherein said first potential is lower than said second potential, and said first conductivity type is p type and said second conductivity type is n type;

said semiconductor memory device further comprising:

bit line precharge means for precharging said first and second bit lines to said intermediate potential;

second switching means connected between said first semiconductor region and a third potential node to which a third potential lower than said second potential is applied, turning on in response to a second control signal; and fourth switching means connected between said second semiconductor region and a fourth potential node to which a fourth potential higher than said first potential is applied, and turning on in response to a fourth control signal.

12. The semiconductor memory device according to claim 11, wherein said second switching means turns off in response to turning on of said first switching means, and turns on again while said first switching means is on, and said fourth switching means turns off in response to turning on of said third switching means and turns on again while said third switching means is on.

13. The semiconductor memory device according to claim 11, wherein said third potential is equal to said first potential, said third potential node is connected to said first potential node, and said fourth potential is equal to said second potential and said fourth potential node is connected to said second potential node.

14. The semiconductor memory device according to claim 11, wherein said third potential is lower than said first potential, and said fourth potential is higher than said second potential.

15. The semiconductor memory device according to claim 1, further comprising first capacitor connected to said first semiconductor region.

16. The semiconductor memory device according to claim 10, further comprising:

a first capacitor connected to said first semiconductor region, and a second capacitor connected to said second semiconductor region.

17. The semiconductor memory device according to claim 1, further comprising a third capacitor connected to said first source line.

18. The semiconductor memory device according to claim 10, further comprising:

a third capacitor connected to said first source line; and a fourth capacitor connected to said second source line.

19. The semiconductor memory device according to claim 1, further comprising:

a third sense amplifier enable transistor connected between said first source line and said first potential node, turning on in response to a third sense amplifier enable signal before turning on of said first sense amplifier enable transistor.

20. A semiconductor memory device, comprising:

a plurality of memory cells;

a word line connected to said memory cells;

a plurality of bit line pairs corresponding to said memory cells and crossing said word line, each having a first bit line connected to a corresponding one of said memory cells and a second bit line complementary to said first bit line;

a first semiconductor region of a first conductivity type;

a first source line;

a second source line;

source line precharge means responsive to a prescribed precharge signal for precharging said first and second source lines to an intermediate potential between first and second potentials;

a plurality of sense amplifiers corresponding to said bit line pairs, each including
  (a) a first MOS transistor of a second conductivity type formed in said first semiconductor region, connected between said first bit line and said first source line, and having its gate connected to said second bit line,
  (b) a second MOS transistor of a second conductivity type formed in said first semiconductor region, connected between said second bit line and said first source line, and having its gate connected to said first bit line,
  (c) a third MOS transistor of the first conductivity type connected between said first bit line and said second source line, and having its gate connected to said second bit line, and
  (d) a fourth MOS transistor of the first conductivity type connected between said second bit line and said second source line, and having its gate connected to said first bit line;

a first sense amplifier enable transistor connected between a first potential node to which said first potential is applied and said first source line, and turning on in response to a first sense amplifier enable signal;

a second sense amplifier enable transistor connected between a second potential node to which said second potential is applied and said second source line, and turning on in response to a second sense amplifier enable signal; and first switching means connected between said first source line and said first semiconductor region, and turning on in response to a first control signal before said sense amplifier is active.

21. The semiconductor memory device according to claim 20, wherein
said first switching means includes a plurality of first switching elements corresponding to said sense amplifiers.

22. The semiconductor memory device according to claim 20, wherein
said first potential is lower than said second potential, and
said first conductivity type is p type and said second conductivity type is n type;
said semiconductor memory device further comprising:
bit line precharge means for precharging said first and second bit lines to said intermediate potential; and
second switching means connected between said first semiconductor region and a third potential node to which a third potential lower than said second potential is applied, and turning on in response to a second control signal.

23. The semiconductor memory device according to claim 22, wherein said second switching means includes a plurality of second switching elements corresponding to said sense amplifiers.

24. The semiconductor memory device according to claim 20, wherein
said first potential is higher than said second potential, and
said first conductivity type is n type and said second conductivity type is p type;
said semiconductor memory device further comprising:
bit line precharge means for precharging said first and second bit lines to said intermediate potential; and
second switching means connected between said first semiconductor region and a third potential node to which a third potential higher than said second potential is applied, and turning on in response to a second control signal.

25. A semiconductor memory device, comprising: a memory cell array including
  (a) a plurality of column blocks, each including
    (a1) a plurality of memory cells arranged in a plurality of rows and a plurality of columns, and
    (a2) a plurality of bit line pairs arranged in said plurality of columns and connected to said memory cells, each having a first bit line and second bit line complementary to said first bit line,
  (b) a plurality of column block dividing regions arranged alternately to said plurality of column blocks, and
  (c) a plurality of word lines arranged in said plurality of rows over said column blocks and said column block dividing regions, and connected to said memory cells;

a first semiconductor region;

a first source line;

a second source line;

source line precharging means responsive to a prescribed precharge signal for precharging said first and second source lines to an intermediate potential between first and second potentials;

a plurality of sense amplifiers corresponding to said bit line pairs, each including
  (a) a first MOS transistor of a second conductivity type formed in said first semiconductor region, connected between said first bit line and said first source line, and having its gate connected to said second bit line,
  (b) a second MOS transistor of the second conductivity type formed in said first semiconductor region, connected between said second bit line and said first source line, and having its gate connected to said first bit line,
  (c) a third MOS transistor of the first conductivity type connected between said first bit line and said second source line, and having its gate connected to said second bit line, and
  (d) a fourth MOS transistor of the first conductivity type connected between said second bit line and said second source line, and having its gate connected to said first bit line;

a first sense amplifier enable transistor connected between a first potential node to which said first potential is applied and said first source line, and turning on in response to a first sense amplifier enable signal;

a second sense amplifier enable transistor connected between a second potential node to which said second potential is applied and said second source line, and turning on in response to a second sense amplifier enable signal; and first switching means connected between said first source line and said first semiconductor region, and turning on in response to a first control signal before said sense amplifier is active.

26. The semiconductor memory device according to claim 25, wherein
    said first switching means is arranged in said column block dividing region.

27. The semiconductor memory device according to claim 26, wherein
    said first potential is lower than said second potential, and
    said first conductivity type is p type and said second conductivity type is n type;
    said semiconductor memory device further comprising:
        bit line precharge means for precharging said first and second bit lines to said intermediate potential; and
        second switching means arranged in said column block dividing region, connected between said first semiconductor region and a third potential node to which a third potential equal to or lower than said first potential is applied, and turning on in response to a second control signal.

28. The semiconductor memory device according to claim 27, wherein
    said column block dividing region includes a shunt region for said word lines.

29. The semiconductor memory device according to claim 26, wherein
    said first potential is higher than said second potential,
    said first conductivity type is n type, and said second conductivity type is p type,
    said semiconductor memory device further comprising:
        bit line precharge means for precharging said first and second bit lines to said intermediate potential; and
        second switching means arranged in said column block dividing region, connected between said first semiconductor region and a third potential node to which a third potential third potential equal to or higher than said first potential is applied, and turning on in response to a second control signal.

30. The semiconductor memory device according to claim 29, wherein
    said column dividing region includes a shunt region for said word lines.

31. The semiconductor memory device according to claim 25, wherein
    each of said column block includes
        a plurality of sub word line groups corresponding to said word lines and each including a plurality of sub word lines;
    said memory device includes
        a main row decoder responsive to a row address signal for selecting any of said word lines; and
        a plurality of sub row decoders corresponding to said column block dividing regions, each being arranged in a corresponding column block dividing region, for selecting any of the sub word lines in a corresponding one of said sub word line groups, in response to a potential of said word line and to a sub word line driving signal.

32. The semiconductor memory device according to claim 25, further comprising:
    a plurality of input/output line pairs corresponding to said column block dividing regions, each being arranged in a corresponding one of said column block dividing regions, for transmitting data of said bit line pairs.

33. The semiconductor memory device according to claim 1, further comprising an insulating layer on which said first semiconductor region is formed.

34. The semiconductor memory device according to claim 10, further comprising
    an insulating layer on which said first and second semiconductor regions are formed.

35. A semiconductor memory device, comprising: a memory cell array including
    (a) a plurality of column blocks arranged along a row direction, each including
        (i) a plurality of dynamic type memory cells arranged in a plurality of rows and a plurality of columns, each including a memory transistor and a memory capacitor,
        (ii) a plurality of bit line pairs arranged in said plurality of columns and connected to said memory cells, each having a first bit line and a second bit line complimentary to said first bit line, said bit line paris being parallel to a column direction crossing said row direction,
    (b) a plurality of column block dividing regions arranged alternately with said plurality of column blocks along said row direction,
    (c) a plurality of main word lines disposed parallel to said row direction over said column blocks and said column block dividing regions, and
    (d) a plurality of sub word lines disposed in said plurality of rows, and connected to said memory cells;
    a row decoder responsive to a row address signal for selecting one of said plurality of main word lines;
    a plurality of word line driving circuits connected to said sub word lines respectively, said word line driving circuits being arranged in said column block dividing regions and each for driving a corresponding sub word line in response to a potential of a corresponding main word line and to a sub word line driving signal;
    a first source line disposed parallel to said row direction;
    a second source line disposed parallel to said row direction;
    source line precharging means responsive to a precharge signal for precharging said first and second source lines to an intermediate potential between first and second potentials;
    a sense amplifier block divided into a plurality of sense amplifier sub blocks by said column block dividing regions, said plurality of sense amplifier sub blocks corresponding to said plurality of column blocks respectively and each including a plurality of sense amplifiers corresponding to the bit line pairs of a corresponding column block, each of said sense amplifiers of one of said sense amplifier sub blocks including
    (a) a first MOS transistor of a first conductivity type connected between said first bit line and said first source line, and having a gate connected to said second bit line,
    (b) a second MOS transistor of the first conductivity type connected between said second bit line and said first source line, and having a gate connected to said first bit line,
    (c) a third MOS transistor of the second conductivity type connected between said first bit line and said second source line, and having a gate connected to said second bit line, and (d) a fourth MOS transistor of the second conductivity type connected between said second bit line and said second source line, and having a gate connected to said first bit line;

a first sense amplifier enable transistor connected between a second potential node to which said second potential is applied and said first source line, and turning on in response to a first sense amplifier enable signal;

a second sense amplifier enable transistor connected between a second potential node to which said second potential is applied and said second source line, and turning on in response to a second sense amplifier enable signal; and a first switching circuit connected between said first source line and the backgates of said first and second MOS transistors, and turning on in response to a first control signal.

36. The semiconductor memory device according to claim 35, wherein said first switching circuit is arranged in one of said column block dividing regions.

37. The semiconductor memory device according to claim 35, wherein said first potential is lower than said second potential, and said first conductivity type is n type and said second conductivity type is p type;

said semiconductor memory device further comprising:

a second switching circuit connected between said backgates and a third potential node to which a third potential equal to or lower than said first potential is applied, and turning on in response to a second control signal.

38. The semiconductor memory device according to claim 37, wherein said second switching circuit is arranged in one of said column block dividing regions.

* * * * *